United States Patent
Yamanaka et al.

(10) Patent No.: US 6,592,771 B1
(45) Date of Patent: Jul. 15, 2003

(54) VAPOR-PHASE PROCESSING METHOD AND APPARATUS THEREFOR

(75) Inventors: Hideo Yamanaka, Kanagawa (JP); Kikuo Kaise, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/544,803

(22) Filed: Apr. 7, 2000

(30) Foreign Application Priority Data

Apr. 8, 1999 (JP) .......................................... 11-100804
Apr. 8, 1999 (JP) .......................................... 11-100805

(51) Int. Cl.$^7$ ................................................ C23F 1/00
(52) U.S. Cl. ......................... 216/63; 134/1.1; 134/902; 216/16; 216/37; 216/49; 216/58; 216/61; 216/74; 216/79; 438/706; 438/715; 438/718; 438/719; 438/720; 438/721; 438/722; 438/723; 438/724; 438/725; 156/345.33; 156/345.34; 156/345.37; 156/345.52; 156/345.53
(58) Field of Search ........................... 134/1, 1.1, 22.1, 134/902; 216/16, 37, 49, 58, 61, 63, 74, 79; 438/706, 715, 718–725; 156/345.33, 345.34, 345.37, 345.52, 345.53

(56) References Cited

U.S. PATENT DOCUMENTS

| 3,926,842 | A | * | 12/1975 | Suggitt et al. ................. 502/53 |
| 4,812,201 | A | * | 3/1989 | Sakai et al. ................... 438/725 |
| 5,723,371 | A | * | 3/1998 | Seo et al. ..................... 438/158 |
| 6,305,390 | B1 | * | 10/2001 | Jeon ............................. 134/1.1 |

FOREIGN PATENT DOCUMENTS

| JP | 356078632 | * | 6/1981 |
| JP | 63040314 | * | 2/1988 |

* cited by examiner

Primary Examiner—Randy Gulakowski
Assistant Examiner—M. Kornakov
(74) Attorney, Agent, or Firm—Rader, Fishman & Grauer PLLC; Ronald P. Kananen

(57) ABSTRACT

A method in which etching or ashing is conducted by providing satisfactory kinetic energy of reaction seeds such as ions or radicals without damaging a substrate, and an apparatus used in this method are provided. A predetermined film of for example polycrystalline silicon on the substrate is etched in vapor phase using reaction seeds or precursors thereof generated by contacting a reaction gas such as $CF_4$ with a heated catalyst of for example tungsten.

50 Claims, 49 Drawing Sheets

ANISOTROPIC ETCHING AT HIGH SELECTION RATIO WITH KINETIC ENERGY ACCOMPANIED BY CHANGE IN ELECTRIC FIELD THROUGH CATALYTIC ACTIVITY OF CATALYST, ITS HEAT ENERGY AND (DC + RADIOFREQUENCY VOLTAGE) ACCELERATION VOLTAGE

MOSTFT PRODUCTION PROCESS FLOW

FORMATION OF POLYCRYSTALLINE SILICON FILM BY CATALYTIC CVD METHOD

FORMATION OF GATE OXIDE FILM BY THERMAL OXIDATION METHOD OR CATALYTIC CVD METHOD

ION IMPLANTATION FOR N-CHANNEL MOS

ION IMPLANTATION FOR P-CHANNEL MOS

FORMATION OF POLYCRYSTALLINE SILICON FILM
FOR GATE ELECTRODE BY CATALYTIC CVD METHOD

FORMATION OF GATE ELECTRODE
BY CATALYTIC ETCHING METHOD

OXIDATION OF GATE POLYCRYSTALLINE SILICON FILM

ION IMPLANTATION FOR N-CHANNEL MOS SOURCE/DRAIN

ION IMPLANTATION FOR P-CHANNEL MOS SOURCE/DRAIN

FORMATION OF INSULATION FILM BY CATALYTIC CVD METHOD
($SiO_2$, SiN OR BPSG FILM)

FORMATION OF CONTACT HOLES BY CATALYTIC
ETCHING METHOD → FORMATION OF ELECTRODE

LCD PRODUCTION PROCESS FLOW

| IMAGE AREA | PERIPHERAL CIRCUIT PORTION |

FORMATION OF POLYCRYSTALLINE SILICON FILM BY CATALYTIC CVD METHOD

PATTERNING OF POLYCRYSTALLINE SILICON FILM

FORMATION OF GATE OXIDE FILM

FORMATION OF GATE ELECTRODE

FORMATION OF SOURCE AND DRAIN REGIONS OF N-CHANNEL MOSTFT, ASHING OF RESIST FILM BY CATALYTIC ASHING

FORMATION OF SOURCE AND DRAIN REGIONS OF P-CHANNEL MOSTFT, ASHING OF RESIST FILM BY CATALYTIC ASHING

FORMATION OF INTERLAYER INSULATION FILM BY CATALYTIC CVD METHOD

FORMATION OF CONTACT HOLES BY CATALYTIC ETCHING METHOD → FORMATION OF SOURCE ELECTRODE OF IMAGE AREA AND SOURCE AND DRAIN ELECTRODES OF PERIPHERAL CIRCUIT PORTION, FORMATION OF INSULATION FILM

FORMATION OF IMAGE ELECTRODE (ITO TRANSPARENT ELECTRODE) OF IMAGE AREA

FIG. 21

COMBINATION OF REACTION GAS AND MATERIAL TO BE PROCESSED

| THIN FILM MATERIAL | TYPE OF ETCHING GAS |
|---|---|
| (1) Si<br>POLYCRYSTALLINE Si<br>AMORPHOUS Si | $CF_4$, $C_2F_6$, $C_3F_8$, $CF_4 + O_2$, $CCl_2F_2$, $CCl_4$, $PCl_3$, $CBrF_3$, $SF_6$, $NF_3$, $XeF_2$, $F_2$, $(SiF_4PO_2)$ $ClF_3$, $CF_3Cl$, $CF_2Cl_2$, $CFCl_3$, $CF_3Br$, $C_2F_5Cl$, $C_2F_4Cl_2$, $(CF_4, C_2F_6, SiF_4, CF_3Br) + CCl_2Br_2$, $Cl_2 (+H_2)$, $SiCl_4$, $Br_2$, $Cl_2+Ar$, $HBr$, $HI$ |
| (2) $Si_3N_4$ | $CF_4$, $CF_4+O_2$, $C_2F_6$, $C_3F_2$, $CHF_3 (+N_2, O_2)$, $C-C_4F_4$, $(CF_4, C_2F_6, C_3F_2) + (H_2, C_2H_4, C_2F_4)$ |
| (3) MO | $CF_4$, $CF_4 +O_2$, $CF_3Br$, $CCl_2F_2$, $CCl_4 (+O_2)$, $SF_6$ |
| (4) W, Ta | $CF_4$, $CF_4+O_2$ |
| (5) Ti | $CF_4 (+O_2)$, $C_2F_6$, $CF_3Br+O_2$ |
| (6) $Cr_2O_3$ | $Cl_2+Ar$, $CCl_4+Ar$ |
| (7) Al | $CCl_4 +O_2$, $CCl_4+Ar$, $BCl_3$, $SiCl_4$, $BBr_3$, $PCl_3$, $Cl_2$, $CHCl_3+Cl_2+He$, $(CCl_4, BCl_3, SiCl_4) +Cl_2$, $HCl$, $Br_2$, $CCl_2$, $F_2$ |
| (8) GaAs | $CCl_2F_2$, $CHClF_2$ |
| (9) Cu | $CCl_4$, $CCl_4 +AlCl_3$, $SiCl_4$, $Cl_2$, $N_2$ |
| (10) $SiO_2$ | $CF_3Cl$, $C_2F_5Cl$, $C_2F_6$, $CF_4$, $CF_4 +O_2$, $C_3F_6$, $CHF_3$ |
| (11) PHOTORESIST | $O_2$, $CF_4$ (OR $C_2F_6$) $+O_2$, $N_2 +O_2$ |
| (12) ITO (INDIUM TIN OXIDE) | $(CH_4, C_2H_6, C_2H_4) +H_2$ |

* AN INERT GAS SUCH AS He, Ne, Xe, Kr OR Ar
IS USED AS A DILUENT GAS OR A CARRIER GAS

FIG. 22
COMBINATION OF STARTING GAS AND FILM FORMED

| FILM FORMED | STARTING GAS |
| --- | --- |
| (1) Si OR POLYCRYSTALLINE Si | $SiH_4$, $SiHCl_3$, $SiH_2Cl_2$, $SiCl_4$, $Si_2H_6$ |
| (2) $SiO_2$ | $SiH_4$, $SiHCl_2$, $SiH_2Cl_2$, $SiCl_4$, $SiBr_4$, $SiI_4$, $SiF_4$, $Si(OC_2H_4)_4$, $Si(OC_2H_5)_4$, $(C_2H_5)Si(OC_2H_6)_3$, $C_6H_{11}Si(OC_2H_5)_3$, $C_6H_5Si(OC_2H_5)_3$, $(CH_3)_2Si(OC_2H_5)_2$ OR $O_2$, $NO$, $N_2O$, $NO_2$, $CO_2+H_2$, $H_2O$ |
| (3) BPSG, BSG, PSG OR AsSG | MIXTURE OF STARTING GAS (2) AND THE FOLLOWING GAS: $PH_3$, $B_2H_6$, $AsH_3$, $PO(OCH_3)_3$, $B(OCH_3)_3$, $B(OC_3H_7)_3$ |
| (4) $SiN_x$ | MIXTURE OF $SiH_4$, $SiH_5$, $SiHCl_3$, $SiH_2Cl_2$, $SiH_3Cl$, $SiCl_4$ OR $SiBr_4$ AND $NH_3$, $N_2H_4$ OR $N_2$, Ar OR He AS A CARRIER GAS |
| (5) $SiO_xN_y$ | SAME AS STARTING GASES (2) AND (4) |
| (6) Al | $AlCl_3$, $Al(CH_3)_3$(TMA), $Al(C_2H_6)_3$(TEA), $Al(OC_3H_7)_3$, $H_2$ AS A REDUCING GAS |
| (7) $Al_2O_{3-x}$ | MIXTURE OF STARTING GAS (6) AND $CO_2+H_2$, $O_2$, $H_2O$ OR $CO_2$ |
| (8) $In_2O_3$ | $In(CH_3)_3$(TMI), $In(C_2H_6)_3$(TEI), OR $O_2$, $H_2O$, $CO_2$ |
| (9) HIGH-MELTING METAL | FLUORIDE ($MoF_6$, $WF_6$), CHLORIDE ($MoCl_6$, $WCl_6$, $TaCl_5$, $TiCl_4$, $ZrCl_4$), ORGANIC COMPOUND $(Ta(OC_2H_5)_5$, $(PtCL_2)_2(CO)_3$, $W(CO)_6$, $Mo(CO)_6$ |
| (10) SILICIDE | MIXTURE OF STARTING GAS (9) AND SILANE GAS SUCH AS $SiH_4$ OR $SiH_6$ |
| (11) TiN | $TiCl_4 + N_2 (+NH_3)$ |
| (12) TiON | MIXTURE OF $TiCl_4+N_2 (+NH_3)$ AND $O_2$ OR $N_2O$ |
| (13) Cu | COPPER HEXAFLUOROACETYLACETONATE $(Cu(HFA)_2)$ AND $C(HFA)_2+H_2O$ OTHER MATERIALS OF CHELATE COMPOUND: $Cu(DPM)_2$, $Cu(AcAc)_2$, $Cu(FOD)_2$, $Cu(PPM)_2$, $Cu(HFA)$ TMVS |
| (14) Al-Si AND Al-Si-Cu | MIXTURE OF STARTING GAS (6) AND STARTING GAS (1) OF (13) |

\* MIXTURE OF AN $H_2$-BASED HYDROGEN CARRIER GAS SUCH AS $H_2$, $H_2$+Ar, $H_2$+Ne OR $H_2$+He AND EACH STARTING GAS IN CASE OF CATALYTIC CVD

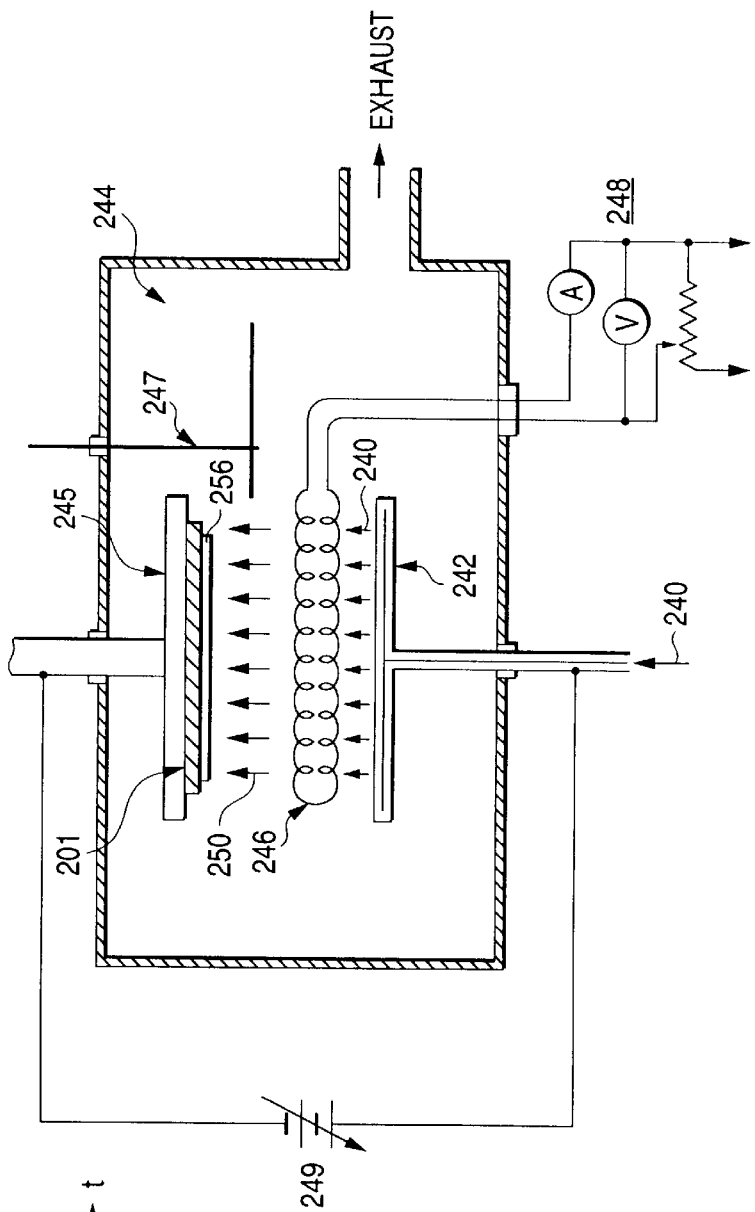
FIG. 102
ANISOTROPIC ETCHING AT HIGH SELECTION RATIO WITH KENETIC ENERGY BY CATALYTIC ACTIVITY OF CATALYST, ITS HEAT ENERGY AND ACCELERATION VOLTAGE
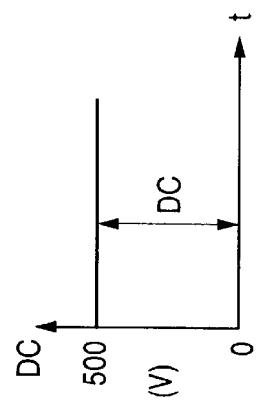

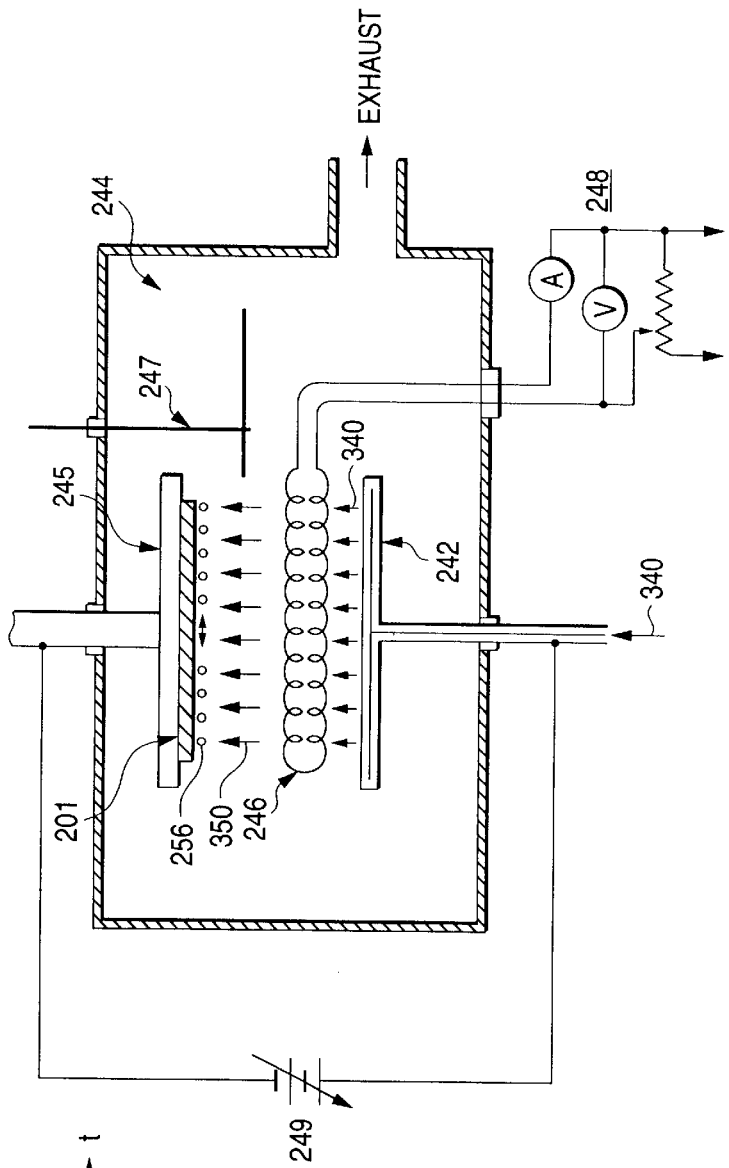
FIG. 106
MIGRATION WITH KINETIC ENERGY BY CATALYTIC ACTIVITY OF CATALYST, ITS HEAT ENERGY AND ACCELERATION VOLTAGE
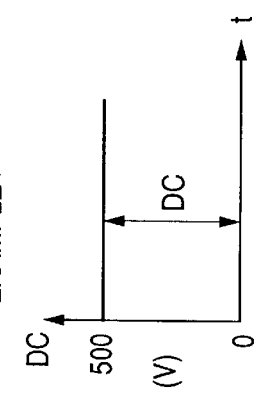

MOSTFT PRODUCTION PROCESS FLOW

FORMATION OF POLYCRYSTALLINE
SILICON FILM BY CATALYTIC CVD METHOD

FORMATION OF GATE OXIDE FILM BY THERMAL
OXIDATION METHOD OR CATALYTIC CVD METHOD

ION IMPLANTATION FOR N-CHANNEL MOS

ION IMPLANTATION FOR P-CHANNEL MOS

FORMATION OF POLYCRYSTALLINE SILICON FILM
FOR GATE ELECTRODE BY CATALYTIC CVD METHOD

FORMATION OF GATE ELECTRODE BY
DC BIAS CATALYTIC ETCHING METHOD

OXIDATION OF GATE POLYCRYSTALLINE SILICON FILM

ION IMPLANTATION FOR N-CHANNEL MOS SOURCE/DRAIN

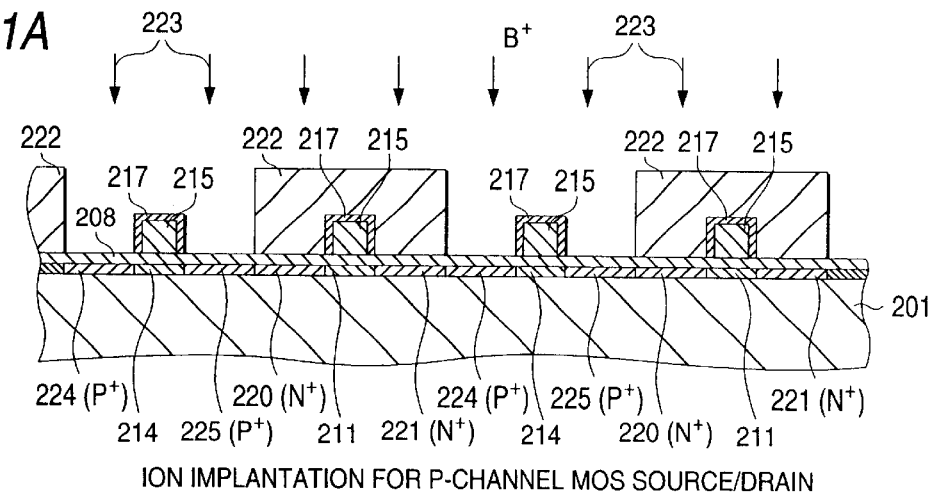
FIG. 111A ION IMPLANTATION FOR P-CHANNEL MOS SOURCE/DRAIN
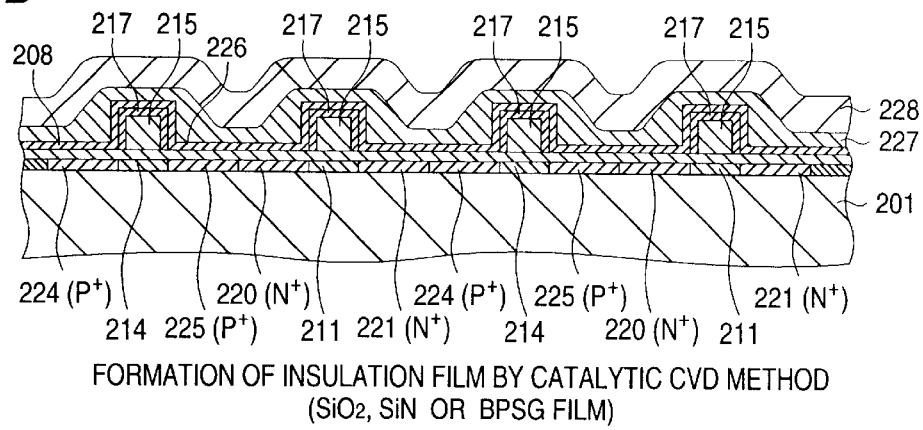
FIG. 111B FORMATION OF INSULATION FILM BY CATALYTIC CVD METHOD
(SiO2, SiN OR BPSG FILM)
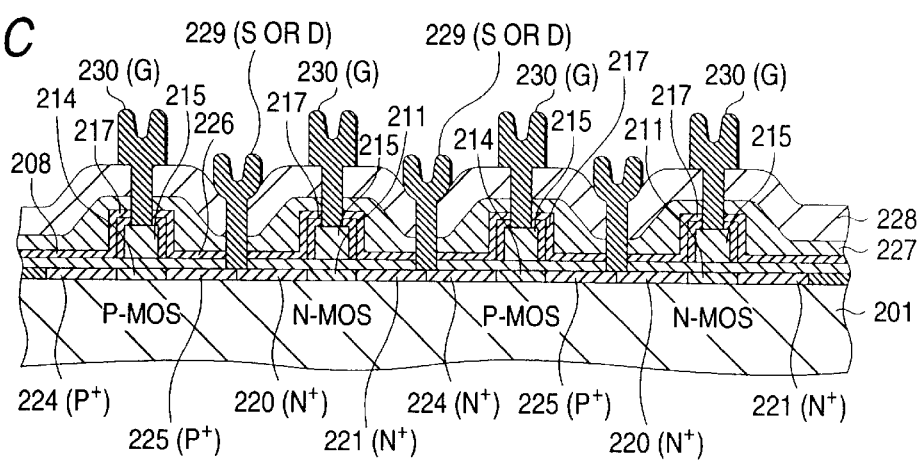
FIG. 111C FORMATION OF CONTACT HOLES BY CATALYTIC
ETCHING METHOD → FORMATION OF ELECTRODE

LCD PRODUCTION PROCESS FLOW

IMAGE AREA    PERIPHERAL CIRCUIT PORTION

FORMATION OF POLYCRYSTALLINE SILICON FILM BY CATALYTIC CVD METHOD

PATTERNING OF POLYCRYSTALLINE SILICON FILM

FORMATION OF GATE OXIDE FILM

FORMATION OF GATE ELECTRODE BY DC BIAS CATALYTIC ETCHING METHOD

FORMATION OF SOURCE AND DRAIN REGIONS OF N-CHANNEL
MOSTFT, ASHING OF RESIST FILM BY DC BIAS CATALYTIC ASHING

FORMATION OF SOURCE AND DRAIN REGIONS OF P-CHANNEL
MOSTFT, ASHING OF RESIST FILM BY DC BIAS CATALYTIC ASHING

FORMATION OF INTERLAYER INSULATION
FILM BY CATALYTIC CVD METHOD

FORMATION OF CONTACT HOLES BY CATALYTIC ETCHING METHOD → FORMATION OF SOURCE ELECTRODE OF IMAGE AREA AND SOURCE AND DRAIN ELECTRODES OF PERIPHERAL CIRCUIT PORTION, FORMATION OF INSULATION FILM

FORMATION OF IMAGE ELECTRODE (ITO TRANSPARENT ELECTRODE) OF IMAGE AREA

ANISOTROPIC ETCHING AT HIGH SELECTION RATIO WITH KINETIC ENERGY BY CATALYTIC ACTIVITY OF CATALYST, ITS HEAT ENERGY AND ACCELERATION VOLTAGE

ANISOTROPIC ETCHING AT HIGH SELECTION RATIO WITH KINETIC ENERGY ACCOMPANIED
BY CHANGE IN ELECTRIC FIELD THROUGH CATALYTIC ACTIVITY OF CATALYST, ITS HEAT
ENERGY AND (DC + RADIOFREQUENCY VOLTAGE) ACCELERATION VOLTAGE

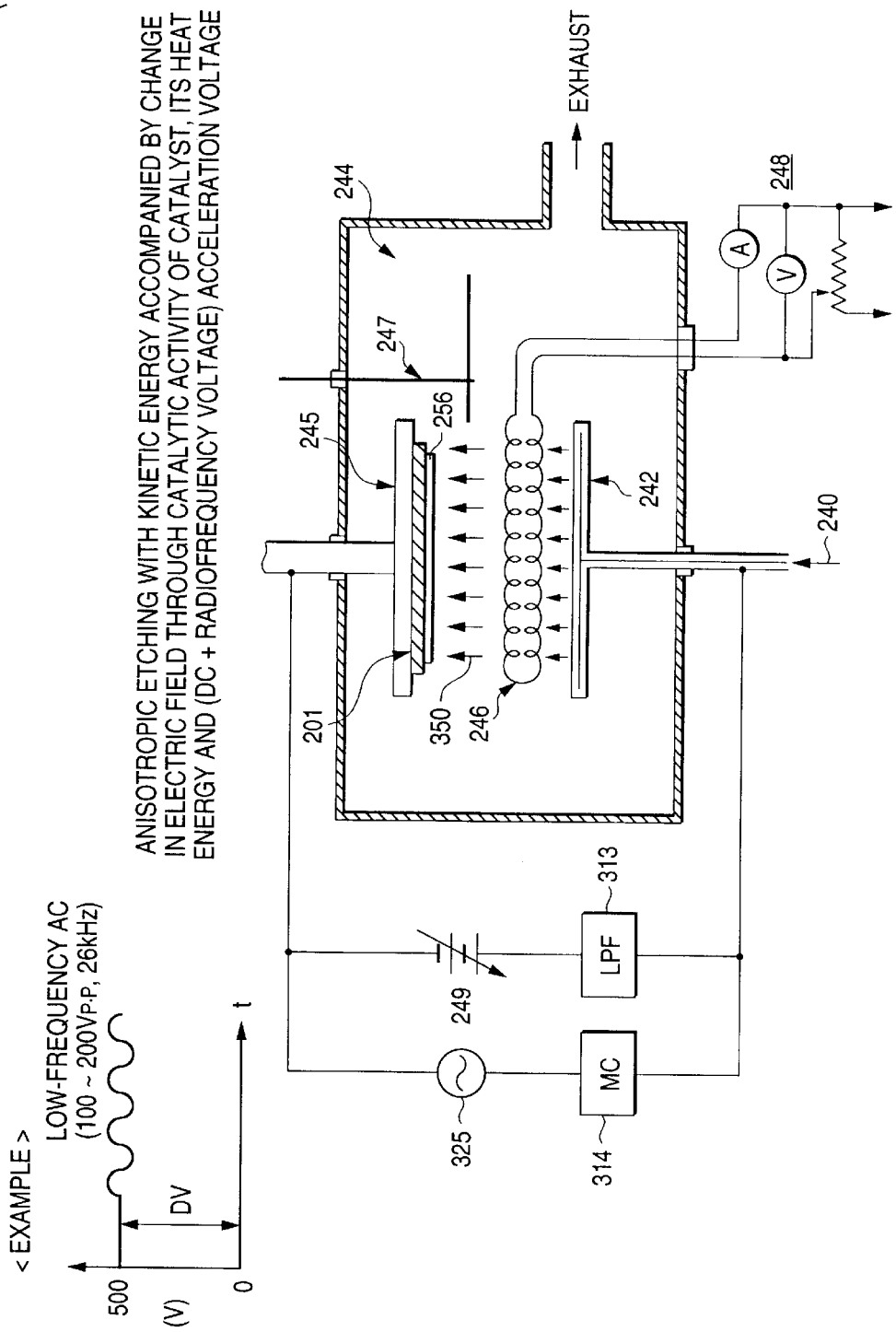

FIG. 130

COMBINATION OF REACTION GAS AND MATERIAL TO BE PROCESSED

| THIN FILM MATERIAL | TYPE OF ETCHING GAS |
|---|---|
| (1) Si<br>POLYCRYSTALLINE Si<br>AMORPHOUS Si | $CF_4$, $C_2F_6$, $C_3F_8$, $CF_4$ +$O_2$, $CCl_2F_2$, $CCl_4$, $PCl_3$, $CBrF_3$, $SF_6$, $NF_3$, $XeF_2$, $F_2$, ($SiF_4PO_2$) $ClF_3$, $CF_3Cl$, $CF_2Cl_2$, $CFCl_3$, $CF_3Br$, $C_2F_5Cl$, $C_2F_4Cl_2$, ($CF_4$, $C_2F_6$, $SiF_4$, $CF_3Br$) +$CCl_2Br_2$, $Cl_2$ (+$H_2$), $SiCl_4$, $Br_2$, $Cl_2$+Ar, HBr, HI |
| (2) $Si_3N_4$ | $CF_4$, $CF_4$+$O_2$, $C_2F_6$, $C_3F_2$, $CHF_3$ (+$N_2$, $O_2$), C-$C_4F_4$, ($CF_4$, $C_2F_6$, $C_3F_2$) + ($H_2$, $C_2H_4$, $C_2F_4$) |
| (3) MO | $CF_4$, $CF_4$ +$O_2$, $CF_3Br$, $CCl_2F_2$, $CCl_4$ (+$O_2$), $SF_6$, |
| (4) W, Ta | $CF_4$, $CF_4$+$O_2$ |
| (5) Ti | $CF_4$ (+$O_2$), $C_2F_6$, $CF_3Br$+$O_2$ |
| (6) $Cr_2O_3$ | $Cl_2$+Ar, $CCl_4$+Ar |
| (7) Al | $CCl_4$ +$O_2$, $CCl_4$+Ar, $BCl_3$, $SiCl_4$, $BBr_3$, $PCl_3$, $Cl_2$, $CHCl_3$+$Cl_2$+He, ($CCl_4$, $BCl_3$, $SiCl_4$) +$Cl_2$, HCl, $Br_2$, $CCl_2$, $F_2$ |
| (8) GaAs | $CC_2F_2$, $CHClF_2$ |
| (9) Cu | $CCl_4$, $CCl_4$ +$AlCl_3$, $SiCl_4$, $Cl_2$, $N_2$ |
| (10) $SiO_2$ | $CF_3Cl$, $C_2F_5Cl$, $C_2F_6$, $CF_4$, $CF_4$ +$O_2$, $C_3F_6$, $CHF_3$ |
| (11) PHOTORESIST | $O_2$, $CF_4$ (OR $C_2F_6$) +$O_2$, $N_2$ +$O_2$ |
| (12) ITO (INDIUM TIN OXIDE) | ($CH_4$, $C_2H_6$, $C_2H_4$) +$H_2$ |

* AN INERT GAS SUCH AS He, Ne, Xe, Kr OR Ar
IS USED AS A DILUENT GAS OR A CARRIER GAS

FIG. 131

COMBINATION OF STARTING GAS AND FILM FORMED

| FILM FORMED | STARTING GAS |
|---|---|
| (1) Si OR POLYCRYSTALLINE Si | $SiH_4$, $SiHCl_3$, $SiH_2Cl_2$, $SiCl_4$, $Si_2H_6$ |
| (2) $SiO_2$ | $SiH_4$, $SiHCl_2$, $SiH_2Cl_2$, $SiCl_4$, $SiBr_4$, $SiI_4$, $SiF_4$, $Si(OC_2H_4)_4$, $Si(OC_2H_5)_4$, $(C_2H_5)Si(OC_2H_6)_3$, $C_6H_{11}Si(OC_2H_5)_3$, $C_6H_5Si(OC_2H_5)_3$, $(CH_3)_2Si(OC_2H_5)_2$ OR $O_2$, NO, $N_2O$, $NO_2$, $CO_2+H_2$, $H_2O$ |
| (3) BPSG, BSG, PSG OR AsSG | MIXTURE OF STARTING GAS (2) AND THE FOLLOWING GAS: $PH_3$, $B_2H_6$, $AsH_3$, $PO(OCH_3)_3$, $B(OCH_3)_3$, $B(OC_3H_7)_3$ |
| (4) $SiN_x$ | MIXTURE OF $SiH_4$, $SiH_5$, $SiHCl_3$, $SiH_2Cl_2$, $SiH_3Cl$, $SiCl_4$ OR $SiBr_4$ AND $NH_3$, $N_2H_4$ OR $N_2$, Ar OR He AS A CARRIER GAS |
| (5) $SiO_xN_y$ | SAME AS STARTING GASES (2) AND (4) |
| (6) Al | $AlCl_3$, $Al(CH_3)_3$(TMA), $Al(C_2H_6)_3$(TEA), $Al(OC_3H_7)_3$, $H_2$ AS A REDUCING GAS |
| (7) $Al_2O_{3-x}$ | MIXTURE OF STARTING GAS (6) AND $CO_2+H_2$, $O_2$, $H_2O$ OR $CO_2$ |
| (8) $In_2O_3$ | $In(CH_3)_3$(TMI), $In(C_2H_6)_3$(TEI), OR $O_2$, $H_2O$, $CO_2$ |
| (9) HIGH-MELTING METAL | FLUORIDE ($MoF_6$, $WF_6$), CHLORIDE ($MoCl_6$, $WCl_6$, $TaCl_5$, $TiCl_4$, $ZrCl_4$), ORGANIC COMPOUND ($Ta(OC_2H_5)_5$, $(PtCL_2)_2(CO)_3$, $W(CO)_6$, $Mo(CO)_6$ |
| (10) SILICIDE | MIXTURE OF STARTING GAS (9) AND SILANE GAS SUCH AS $SiH_4$ OR $SiH_6$ |
| (11) TiN | $TiCl_4 + N_2$ (+$NH_3$) |
| (12) TiON | MIXTURE OF $TiCl_4+N_2$ (+$NH_3$) AND $O_2$ OR $N_2O$ |
| (13) Cu | COPPER HEXAFLUOROACETYLACETONATE (Cu (HFA)$_2$) AND C(HFA)$_2$+$H_2O$ OTHER MATERIALS OF CHELATE COMPOUND: Cu (DPM)$_2$, Cu (AcAc)$_2$, Cu (FOD)$_2$, Cu (PPM)$_2$, Cu (HFA) TMVS |
| (14) Al-Si AND Al-Si-Cu | MIXTURE OF STARTING GAS (6) AND STARTING GAS (1) OF (13) |

\* MIXTURE OF AN $H_2$-BASED HYDROGEN CARRIER GAS SUCH AS $H_2$, $H_2$+Ar, $H_2$+Ne OR $H_2$+He AND EACH STARTING GAS IN CASE OF CATALYTIC CVD

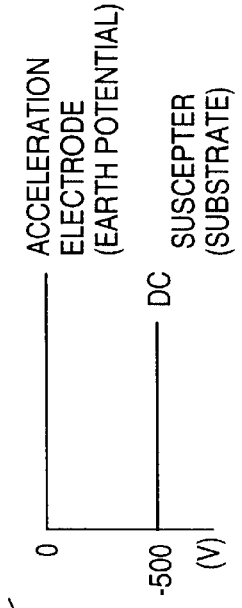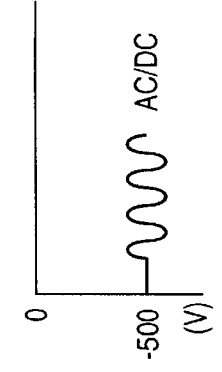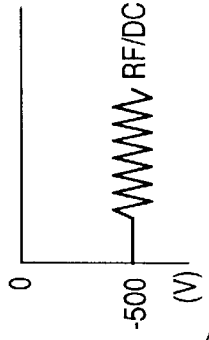
FIG. 132A
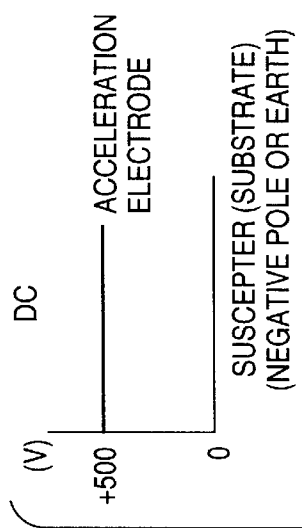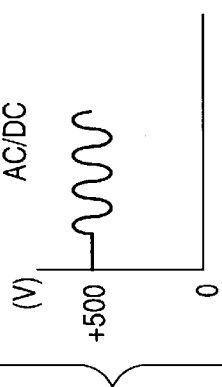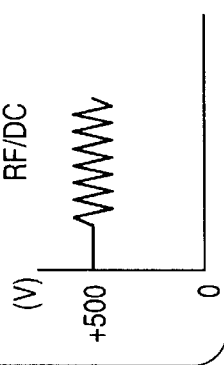
FIG. 132B

VAPOR-PHASE PROCESSING METHOD AND APPARATUS THEREFOR

BACKGROUND OF THE INVENTION

1. Field of the Invention

The present invention relates to a vapor-phase processing method in which a polycrystalline silicon film or a photoresist film is etched or ashed in vapor phase, and an apparatus therefor.

2. Description of the Related Art

The method of etching the polycrystalline silicon layer in vapor phase has been so far employed in constructing MISFET (metal-insulator-semiconductor field effect transistor) using a polycrystalline silicon layer formed on a substrate as a gate electrode, for example, TFT (thin film transistor).

In this vapor-phase etching method, the etching has been so far conducted by exciting a reaction gas with plasma discharge and applying the same to a substrate or a film on the substrate for reaction to vaporize the reaction product for etching. In this reactive etching using plasma, a plasma potential (cathode drop) usually occurs owing to a difference in mobility in a group of electrons or ions to allow acceleration by the potential gradient. Since the electric field by this potential is vertical to a substrate, ions or radicals are vertically applied to the substrate whereby the etching selectivity is obtained.

However, the use of plasma in this etching involves the following defects.

(1) A non-uniform electric field is generated on the substrate owing to a non-uniform plasma electric field, fluctuation and plasma induction charge, thereby causing damage and short-circuiting of a transistor (increase in charge of a gate oxide film, discharge breakdown and discharge between wires). This phenomenon tends to occur in on/off action of plasma in particular.

(2) There is a possibility of ultraviolet damage due to light emission from plasma.

(3) Metals on an inner wall of a device are damaged with plasma to cause cross contamination of metallic atoms.

(4) Plasma discharge in a large area is difficult, and a standing wave is generated, so that uniformity is hardly obtained.

(5) A device is complicated and costly, and maintenance thereof is troublesome.

Such problems due to plasma also occur when a photoresist is ashed by plasma discharge.

SUMMARY OF THE INVENTION

Under these circumstances, the invention aims to provide a method in which etching (further ashing) is conducted by imparting satisfactory kinetic energy to reaction seeds such as ions or radicals and further controlling kinetic energy without damaging a substrate, and an apparatus used in this method.

That is, the invention relates to a vapor-phase processing method, which comprises etching or ashing a substrate or a film on the substrate with reaction seeds or precursors thereof generated by contacting a reaction gas with a catalyst heated. Further, it is possible that an electric field of less than a glow discharge starting voltage acts on reaction seeds or precursors thereof generated to give directional kinetic energy.

Still further, the invention is to provide a vapor-phase processing apparatus comprising a reaction gas feeding unit, a catalyst, a heating unit of the catalyst and a suscepter for supporting a substrate or a substrate with a film to be etched or ashed. The vapor-phase processing apparatus can further comprises an electric field applying unit for applying an electric field of less than a glow discharge starting voltage.

According to the method and the apparatus therefor in the invention, since the reaction seeds or the precursors thereof generated by contacting the reaction gas with the catalyst heated are used in the etching or the ashing, the following marked functional effects can be obtained.

(1) The reaction seeds or the precursors thereof are led to the substrate at good efficiency by imparting satisfactory kinetic energy owing to the catalytic activity of the catalyst and its heat energy, and the etching or the ashing proceeds by the chemical reaction and the collision against the substrate. Therefore, the pattern etching or ashing can be conducted with low damage without ultraviolet damage. Consequently, upon covering the defects of the ordinary reactive etching, for example, selective etching of polycrystalline Si, selective etching of $SiO_2$, on Si, etching of an Al alloy by a sputtering effect, removal of $Al_2O_3$ on Al, etching of copper or high-melting metals and removal of a resist degenerated layer after implantation of ions at high dose can easily be conducted satisfactorily.

(2) An etching selection ratio can freely be determined depending on a heating temperature of a catalyst, a type of a catalyst, and a type and conditions of a reaction gas. Thus, various fine processings such as anisotropic etching, isotropic etching, controlling of an angle of inclination on an edge and surface flattening by setting a selection ratio at 1 are enabled.

(3) Since the directional acceleration voltage by the electric field is imparted to the reaction seeds or the precursors thereof in addition to the catalytic activity of the catalyst and its heat energy, kinetic energy is increased to lead the same to the substrate at good efficiency, whereby the etching or the ashing proceeds by the chemical reaction and the collision against the substrate. Accordingly, since the etching is the anisotropic etching like the reactive ion etching, the high-precision pattern etching or ashing can be conducted with low damage without ultraviolet damage. As a result, the high-anisotropic etching is enabled through impact of ions entered vertically upon covering the defects of the ordinary reactive etching. Consequently, for example, selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose can easily be conducted satisfactorily.

(4) An etching selection ratio can freely be determined depending on a type of an acceleration voltage [direct current (DC) voltage, low-frequency voltage superposed on direct current voltage (AC/DC) or radiofrequency voltage superposed on direct current voltage (RF/DC)], its value, a heating temperature of a catalyst, a type of a catalyst, and a type and conditions of a reaction gas. Thus, various fine processings such as anisotropic etching, isotropic etching, controlling of an angle of inclination on an edge and surface flattening by setting a selection ratio at 1 are enabled.

(5) Since plasma is not generated, damage or short-circuiting, ultraviolet damage and cross contamination of metals by plasma do not occur.

(6) Since reaction seeds (ions or radicals) generated with a catalyst are led to a substrate at good efficiency, a reaction gas is used at high efficiency, and a treatment rate is increased, thereby improving a productivity and reducing costs by reduction of a reaction gas.

(7) In comparison with reactive etching with plasma, quite a simple, inexpensive apparatus is realized. In this case, operation is conducted under reduced pressure or under normal pressure. In the reduced pressure operation, a simpler, less costly apparatus can be realized than in the normal pressure operation.

(8) Since kinetic energy of reaction seeds is great, treatment in a large area is enabled. Even when a substrate temperature is decreased, the treatment can be conducted, and a large-sized, less costly insulation substrate (glass substrate or heat-resistant resin substrate) is also available. In this respect, costs can also be reduced.

BRIEF DESCRIPTION OF THE DRAWINGS

FIG. 21 is a table showing a combination of reaction gases and materials to be processed in catalytic etching or ashing according to the seventh embodiment of the invention.

FIG. 22 is a table showing a combination of starting gases used in formation of thin films by CVD and thin films.

FIG. 102 is a schematic sectional view in etching with a catalytic etching apparatus according to the same.

FIG. 106 is a schematic sectional view in CVD with a DC bias catalytic CVD apparatus according to the same.

FIG. 111, consisting of FIGS. 111A through 111D, is a sectional view in MOSTFT production process flow using a catalytic etching apparatus according to the same.

FIG. 129 is a schematic sectional view of an AC/DC bias catalytic etching apparatus according to the twelfth embodiment of the invention.

FIG. 130 a table showing a combination of reaction gases and materials to be processed in DC, RF/DC or AC/DC bias catalytic etching or ashing according to the thirteenth embodiment of the invention.

FIG. 131 is a table showing a combination of starting gases in formation of thin films by CVD and thin films according to the same.

FIG. 132A is a graphic representation of applying a positive polarity of a power source to an acceleration electrode, and a negative polarity or earth potential to a suscepter.

FIG. 132B is a graphic representation of applying an earth potential to an acceleration electrode, and a negative polarity to a suscepter.

DETAILED DESCRIPTION OF THE INVENTION

Figure 1:
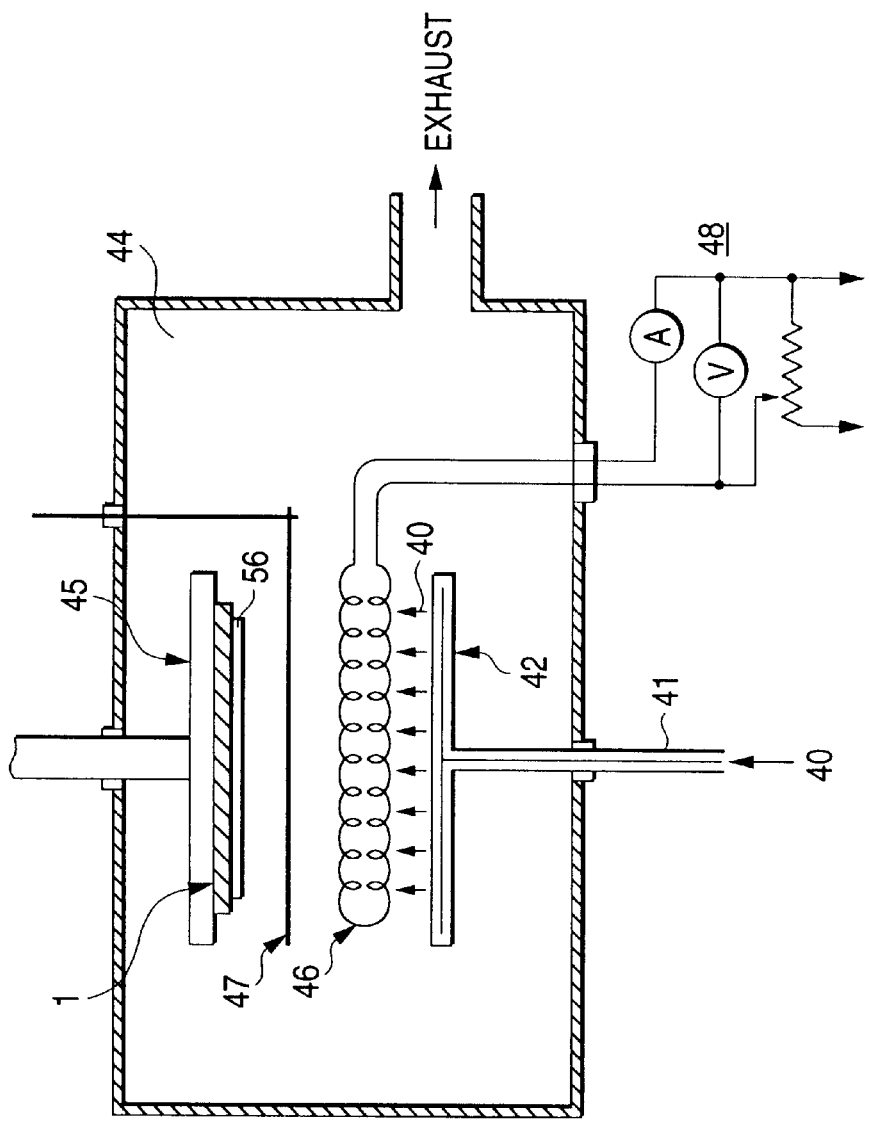
FIG. 1 is a schematic sectional view of a catalytic etching apparatus according to the first embodiment of the invention.

In the method and the apparatus therefor of the invention, the catalyst can be mounted between the substrate or the suscepter and the reaction gas feeding unit. In this case, it is advisable to form a gas feeding port for leading out the reaction gas in shower state in the reaction gas feeding unit.

The catalyst may take the form of a coil, a mesh, a wire or a porous plate. Further, plural such catalysts may be mounted along the gas stream. Consequently, while the gas stream is formed effectively, it is possible to increase a contact area between the catalyst and the gas, expedite the catalytic reaction, increase the use efficiency of the reaction gas, enhance the etching rate, improve the productivity and reduce costs.

Further, ions are generated in the reaction gas due to the catalytic activity of the catalyst either in or during the processing by etching or ashing, with the result that the charge of the substrate is sometimes increased to cause non-uniform processing by etching or ashing. In order to prevent the same, it is preferred to neutralize ions by applying charged particles (electron beams or protons, especially electron beams) to the reaction seeds or the precursors thereof. That is, it is preferred to mount a charged particle application unit in the vicinity of the suscepter.

After the vapor-phase processing by etching, the substrate is withdrawn outside a processing chamber, a voltage is applied between the suscepter and the reaction gas feeding unit to allow plasma discharge, whereby the inside of the processing chamber is cleaned (:reaction gas is $CF_4$, $NF_3$, $H_2$ or $C_2F_6$). Thus, foreign matters adhered to an inner wall surface or constituting members of a chamber in the vapor-phase processing can be removed by etching. Accordingly, it is possible to decrease dust and reduce costs by improving yields and qualities. This can be realized upon using an apparatus for vapor-phase processing as such. Therefore, there is no need to withdraw the constituting members outside the chamber and clean the same. Accordingly, the workability is improved, and costs can be reduced by increasing the productivity. The catalyst can also be cleaned at the same time. However, it may be withdrawn outside the chamber and cleaned separately.

In the vapor-phase processing according to the invention, specifically, a substrate held at a temperature of $-100°$ C. to $500°$ C. or a film on the substrate is etched or ashed in vapor phase using the reaction seeds or the precursors (radicals) thereof generated by heating the catalyst at a temperature of less than its melting point in the range of 800 to $2,000°$ C. (for example, passing electricity through the catalyst and heating the same by its own resistance heating) and catalytically reacting or thermally decomposing at least a part of the reaction gas with the catalyst heated.

When the heating temperature of the catalyst here is less than $800°$ C., the catalytic reaction or the thermal decomposition of the reaction gas is not conducted satisfactorily, and the processing rate of etching tends to decrease. When it exceeds $2,000°$ C., a constituting material of the catalyst is incorporated into the film to impair electrical properties of the film and decrease the qualities of the film. Moreover, since the heating over the melting point of the catalyst loses the form stability, it is advisable to avoid the same. The heating temperature of the catalyst is less than the melting point of the constituting material, and it is preferably between 1,100 and $1,800°$ C.

The substrate temperature is preferably between $-100°$ C. and $500°$ C., more preferably between room temperature and $200°$ C. Consequently, high-quality processing can be conducted efficiently. When the substrate temperature exceeds $500°$ C., for example, a doping concentration distribution of impurities of an active region in an integrated circuit device tends to be changed by influence of heat.

In the vapor-phase processing method according to the invention, the heat treatment can be conducted at the low temperature without the need of plasma or light excitation. Thus, a glass having a low distortion point of 470 to $670°$ C. can be used as a substrate, for example, a glass substrate. This is less costly, easily formed into a thin plate, and increased in size (more than 1 $m^2$). Further, a long rolled glass plate can be produced. For example, a long rolled glass plate can be treated continuously or discontinuously by the foregoing method.

The reaction gas used in the vapor-phase processing of the invention may be a halogen gas or its compound gas such as flon or chlorine based on an inert diluent gas (carrier gas) such as Ne, Ar or He or an oxidative gas such as oxygen (for example, $CF_4$+He-diluted $O_2$)

The use of the reaction gas enables etching of semiconductor films such as films of polycrystalline silicon, monocrystalline silicon, amorphous silicon, silicon-germanium, silicon carbide, compound semiconductors (gallium-nitride, gallium-arsenic and gallium-phosphorus), diamond and diamond-like carbon (DLC), etching of insulation films of silicon oxide, impurity-containing silicon oxides such as PSG (phosphorus silicate glass), BSG (borosilicate glass) and BPSG (boro-phosph-silicate glass), silicon nitride, silicon acid nitride and chromium oxide, etching of conductive oxide films of indium oxide, ruthenium oxide, palladium oxide and indium tin oxide (ITO), etching of metallic films of high-melting metals and conductive metal nitrides such as tungsten, tungsten nitride, titanium, titanium nitride, molybdenum, molybdenum nitride, tantalum and tantalum nitride, aluminum, aluminum alloy (containing 1% Si or 1 to 2% of Cu), silicide, platinum, palladium, ruthenium, indium and copper, etching of high dielectric films of BST and ferroelectric film such as PZT, PLZT, SBT and BIT, etching of a carbonanotube, or etching or ashing of an organic film of a photoresist.

The catalyst can be formed of at least one material selected from the group consisting of tungsten, thoria-containing tungsten, molybdenum, platinum, palladium, vanadium, silicon, alumina, metal-coated ceramics, silicon carbide, hydrocarbons, ceramics, conductive nitride film-coated high-melting metals (tungsten, tantalum, thoria-containing tungsten, molybdenum and titanium), silicon, silicon nitride, silicon oxide and conductive metal nitrides (tungsten nitride, titanium nitride, molybdenum nitride and tantalum nitride). It is advisable that this catalyst is not etched with the reaction gas. In order to prevent degradation of the catalyst with the etching gas or the reactive gas, the catalyst may be formed of an anti-corrosive material such as platinum, platinum-coated ceramics, palladium or palladium-coated ceramics.

Preferably, the vapor-phase processing method and the apparatus therefor according to the invention are constructed such that the reaction gas is replaced with a film-forming starting gas and a predetermined film is formed on the substrate by feeding this starting gas (namely a film is formed in vapor phase by the catalytic CVD-method). For example, it is possible that the film is selectively removed by catalytic etching with the reaction gas using a mask, a photoresist film as the mask is then removed by catalytic ashing with an oxidative gas, and a predetermined film is thereafter formed on the substrate by the catalytic CVD method upon replacing the gas with the film-forming starting gas (that is, the starting gas is contacted with the catalyst heated, and kinetic energy is imparted to the resulting reaction seeds or the precursors thereof, thereby forming a predetermined film on the substrate).

As a result, the film can be formed by CVD upon using the apparatus for conducting the vapor-phase processing as such and only-changing the gas. This leads to the improvement in the workability and the reduction of costs with the improvement in the productivity. That is, since the thin film etching, the photoresist ashing and further the CVD film formation can continuously be conducted, making it possible to increase qualities of the film owing to less contamination with impurities and to reduce costs owing to the improvement in the productivity with the improvement in the workability.

With respect to the growth of the vapor phase by the catalytic CVD method, specifically, a thin film is deposited on a substrate heated at room temperature to 550° C. under reduced pressure or under normal pressure using, as starting seeds, the deposition seeds or the precursors thereof generated by heating the catalyst at a temperature of less than its melting point in the range of 800 to 2,000° C. (for example, passing electricity through the catalyst and heating the same by its own resistance heating) and catalytically reacting or thermally reacting at least a part of the starting gas with the catalyst heated.

In this case, since the catalytic activity of the catalyst and its heat energy are applied to the deposition seeds or the precursors thereof, kinetic energy is increased to lead them to the substrate at good efficiency and satisfactorily conduct the migration on the substrate and the diffusion in the film being formed. Accordingly, in comparison with the ordinary catalytic CVD method, it enables improvement in adhesion between the film formed and the substrate, improvement in density of the film formed, improvement in uniformity or smoothness of the film formed, improvement in embedding property into via holes and step coverage, further decrease in the substrate temperature and stress control of the film formed. Thus, a high-quality film (for example, a silicon film or a metallic film having properties close to bulk properties) can be realized. Besides, since generation of plasma does not occur, a film formed with low stress is obtained without damage by plasma.

In this case, when the heating temperature of the catalyst is less than 800° C., the catalytic reaction or the thermal decomposition of the starting gas is insufficient, and the deposition rate tends to decrease. When it exceeds 2,000° C., the constituting material of the catalyst is incorporated into the deposition film to impair the electrical properties of the film and decrease the qualities of the film. Further, since the heating above the melting point of the catalyst loses the form stability, it is advisable to avoid the same. The heating temperature of the catalyst is less than the melting point of the constituting material, and preferably between 1,100 and 1,800° C.

The substrate temperature is preferably between room temperature and 550° C., more preferably between 150 and 400° C. In this temperature range, a high-quality film can be formed efficiently. When the substrate temperature exceeds 550° C., the material of the substrate is restricted (an inexpensive glass is not used), a productivity is poor (throughput is decreased), and qualities of the film and the uniformity of the film thickness tend to decrease. When a passivation film for integrated circuit is formed, a doping concentration distribution of impurities tends to change by the influence of heat.

When a polysilicon film (polycrystalline silicon film) is formed by the ordinary thermal CVD method, the substrate temperature has to be between approximately 600 and 900° C. Meanwhile, in the film formation by this catalytic CVD method, the thermal CVD at low temperatures can be conducted without the need of plasma or light excitation, which is quite advantageous. Since the substrate temperature in the catalytic CVD is low as noted above, a glass having a low distortion point of 470 to 670° C. can be used, as a substrate, for example, a glass substrate. This is less costly, easily formed into a thin plate, and increased in size (more than 1 m$^2$). Further, a long rolled glass plate can be produced. For example, a thin film can be formed on the long rolled glass plate continuously or discontinuously by the foregoing method.

The starting gas used in this vapor-phase growth may be any of the following gases (a) to (p) based on a hydrogen carrier gas ($H_2$, $H_2$+Ar, $H_2$+Ne or $H_2$+He).

(a) silicon hydride or its derivatives
   (b) a mixture of silicon hydride or its derivatives and a gas containing hydrogen, oxygen, nitrogen, germanium, carbon, tin or lead (c) a mixture of silicon hydride or its derivatives and a gas containing impurities made of elements of Group III or V in the periodic table (d) a mixture of silicon hydride or its derivatives, a gas containing hydrogen, oxygen, nitrogen, germanium, carbon, tin or lead and a gas containing impurities made of elements of Group.III or V in the periodic table (e) an aluminum compound gas (f) a mixture of an aluminum compound gas and a gas containing hydrogen or oxygen (g) an indium compound gas (h) a mixture of an indium compound gas and an oxygen-containing gas (i) a high-melting metal fluoride gas, chloride gas or organic compound gas (j) a mixture of a high-melting metal fluoride gas, chloride gas or organic compound gas and silicon hydride or its derivatives (k) a mixture of titanium chloride and a gas containing nitrogen and/or oxygen (l) a copper compound gas (m) a mixture of an aluminum compound gas, a hydrogen or hydrogen compound gas, silicon hydride or its derivatives and/or a copper compound gas (n) hydrocarbons or their derivatives (o) a mixture of hydrocarbons or their derivatives and a hydrogen gas (p) an organic metal complex, alkoxide The use of these starting gases allows the vapor-phase growth of semiconductor thin films of polycrystalline silicon, monocrystalline silicon, amorphous silicon, microcrystalline silicon, silicon-germanium, silicon carbide (SiC), compound semiconductors (GaAs, GaP, GaN, ZnSe, ZnS and CdTe), diamond and diamond-like carbon (DLC), insulation thin films of silicon oxide, impurity-containing silicon oxides such as PSG (phosphorus silicate glass), BSG (borosilicate glass) and BPSG (boro-phosph-silicate glass), insulation thin films of silicon nitride, silicon acid nitride, molybdenum oxide, titanium oxide, tantalum oxide, aluminum oxide and indium oxide, oxidative conductive thin films of ruthenium oxide, indium oxide, indium tin oxide (ITO) and palladium oxide, metallic thin films of high-melting metals and conductive metal nitrides such as tungsten, titanium, tantalum, molybdenum, tungsten nitride, titanium nitride, tantalum nitride and molybdenum nitride, silicide, copper, aluminum, aluminum-silicon and aluminum-silicon-copper, high dielectric thin films of BST and ferroelectric thin films of PZT, PZLT, SBT and BIT.

It is advisable to heat-treat the catalyst in a hydrogen gas atmosphere before feeding the starting gas. When the catalyst is heated before feeding the starting gas, the constituting material of the oxidized catalyst is released, and incorporated into the film formed. This incorporation can be eliminated by heating the catalyst in the hydrogen gas atmosphere. It is thus advisable that while the predetermined hydrogen carrier gas is fed to the film-forming chamber, the catalyst is heated and the starting gas is then fed.

The invention is appropriate for producing a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a diamond semiconductor device, a diamond semiconductor integrated circuit device, a silicon carbide semiconductor device, a silicon carbide semiconductor integrated circuit device, a liquid crystal display device, an electro luminescence display device, a plasma display panel (PDP) device, a light-emitting-polymer display device, a light-emitting diode display device, a CCD area/linear sensor device, a MOS sensor device, a ferroelectric memory device, a high dielectric semiconductor device, a ferroelectric semiconductor device or a solar cell device.

DESCRIPTION OF THE PREFERRED EMBODIMENTS

The invention is described more specifically with reference to preferred embodiments.

First Embodiment

The first embodiment of the invention is described by referring to FIGS. 1 to 11.

<Catalytic Etching Method and an Apparatus Therefore>

In this embodiment, satisfactory kinetic energy, is applied to reaction seeds or precursors thereof generated by contacting a reaction gas such as a $C_4$ gas with a catalyst heated, whereby a predetermined film of polycrystalline silicon on a substrate is etched in vapor phase. The etching method according to this embodiment is called hereinafter a catalytic etching method.

Figure 2:
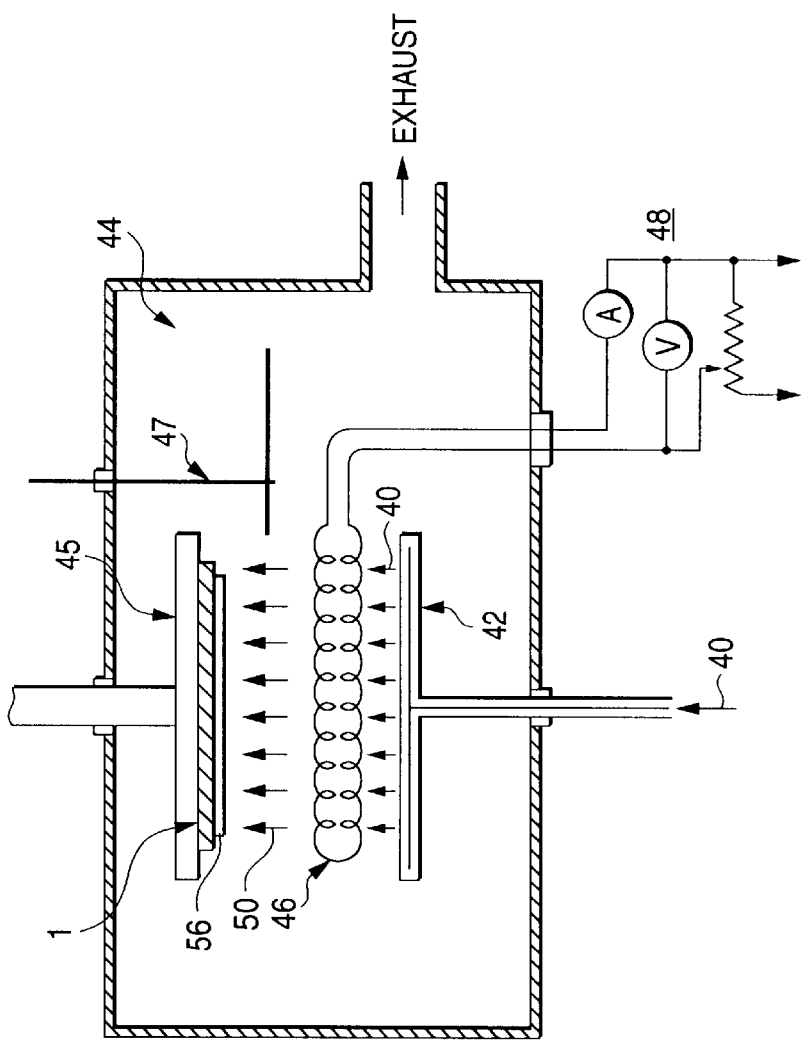
FIG. 2 is a schematic sectional view in the etching with a catalytic etching apparatus according to the same.
Figure 3:
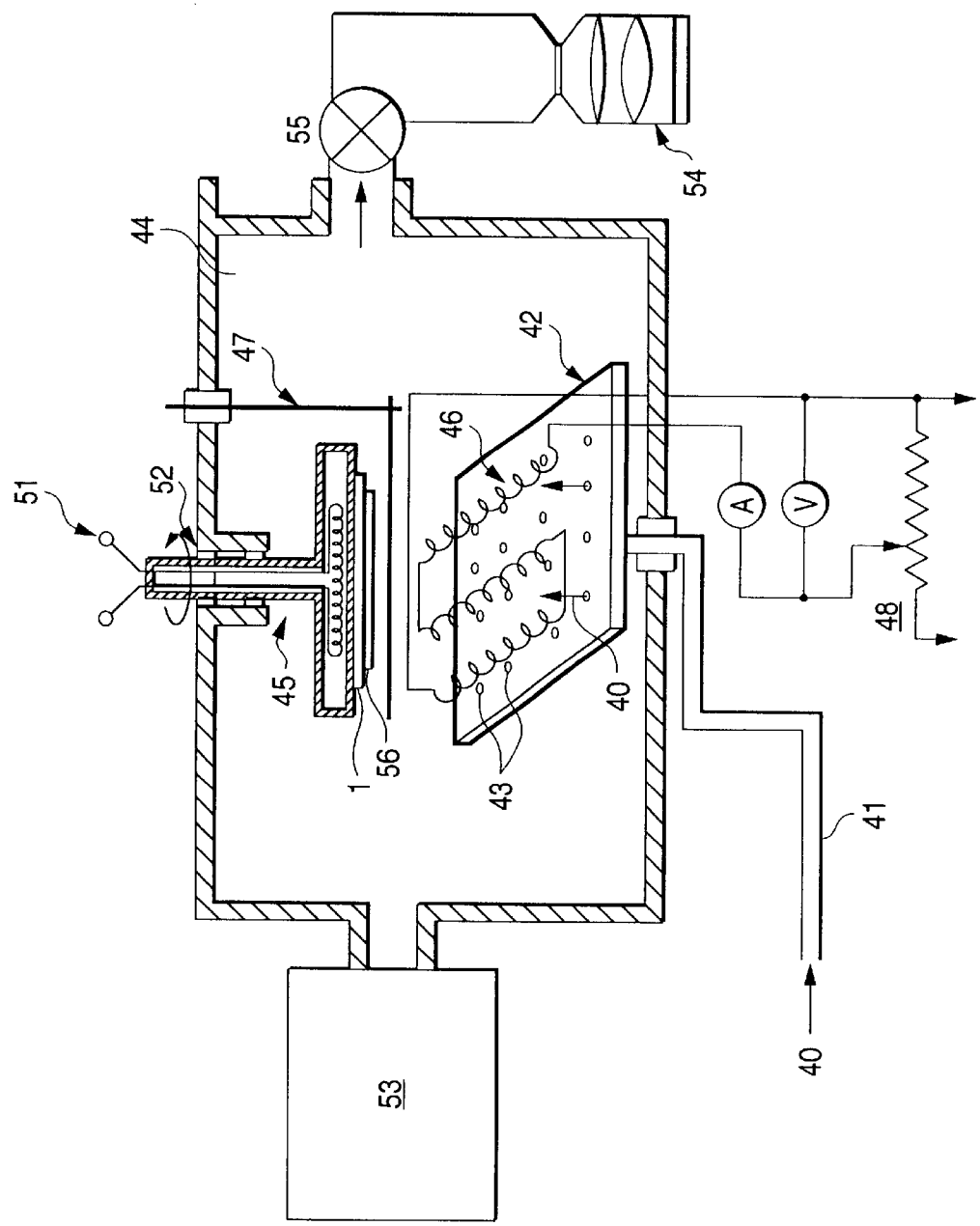
FIG. 3 is a detailed schematic sectional view showing a catalytic etching apparatus according to the same.

The catalytic etching method is carried out using an apparatus shown in FIGS. 1 to 3.

In this apparatus (catalytic etching apparatus), a reaction gas 40 such as carbon fluoride (for example, $CF_4$) is led to a vapor-phase etching chamber 44 from a feeding conduit 41 through a feeding port 43 of a shower head 42 along with a diluent or carrier gas such as Ar, He, Ne or $N_2$. A suscepter 45 for supporting a substrate 1 of a glass having a thin film 56 of a polycrystalline silicon layer to be etched, the shower head 42 of a good heat resistance (preferably made of a material having a melting point which is the same as, or higher than, that of a catalyst 46), the catalyst 46 of platinum-coated ceramics or tungsten in coiled form and further a switchable shutter 47 are mounted in the chamber 44. A magnetic seal 52 is applied between the suscepter 45 and the etching chamber 44. A front chamber 53 for conducting pretreatment is disposed behind the etching chamber 44, and the etching chamber is evacuated with a molecular turbo-pump 54 via a valve 55.

The substrate 1 is heated, as required, with a heating unit such as a heater wire 51 in the suscepter 45. The catalyst 46 is activated by being heated below the melting point (especially 800 to 2,000° C.; approximately 1,200° C. in case of platinum-coated ceramics, and approximately 1,600 to 1,700° C. in case of ceramics-coated tungsten) as a resistance wire. Both terminals of the catalyst 46 are connected with a DC or AC catalyst power source 48, and the catalyst is heated to a predetermined temperature by passing electricity from this power source.

In conducting this catalytic etching method, the inside of the vapor-phase etching chamber 44 is first evacuated to between $10^{-3}$ and $10^{-1}$ torr, and the substrate is then heated to between approximately 100 and 200° C. In the state shown in FIG. 1, the reaction gas 40 such as $CF_4$ is introduced from the feeding port of the shower head 42, contacted with the catalyst 46 of platinum-coated ceramics heated to between 800 and 2,000° C. (for example, approximately 1,2000° C.), and the shutter 47 is then opened as shown in FIG. 2.

At least a part of the reaction gas 40 is contacted with the catalyst 46 to be catalytically decomposed. Reaction seeds or radicals (namely, reaction seeds or precursors thereof) of fluorine to which high energy has been imparted by the catalytic decomposition or the thermal decomposition allow the vapor-phase etching of a predetermined film 56 of polycrystalline silicon on the substrate 1 held at between −100° C. and 500° C. for example, room temperature to 100° C. with satisfactory kinetic energy.

Since the satisfactory kinetic energy is thus imparted to the reaction seeds (ions or radicals) with the catalytic activity of the catalyst 46 and its heat energy without generating plasma, with the result that the reaction gas is converted into the reaction seeds at good efficiency, the reaction seeds are led to the substrate at good efficiency and the etching proceeds through the chemical reaction and the collision against the substrate. Consequently, the pattern etching (or ashing) can be conducted with low damage and without ultraviolet damage.

Accordingly, upon covering the defects of the ordinary reactive etching, it is possible to conduct, easily and satisfactorily, for example, selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose.

An etching selection ratio can freely be determined depending on the heating temperature and the type of the catalyst 46, and the type and the conditions of the reaction gas 40. Various fine processings such as isotropic etching, controlling of an angle of inclination on an edge and surface flattening by setting a selection ratio at 1 are enabled.

Moreover, since the reaction seeds (ions or radicals) generated with the catalyst 46 are led to the substrate at good efficiency, the reaction gas is used at high efficiency, and the treatment rate is increased, improving a productivity and reducing costs by reduction of the reaction gas.

Although the substrate temperature is decreased, the kinetic energy of reaction seeds is great, so that etching in a large area is enabled. The decrease in the substrate temperature helps to reduce costs by the improvement in the productivity with the improvement in the throughput and to improve the uniformity of the thickness and the qualities of the film due to the decrease in the non-uniformity of the substrate temperature. Thus, a large-sized, inexpensive insulation substrate (glass substrate or heat-resistant resin substrate) is also available, and costs can also be reduced in this respect too. As the shower head 42 can blow a gas uniformly, non-uniform etching or ashing less occurs.

Naturally, since plasma is not generated in the etching, damage or short-circuiting, ultraviolet damage and cross contamination of metals by plasma do not occur, and a far simple, inexpensive apparatus is realized in comparison with a plasma etching method (reactive etching method).

In this case, operation is conducted under reduced pressure (for example, $10^{-3}$ to $10^{-1}$ torr) or under normal pressure. In the normal pressure operation, a simpler, less costly apparatus can be realized than in the reduced pressure operation. The throughput is great, and the productivity is high, so that costs can be reduced. In the normal pressure operation, it is advisable to adjust exhaustion lest the flows of the reaction gas and the reaction seeds have an adverse effect on the film of the substrate and the exhaust gas stream be contacted with the substrate.

In this etching, the substrate temperature is increased owing to the radiation heat of the catalyst 46. As stated above, a temperature controller, for example, a heater 51 for heating a substrate (or a refrigerant supply unit for cooling a substrate) may be provided as required. The catalyst 46 is coiled (it may take the form of a mesh, a wire or a porous plate). It is advisable that a catalyst has plural stages (for example, 2 to 3 stages) in the gas flow direction to increase the contact area with the gas in view of the improvement in the use efficiency of the reaction gas by the acceleration of the catalytic reaction and the improvement in the treatment rate. In this etching, the substrate 1 is put on the lower surface of the susceptor 45 above the shower head 42. Accordingly, it does not occur that particles generated in the chamber 44 drop down and adhere to the substrate 1 or the film thereon. Thus, yields and qualities can be improved owing to the reduction of dust of course, the substrate 1 may be put on the upper surface of the susceptor 45 below the shower head 42 (at this time, the productivity can be improved).

Figure 4:
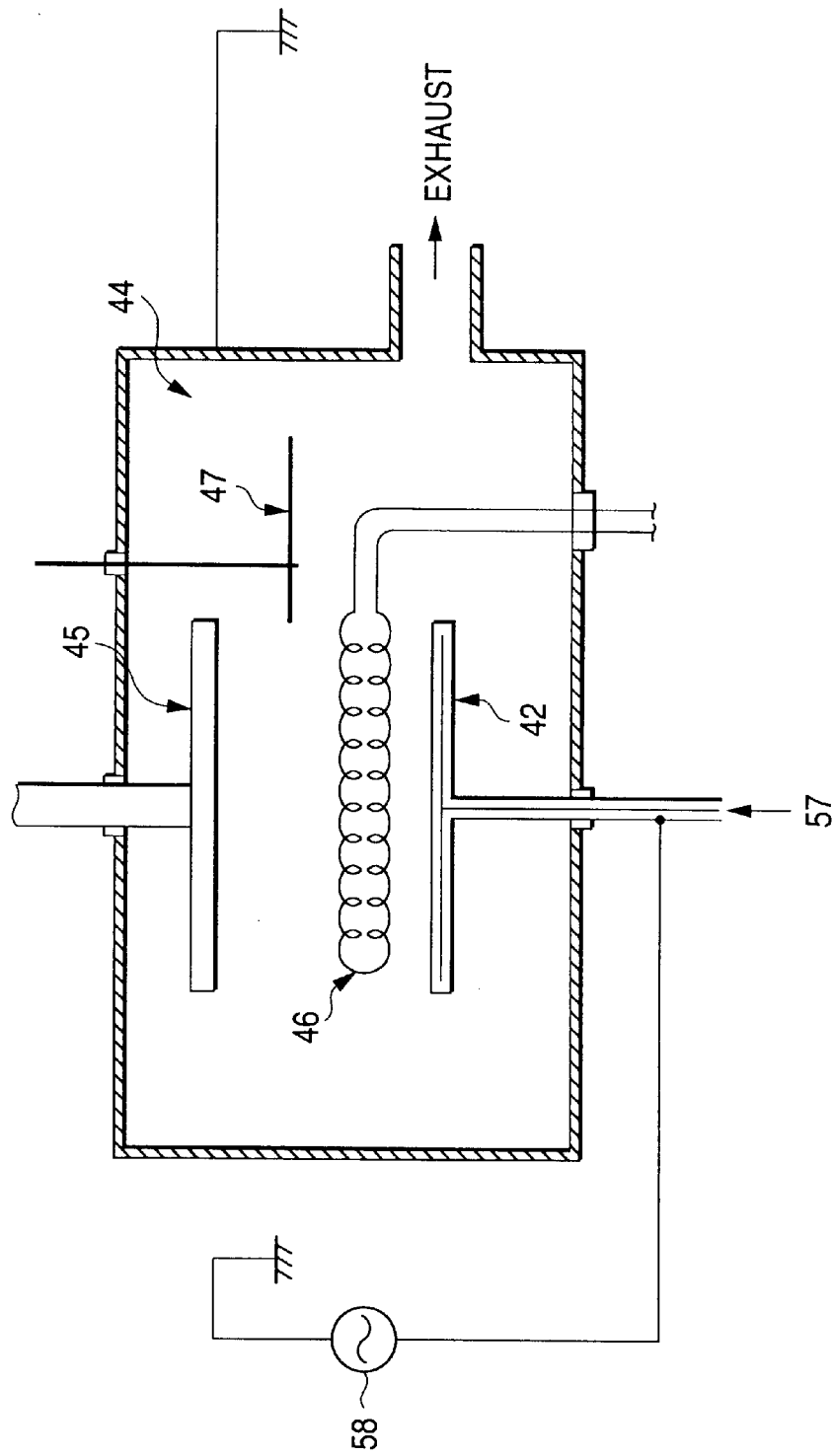
FIG. 4 is a schematic sectional view in the cleaning with a catalytic etching apparatus according to the same.

Further, in this embodiment, after the completion of the catalytic etching, as shown in FIG. 4, the substrate 1 is withdrawn outside the etching chamber 44, and a reaction gas 57 such as $CF_4$, $C_2F_6$ or $NF_6$ is introduced (degree of vacuum $10^{-1}$ to several torr). A radiofrequency voltage 58 (or a DC voltage) is applied between the susceptor 45 of the substrate 1 and the shower head 42, a counter electrode to generate plasma discharge, whereby the inside of the chamber 44 can be cleaned. In this case, a plasma generation voltage is 1 kV or more, for example, between 1.5 and 2.0 kV with 2 to 3 kW.

That is, in the vapor-phase etching, foreign matters adhered to the inner wall surface in the chamber 44 and the constituting members such as the susceptor 45, the shower head 42, the shutter 47 and the catalyst 46 can be removed by etching to reduce dust. Thus, costs can be reduced by improving yields and qualities. Since this can be realized using the vapor-phase processing apparatus as such, there is no need to withdraw the constituting members outside the chamber 44 and clean the same. Consequently, the workability can be improved, and costs be reduced by the improvement in the productivity. The catalyst 46 can be cleaned at the same time (provided a catalyst power source 48 is switched off). However, it may be withdrawn outside the chamber 44 and separately cleaned.

With respect to the thin film 56 to be etched, a predetermined thin film 56 can be formed from a vapor phase by the catalytic CVD method upon feeding the film-forming starting gas instead of the reaction gas 40 in the apparatus shown in FIGS. 1 to 3. That is, as shown in FIG. 2, a starting gas such as a silane gas is introduced from the feeding port of the shower head 42, and contacted with the catalyst 46 such as tungsten which is heated at 800 to 2,000° C. (for example, approximately 1,650° C.). Then, the shutter 47 is opened.

At least a part of the starting gas is contacted with the catalyst 46 to be catalytically decomposed. A group of ions or radicals (namely, deposition seeds or precursors thereof) of silicon having high energy is formed by the catalytic decomposition or the thermal decomposition. The thus-formed deposition seeds (or precursors thereof) of ions or radicals are led to the substrate 1 held at room temperature to 550° C. (for example, 200° C.) with satisfactory kinetic energy, and the predetermined film 57 of polycrystalline silicon is grown thereon in vapor phase.

Thus, the satisfactory kinetic energy is imparted to the reaction seeds (ions or radicals) by the catalytic activity of the catalyst 46 and its heat energy without generating plasma even in the film formation, making it possible to convert the starting gas to the reaction seeds at good efficiency and uniformly deposit the same on the substrate 1 by thermal CVD. The deposition seeds migrate on the substrate 1, and are diffused in the thin film. Thus, a dense, flat and uniform thin film 56 with good step coverage can be formed.

Accordingly, such catalytic DVD can control the film formation depending on the temperature of the substrate, the temperature of the catalyst, the degree of vacuum (flow rate of the starting gas) and the type of the starting gas, and plasma is not generated. Thus, a high-quality film good in density, uniformity and adhesion can be obtained with low stress without damage by plasma.

Figure 5:
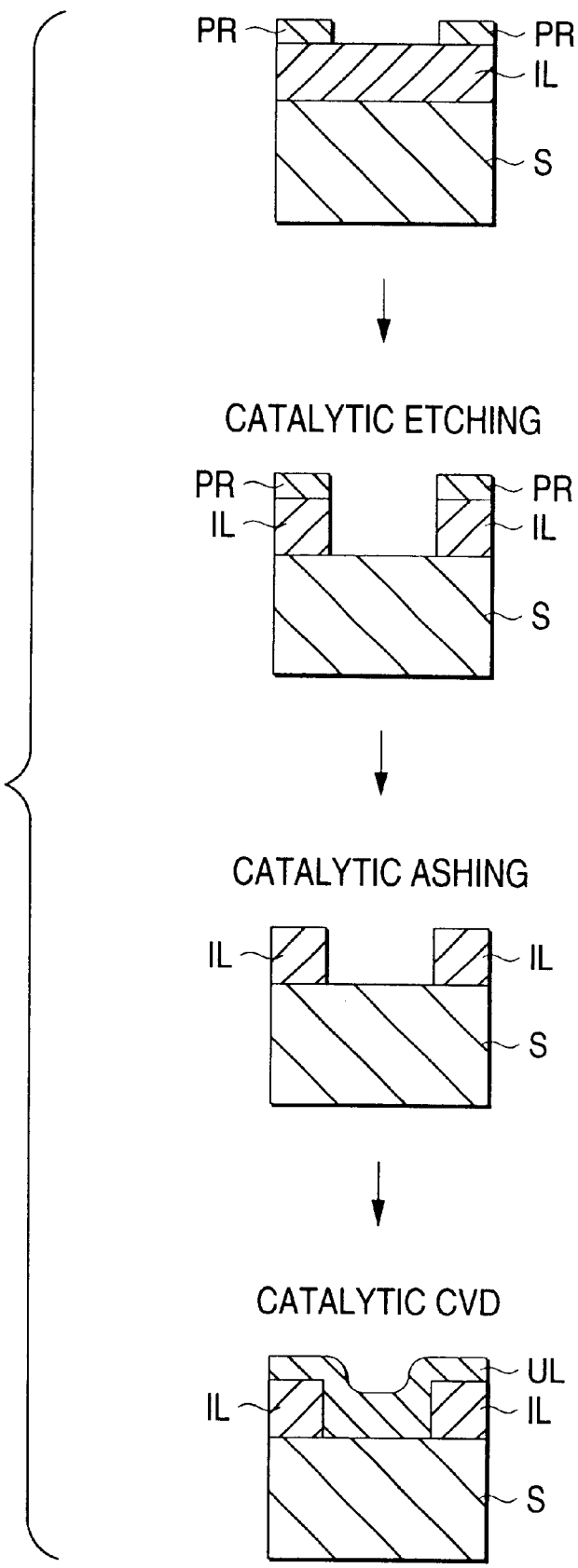
FIG. 5 is a schematic sectional view in a flow chart of conducting catalytic etching, catalytic ashing and catalytic CVD in this order.

To sum up, in this processing, as schematically shown in FIG. 5, a photoresist PR is formed on a film IL such as an insulation film of a substrate S in a predetermined pattern. Then, a part of the film IL is removed by catalytic etching with a reaction gas, and the photoresist film PR is then removed by catalytic ashing with a reaction gas. Further, the gas is replaced with a starting gas for film formation, and a predetermined film UL can be formed on the substrate S by catalytic CVD. In this manner, etching of a thin film, ashing of a photoresist and formation of a CVD film can continuously be conducted with an apparatus having basically the same construction. Thus, it is possible to improve qualities of the film by the decrease in the contamination with impurities and to reduce costs due to the improvement in the productivity with the improvement in the workability.

In this case, in the catalytic etching, a gas obtained by adding a reaction gas to an inert gas such as He, Ne, Ar, $N_2$ or a mixture thereof may be used as a diluent gas or a carrier gas. In the catalytic ashing, a gas obtained by adding an oxidative gas to an inert gas such as He, Ne, Ar, $N_2$ or a mixture thereof may be used as a diluent gas or a carrier gas. The photoresist film has to be completely removed. Further, in the catalytic CVD, a gas obtained by adding each starting gas to an $H_2$ gas-based hydrogen carrier gas such as $H_2$, $H_2+Ar$, $H_2+Ne$, $H_2+He$ or $H_2+Ar+Ne+He$ may be used.

Figure 6:
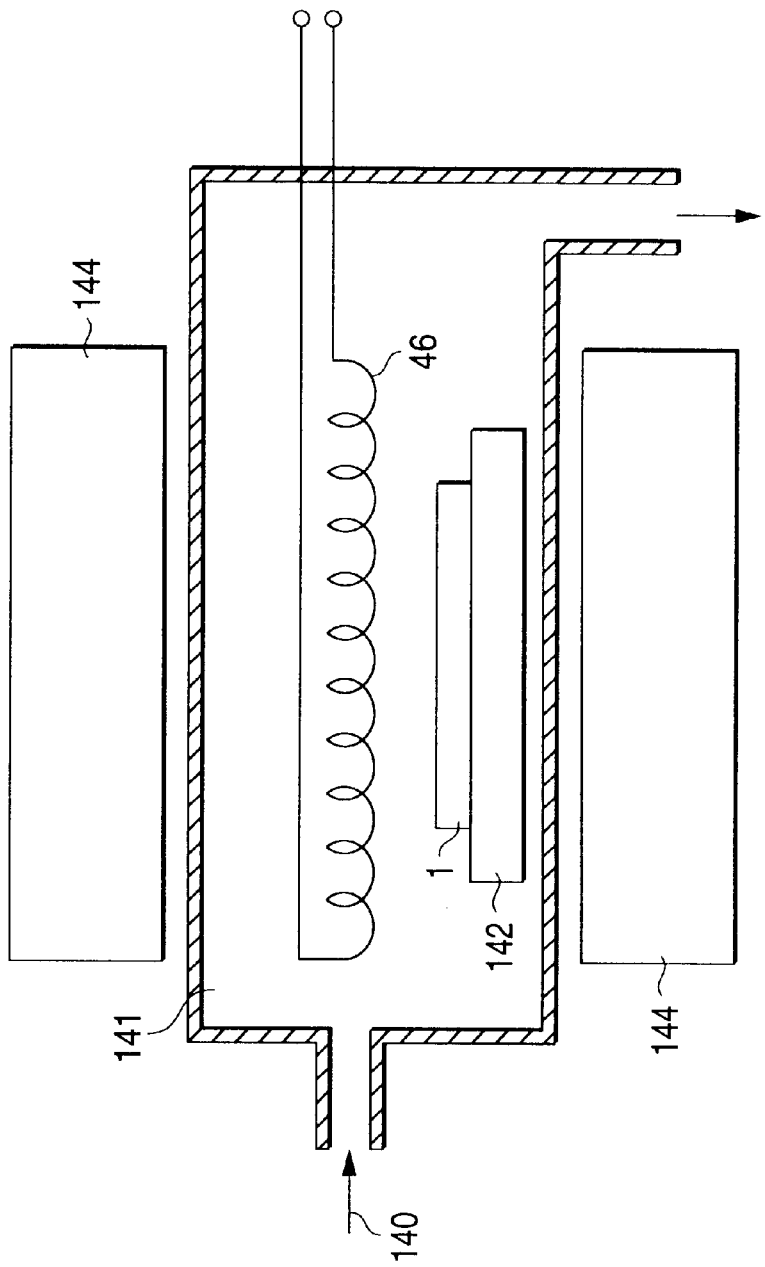
FIG. 6 is a schematic sectional view of another catalytic CVD apparatus according to the same.

The thin film 56 can be formed with an ordinary catalytic CVD apparatus described in Japanese Patent. Laid-Open No. 40314/1988. According to this catalytic CVD apparatus, as shown in FIG. 6, for example, a silicon hydride (for example, monosilane) gas 140 (and a doping gas such as $B_2H_6$ or $PH_3$ as required) is introduced from a feeding conduit to a chamber 141. A suscepter 142 for supporting the substrate 1 and the coiled catalyst 46 disposed opposite the suscepter are mounted in the deposition chamber 141. The substrate 1 is heated with an external heating unit 144 (for example, an electric heating unit). Further, the catalyst 46 is activated by being heated below the melting point (especially 800 to 2,000° C.; approximately 1,700° C. in case of tungsten) as a resistance wire, for example.

In the deposition chamber 141, the atmosphere is changed from nitrogen to a hydrogen gas (approximately 15 to 20 minutes), and the chamber is then heated at approximately 200 to 800° C. The silane gas is contacted with the catalyst 46 to be catalytically decomposed, and deposited on the substrate 1 held at a low temperature (for example, 300° C.). The deposition time is found from a thickness of a polycrystalline silicon layer grown. After the completion of the growth, the temperature is decreased, the hydrogen gas is replaced with nitrogen, and the substrate 1 is then withdrawn. In this manner, the silicon atoms or the group of atoms having high energy is formed by the catalytic reaction or the thermal decomposition with the catalyst 46, and deposited on the insulation substrate 1. Consequently, the polycrystalline silicon layer can be deposited in a far lower temperature region than a temperature capable of deposition in the usual thermal CVD method.

<Production of MOSTFT>

An example of producing MOSTFT using the catalytic etching method in this embodiment is described below.

Figure 7A:
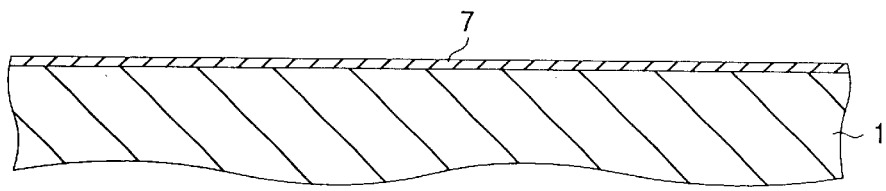
FIG. 7, consisting of FIGS. 7A through 7D, is a sectional view in MOSTFT production process flow using a catalytic etching apparatus according to the same.

An apparatus shown in FIG. 6 or FIGS. 1 to 3 is used. First, as shown in FIG. 7A, a polycrystalline silicon film 7 is grown to a thickness of several $\mu$m to 0.005 $\mu$m (for example, 0.1 $\mu$m) on a main surface of an insulation substrate 1 (distortion point 800 to 1,400° C., thickness 0.1 mm to several mm) of a quarts glass or a crystalline glass by the catalytic CVD method (substrate temperature 200 to 800° C.) described in Japanese Patent Laid-Open No. 40314/1988 or the above-described catalytic CVD method (substrate temperature room temperature to 550° C., for example, 200 to 300° C.; gas pressure $10^{-1}$ to $10^{-3}$ torr, for example $10^{-2}$ torr).

In this instance, the atmosphere in the film-forming chamber is changed from nitrogen to a hydrogen gas (approximately 15 to 20 minutes), the substrate 1 is then heated at approximately 200 to 300° C., and the gas pressure in the film-forming chamber is set at $10^{-6}$ to $10^{-6}$ torr. For example, 100 to 200 sccm (standard cc per minute) of a hydrogen carrier gas and 1 to 20 sccm of monosilane. (and a doping gas such as $B_2H_6$ or $PH_3$ as required) are introduced, and the gas pressure here is set at $10^{-3}$ to $10^{-1}$ torr (for example, $10^{-2}$ torr).

The substrate 1 is heated at room temperature to 550° C. (for example, 200 to 300° C.), and the catalyst 46 is activated by being heated to a temperature below the melting point (especially 800 to 2,000° C., for example, approximately 1,650° C. in case of a tungsten wire) as a resistance wire. The hydrogen carrier gas and the starting gas are contacted with the catalyst 46 of tungsten heated.

At least a part of the hydrogen carrier gas and the starting gas is contacted with the catalyst 46 to be catalytically decomposed, and a group of silicon ions, radicals or hydrogen ions (namely, deposition seeds or precursors thereof) having high energy is formed by the catalytic decomposition or the thermal decomposition. Thereafter, the shutter 47 is opened, and the resulting deposition seeds (or precursors thereof) of ions or radicals are deposited on the polycrystalline silicon film 7 on the substrate 1.

Thus, the polycrystalline silicon film 7 having a thickness of, for example, 0.1 $\mu$m is deposited. The deposition time is found from the thickness of the layer grown. After the completion of the growth, the temperatures of the catalyst and the substrate are decreased, the hydrogen gas is replaced with nitrogen, the pressure is set at atmospheric pressure, and the substrate 1 is withdrawn.

Subsequently, a MOS transistor (TFT) using the polycrystalline silicon layer 7 as a channel region is produced.

Figure 7B:
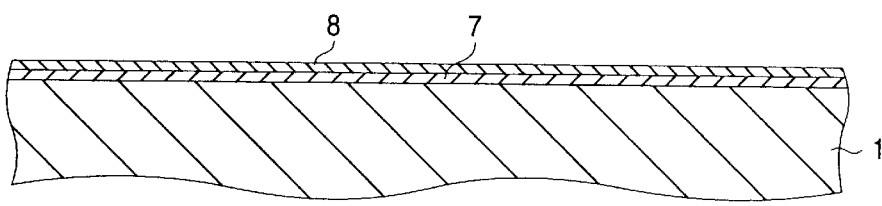

That is, as shown in FIG. 7B, a gate oxide film 8 having a thickness of, for example 350 Å is formed on a surface of a polycrystalline silicon layer 7 by thermal oxidation treatment (950° C.), or the catalytic CVD method while feeding a helium (He)-diluted oxygen gas and a monosilane gas. In the formation of the gate oxide film 8 by the catalytic CVD method, the substrate temperature and the catalyst temperature are the same as mentioned above. It is also possible that the hydrogen carrier gas is 150 sccm, the monosilane gas is 15 sccm and the He-diluted $O_2$ gas is 1 to 2 sccm.

Figure 7C:
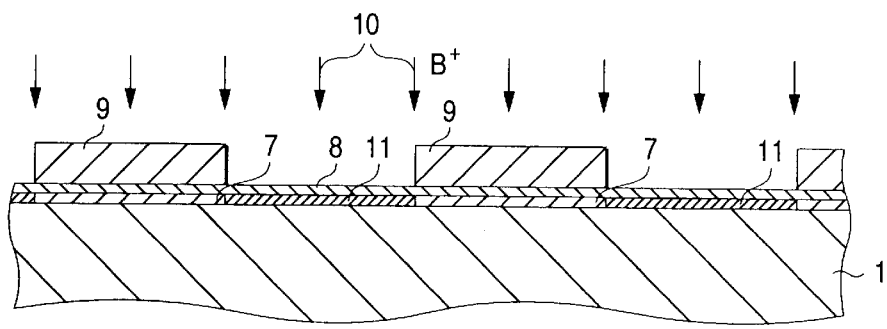

Then, as shown in FIG. 7C, in order to control the concentrations of impurities of a channel region for an N-channel MOS transistor, a P-channel MOS transistor portion is masked with a photoresist 9, and P-type impurity ions (for example, $B^+$) 10 are implanted at, for example, 30 keV and a dose of $2.7 \times 10^{13}$ atoms/cm$^2$ to form a polycrystalline silicon layer 11 in which the conductive type of the polycrystalline silicon film 7 is P-type.

Figure 7D:
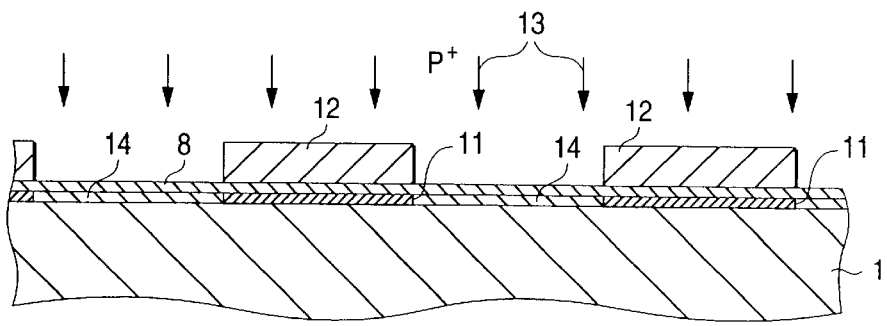

Then, as shown in FIG. 7D, in order to control the concentrations of impurities of the channel region for a P-channel MOS transistor, an N-channel MOS transistor portion is masked with a photoresist 12, and N-type impurity ions (for example, P$^+$) 13 are implanted at, for example, 50 keV and a dose of 1×10$^{13}$ atoms/cm$^2$ to form a polycrystalline silicon layer 14 in which the P-type of the polycrystalline silicon film 7 is compensated.

Figure 8A:
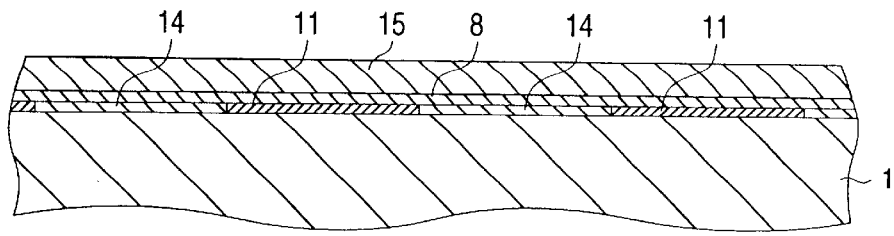
FIG. 8, consisting of FIGS. 8A through 8D, is a sectional view in MOSTFT production process flow using a catalytic etching apparatus according to the same.

Then, as shown in FIG. 8A, a phosphorus-doped polycrystalline silicon film 15 as a gate electrode material is deposited to a thickness of, for example, 4,000 Å by, for example, the same catalytic CVD method (substrate temperature 200 to 300° C.) while feeding 150 sccm of a hydrogen carrier gas, 5 to 10 sccm of PH$_3$ and 15 sccm of a monosilane gas or by the usual vacuum CVD method (substrate temperature 620° C.).

Figure 8B:
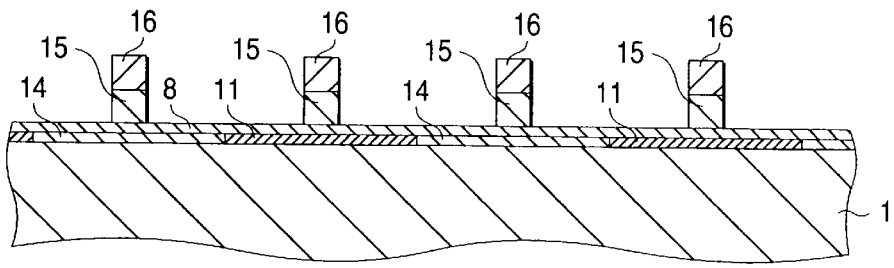

Then, as shown in FIG. 8B, a photoresist 16 is formed in a predetermined pattern using this as a mask, a polycrystalline silicon film 15 is patterned into a gate electrode form by the catalytic etching method (a diluent gas or a carrier gas 150sccm, CF$_4$+He-diluted O$_2$ 5 to 10 sccm, the catalyst temperature 1,200° C. in case of platinum-coated ceramics, the substrate temperature room temperature to 100° C.) shown in FIGS. 1 to 3.

Figure 8C:
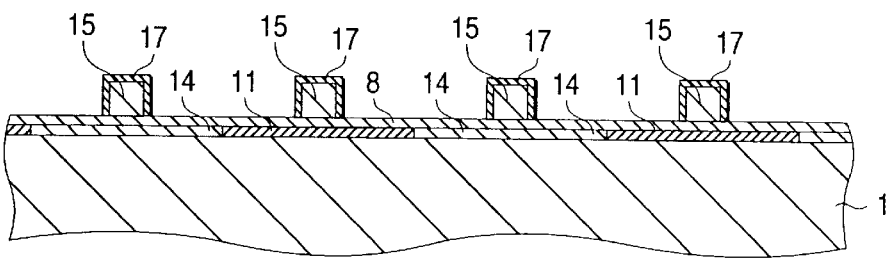

Further, the photoresist 16 is removed by catalytic ashing using 150 sccm of a diluent gas or a carrier gas and 5 to 10 sccm of an oxidative gas (for example, He-diluted O$_2$). Then, as shown in FIG. 8C, an oxide film 17 is formed on a surface of a gate polycrystalline silicon film 15 by oxidation treatment in O$_2$ at, for example, 900° C. for 60 minutes.

Figure 8D:
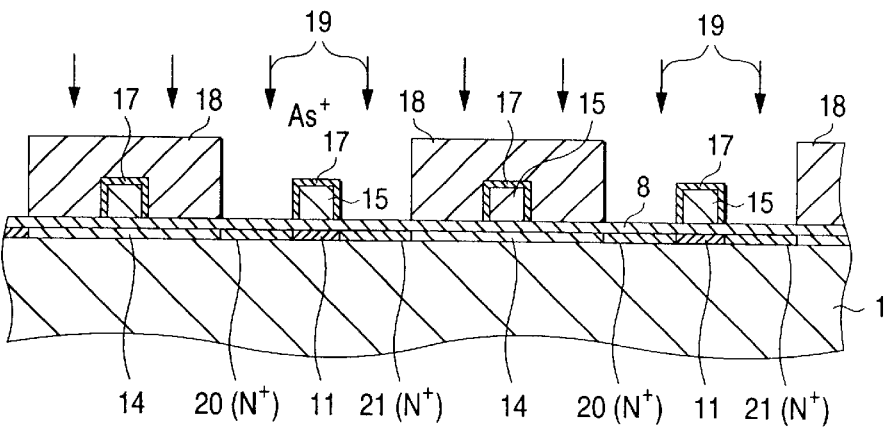

Then, as shown in FIG. 8D, a P-channel MOS transistor portion is masked with a photoresist 18, and As$^+$ ions 19, N-type impurities, are implanted at, for example, 70 keV and a dose of 5×10$^{15}$ atoms/cm$^2$, and annealed in N$_2$ at 950° C. for 40 minutes to form N$^+$-type source region 20 and drain region 21 of a P-channel MOS transistor.

Figure 9A:
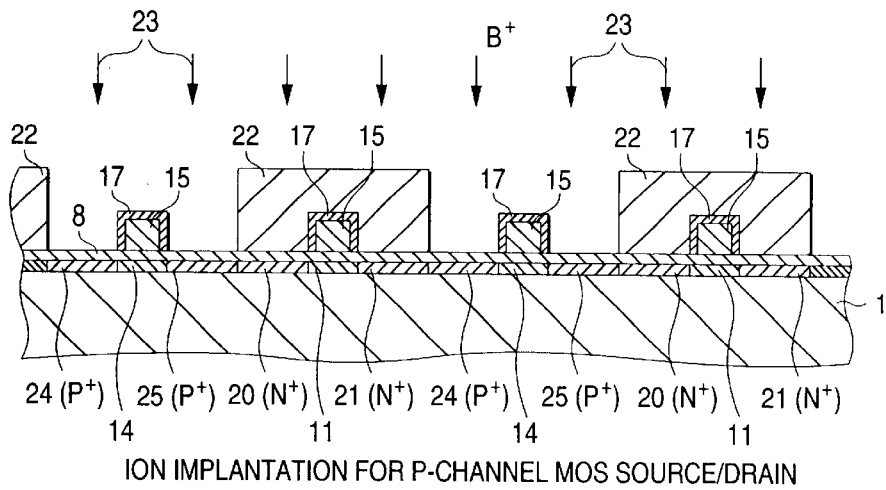
FIG. 9, consisting of FIGS. 9A through 9C, is a sectional view in MOSTFT production process flow using a catalytic etching apparatus according to the same.

Then, as shown in FIG. 9A, an N-channel MOS transistor portion is masked with a photoresist 22, and B$^+$ ions 23, P-type impurities, are implanted at, for example, 30 keV and a dose of 5×10$^{15}$ atoms/cm$^2$ and annealed in N$_2$ at 900° C. for 5 minutes to form P$^+$-type source region 24 and drain region 25 of a P-channel MOS transistor.

Figure 9B:
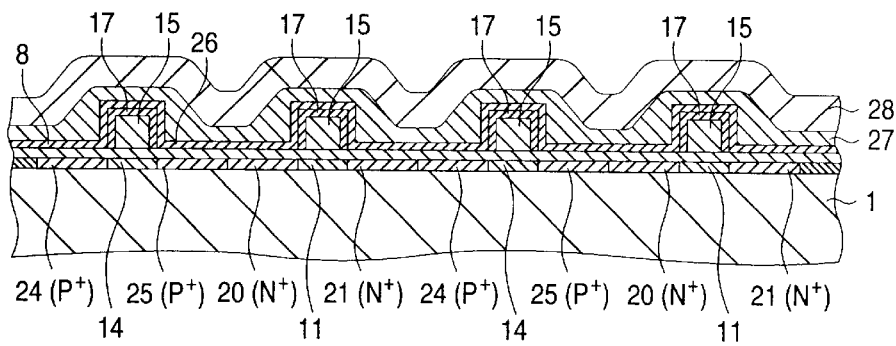

Then, as shown in FIG. 9B, by the usual CVD method or the catalytic CVD method, an SiO$_2$ film 26 is laminated, on the whole surface, to a thickness of 500 Å at, for example, 200 to 300° C. while feeding 150 sccm of a hydrogen carrier gas, 1 to 2 sccm of He-diluted O$_2$ and 15 to 20 sccm of SiH$_4$, and an SiN film 27 to a thickness of 2,000 Å at, for example, 200 to 300° C. while feeding 150 sccm of a hydrogen carrier gas, 50 to 60 sccm of NH$_4$ and 15 to 20 sccm of SiH$_2$. Further, a boron- and phosphorus-doped silicate glass (BPSG) film 28 is formed as a reflow film to a thickness of 6,000 Å at, for example, 200 to 300° C. while feeding 150 sccm of a hydrogen carrier gas, 10 to 20 sccm of He-diluted B$_2$H$_4$, 10 to 20 sccm of He-diluted PH$_3$, 10 to 20 sccm of He-diluted O$_2$ and 15 to 20 sccm of SiH$_4$. This BPSG film 28 reflows in N$_2$ at, for example, 900° C.

Figure 9C:
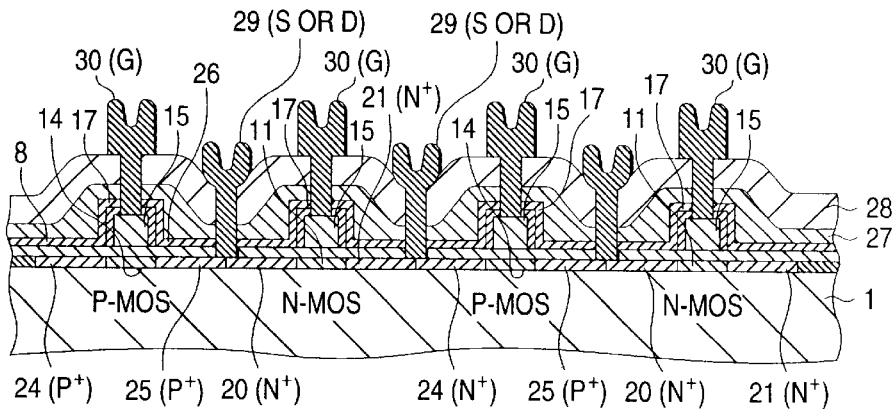

Then, as shown in FIG. 9C, contact holes are formed in a predetermined position of the insulation film by the catalytic etching method under the same conditions (provided the reaction gas based on the diluent gas or the carrier gas is CF$_4$+He-diluted O$_2$), and the photoresist film is likewise removed by the catalytic ashing method. Subsequently, an electrode material such as aluminum is deposited on the whole surface including the contact holes to a thickness of 1 μm at 150° C. by sputtering. This is patterned by the catalytic etching method under the same conditions (provided the reaction gas based on the diluent gas or the carrier gas is CCl$_4$+He-diluted O$_2$), and the photoresist film is likewise removed by the catalytic ashing method. Subsequently, a source or drain electrode 29 (S or D) of each of the P-channel MOSTFT and the N-channel MOSTFT and a gate withdrawal electrode or wire 30 (G) are formed to provide each MOS transistor of a top gate type.

When aluminum is formed by the catalytic CVD, continuous procedures of catalytic etching, catalytic ashing and catalytic CVD in this order can be conducted using the same apparatus.

<Production of LCD>

An example of producing a liquid crystal driving substrate (hereinafter referred to as a TFT substrate) of a liquid crystal display device (LCD) using the catalytic etching method according to this embodiment is described below.

Figure 10A:
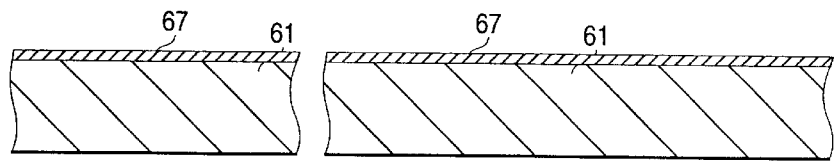
FIG. 10, consisting of FIGS. 10A through 10D, is a sectional view in LCD production process flow using a catalytic etching apparatus according to the same.

Using an apparatus shown in FIG. 6 or FIGS. 1 to 3, a polycrystalline silicon film 67 is grown to a thickness of several μm to 0.005 μm (for example 0.1 μm) on a main surface of an insulation substrate 1 of a quartz glass or a crystallized glass (distortion point approximately 800 to 1,400° C., thickness 0.1 mm to several mm) in an image area or a peripheral circuit portion as shown in FIG. 10A by the catalytic CVD method (substrate temperature room temperature to 550° C., for example, 200 to 300° C., gas pressure 10$^{-1}$ to 10$^{-3}$ torr, for example, 10$^{-2}$ torr)

In this case, the atmosphere in the film-forming chamber is changed from nitrogen to a hydrogen gas (approximately 15 to 20 minutes), and then the degree of vacuum in the film-forming chamber is set at 10$^{-6}$ to 10$^{-8}$ torr. For example, 100 to 200 sccm of a hydrogen carrier gas and 1 to 20 sccm of a monosilane gas (and a doping gas such as B$_2$H$_6$ or PH$_3$ as required) are introduced as described above, and the gas pressure here is 10$^{-3}$ to 10$^{-1}$ torr (for example 10$^{-2}$ torr).

The substrate 1 is, as stated above, heated at room temperature to 550° C. (for example 200 to 300° C.) and the catalyst 46 is activated by being heated below the melting point (especially 800 to 2,000° C.; for example, 1,700 to 1,800° C. in case of a tungsten wire) as a resistance wire. The starting gas is then contacted with the catalyst 46 such as tungsten heated.

At least a part of the starting gas is contacted with the catalyst 46 to be catalytically decomposed. A group of silicon ions, radicals or hydrogen ions (namely, deposition seeds or precursors thereof) having high energy are formed by the catalytic decomposition or the thermal decomposition, and a polycrystalline silicon film 67 is grown on the substrate 1 in vapor phase.

Thus, the polycrystalline silicon film 67 having a thickness of, for example, 0.1 μm is deposited. The deposition time is found from a thickness of a layer grown. Further, after the completion of the growth, the temperatures of the catalyst and the substrate are decreased, hydrogen is replaced with nitrogen, the pressure is set at atmospheric pressure, and the substrate 1 is withdrawn.

Figure 10B:
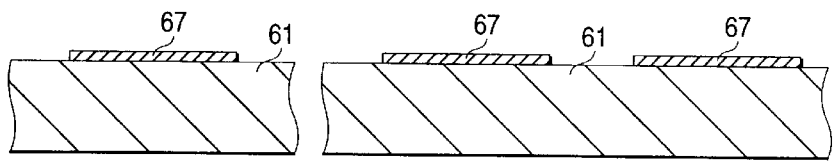

Then, as shown in FIG. 10B, the polycrystalline silicon film 67 is patterned using a photoresist mask to form each transistor active layer.

Figure 10C:
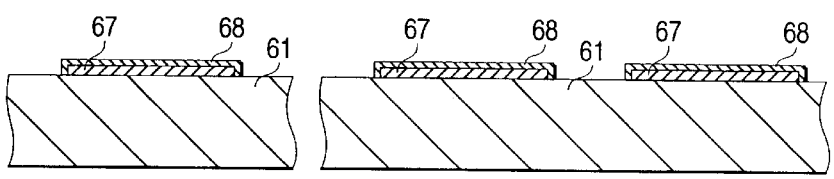

Then, as shown in FIG. 10C, a gate oxide film 68 having a thickness of, for example, 350 Å is formed on the surface of the polycrystalline silicon film 67 by thermal oxidation (950° C.) or the same catalytic CVD while feeding an He-diluted oxygen gas and a monosilane gas. When the gate oxide film 68 is formed by the catalytic CVD method, the substrate temperature and the catalyst temperature are the same as mentioned above, but 150 sccm of a hydrogen carrier gas, 15 sccm of a monosilane gas and 1 to 2 sccm of an He-diluted O$_2$ gas may be used.

Figure 10D:
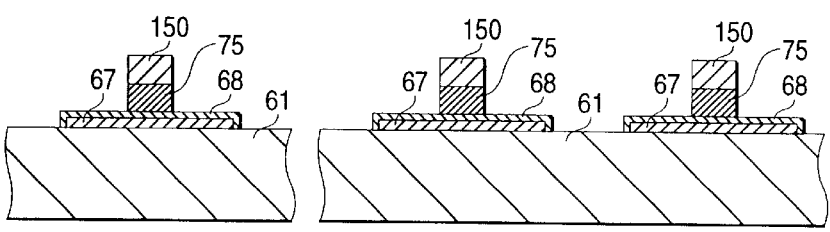

Then, in order to control concentrations of impurities in a channel region of a transistor active layer 67, predetermined impurity ions such as $B^+$ or $P^+$ are implanted. Thereafter, as shown in FIG. 10D, for example, aluminum is deposited to a thickness of, for example, 4,000 Å as a gate electrode material by sputtering. Or the polycrystalline silicon film is deposited to a thickness of, for example, 4,000 Å by the catalytic CVD method (substrate temperature 200 to 300° C.) while feeding 15 to 20 sccm of a monosilane gas based on, for example, a hydrogen carrier gas. Subsequently, a high-density, low-resistance polycrystalline silicon film is formed by phosphorus diffusion. Using a photoresist mask 150, a gate electrode material layer is patterned in the form of a gate electrode 75 by the catalytic etching method under the same conditions. After the removal of the photoresist mask by the catalytic ashing method, an oxide film may be formed on the surface of the gate polycrystalline silicon film 75 in $O_2$ at, for example, 900° C. for 60 minutes by the oxidation treatment.

Figure 11A:
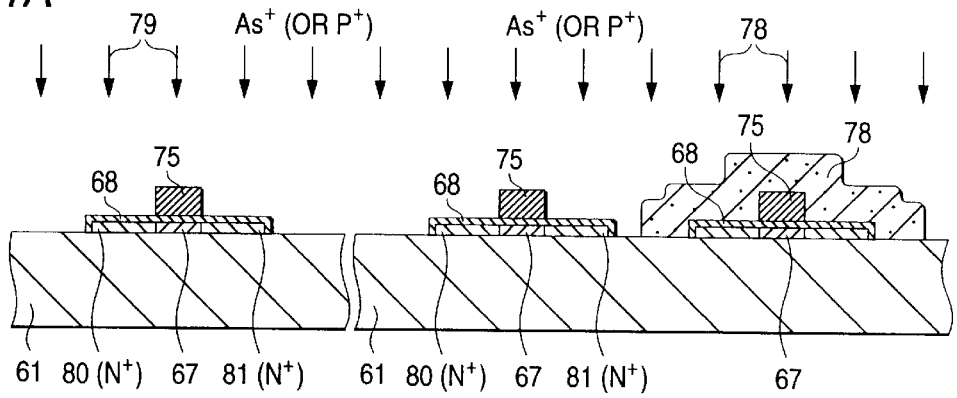
FIG. 11, consisting of FIGS. 11A through 11C, is a sectional view in LCD production process flow using a catalytic etching apparatus according to the same.

Then, as shown in FIG. 11A, a P-channel MOS transistor portion is masked with a photoresist 78. For example, $As^+$ (or $P^+$) ions 79, N-type impurities, are implanted at, for example, 70 keV and a dose of $1\times10^{15}$ atoms/cm$^2$, and the photoresist film is removed by the catalytic ashing method. $N^+$-type source region 80 and drain region 81 of the N-channel MOS transistor are formed by annealing in $N_2$ at 950° C. for 40 minutes.

Figure 11B:
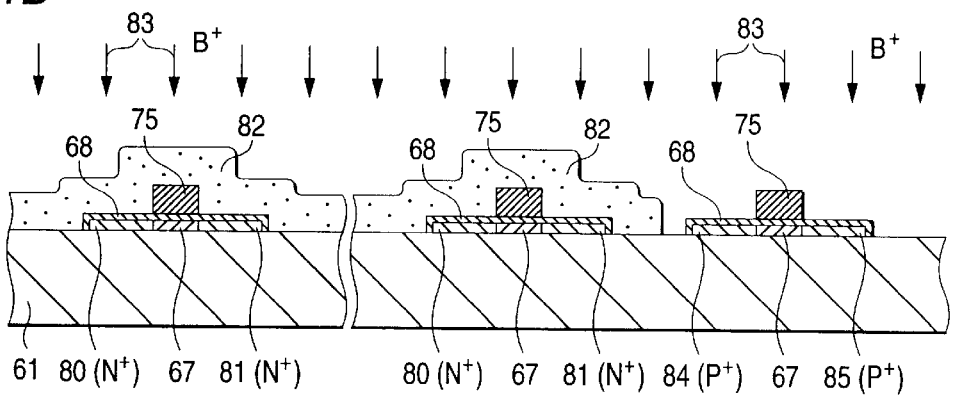

Then, as shown in FIG. 11B, the N-channel MOS transistor portion is masked with a photoresist 82. For example, $B^+$ ions 83, P-type impurities, are implanted at, for example, 30 keV and a dose of $1\times10^{15}$ atoms/cm$_2$, and the photoresist film is removed by the catalytic ashing method. $P^+$-type source region 84 and drain region 85 of the P-channel MOS transistor are formed by annealing in $N_2$ at 900° C. for 5 minutes.

The photoresists 78, 82 shown in FIGS. 11A and 11B are removed by being dissolved. For conducting this removal satisfactorily, a reaction gas for ashing (for example, $O_2$, $CF_4$ or $C_2F_6$) is fed to the catalytic etching apparatus, and the substrate temperature is set at approximately 200° C., and the catalyst temperature at approximately 1,700° C. Insoluble matters on the photoresist surfaces are removed by ashing with the resulting reaction seeds such as radicals. Thereafter, the photoresists are treated with a solvent to completely dissolve and remove the same. Such ashing may be likewise conducted in the production of MOSTFT shown in FIGS. 7 to 9. In some type of the reaction gas and some conditions of the photoresists, the photoresists can completely be removed by the ashing removal only. Thus, the subsequent solvent treatment is unnecessary.

Figure 11C:
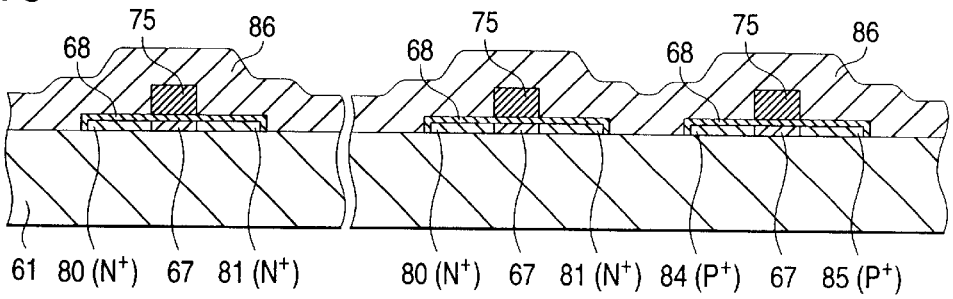

Then, as shown in FIG. 11C, by the same catalytic CVD method, an $SiO_2$ film is laminated, on the whole surface, to a thickness of 500 Å at, for example, 200 to 300° C. while feeding 150 sccm of a hydrogen carrier gas, 1 to 2 sccm of He-diluted $O_2$ and 15 to 20 sccm of $SiH_4$, and an SiN film to a thickness of 2,000 Å at, for example, 200 to 300° C. while feeding 150 sccm of a hydrogen carrier gas, 50 to 60 sccm of $NH_3$ and 15 to 20 sccm of $SiH_4$. Further, a boron- and phosphorus-doped silicate glass (BPSG) film is formed as a reflow film to a thickness of 6,000 Å at, for example, 200 to 300° C. while feeding 150 sccm of a hydrogen carrier gas, 10 to 20 sccm of He-diluted $B_2H_6$, 10 to 20 sccm of He-diluted $PH_3$, 10 to 20 sccm of He-diluted $O_2$ and 15 to 20 sccm of $SiH_4$. This BPSG film reflows in $N_2$ at, for example, 900° C. An interlayer insulation film 86 is formed by the lamination of these insulation films. Such an interlayer insulation film may be formed by the usual method different from this method.

Figure 12A:
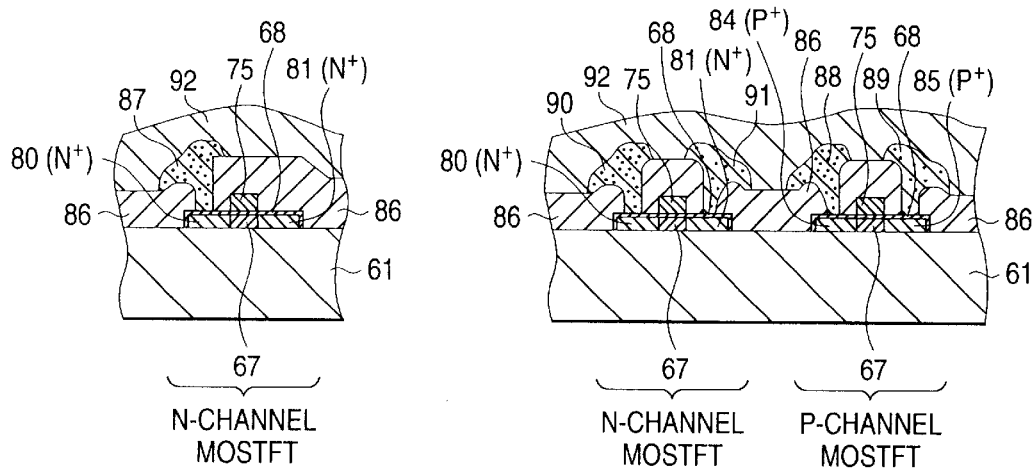
FIG. 12, consisting of FIGS. 12A through 12C, is a sectional view in LCD production process flow using a catalytic etching apparatus according to the same.

Then, as shown in FIG. 12A, contact holes are formed in a predetermined position of the insulation film 86 by the catalytic etching method under the same conditions, and the photoresist films are likewise removed by the catalytic ashing method. An electrode material such as aluminum is deposited on the whole surface including the contact holes to a thickness of 1 μm at 150° C. by sputtering. This is patterned by the catalytic etching method, and the photoresist films are likewise removed by the catalytic ashing method to form a source electrode 87 of N-channel MOSTFT on an image area, source electrodes 88, 90 and drain electrodes 89, 91 of P-channel MOSTFT and the N-channel MOSTFT on the peripheral circuit portion.

When aluminum is formed by the catalytic CVD, continuous procedures of catalytic etching, catalytic ashing and catalytic CVD in this order can be conducted using the same apparatus.

Figure 12B:
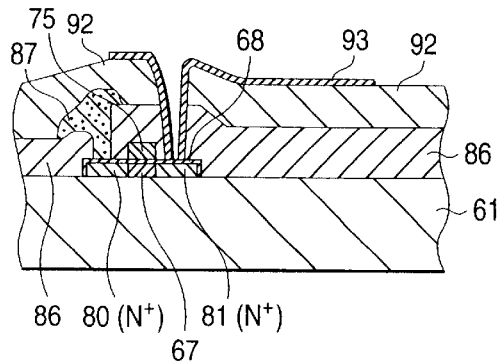

Then, after an interlayer insulation film 92 of $SiO_2$ is formed on the surface by the CVD or the catalytic CVD method, contact holes are formed in the interlayer insulation films 92, 86 in the image area as shown in FIG. 12B. For example, ITO (indium tin oxide: transparent electrode material obtained by doping indium oxide with tin) is deposited on the whole surface by a vacuum deposition method, and patterned to form a transparent image electrode 93 connected with a drain region 81 (in this case, the formation of contact holes and the removal of the photoresist film may be conducted by the catalytic etching and ashing). In this manner, a TFT substrate of transmission-type LCD can be produced. This process can also be applied to the production of a TFT substrate of reflection-type LCD.

Second Embodiment

Figure 13:
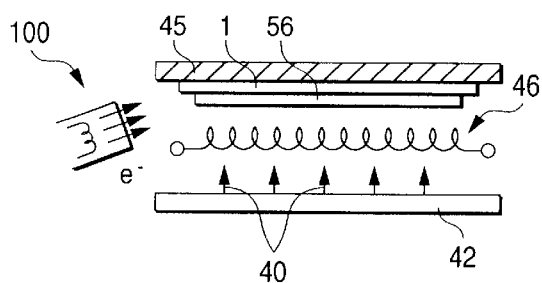
FIG. 13 is a schematic sectional view of a main part of a catalytic etching apparatus according to the second embodiment.

The second embodiment of the invention is described by referring to FIG. 13.

This embodiment features that in the catalytic etching method and the apparatus therefor in the first embodiment, as shown in FIG. 13, a charged particle or ion (for example, electron) shower 100 is mounted in the vicinity of a substrate 1 or a susceptor 45. Accordingly, the following excellent functional effects are obtained in addition to the functional effects given by the first embodiment.

That is, reaction seeds such as ions or precursors thereof are generated in a reaction gas by the catalytic activity of a catalyst 46 in or during the etching of the polycrystalline silicon film, whereby the charge of the substrate 1 is increased and non-uniform etching sometimes occurs. For example, electrons are applied to the ions from the electron shower 100 to neutralize the charge of the substrate 1, so that the increase in the charge can be prevented sufficiently. Especially, when the substrate 1 is formed of an insulation material, charges tend to be accumulated. Thus, the use of the electron shower 100 is effective.

Third Embodiment

The third embodiment of the invention is described by referring to FIG. 14.

Figure 14A:
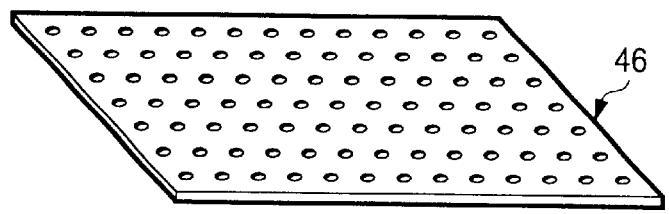
FIG. 14, consisting of FIGS. 14A through 14B, is a schematic perspective view of a catalyst used in a catalytic etching apparatus according to the third embodiment of the invention.
Figure 14B:
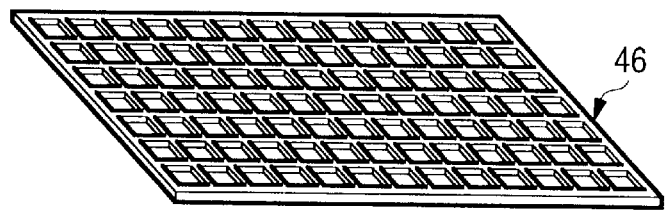

In this embodiment, the catalyst 46 takes the form of a porous plate shown in FIG. 14A or of a mesh shown in FIG. 14B whereby the catalytic activity is exhibited at good efficiency without disturbing the gas stream.

Fourth Embodiment

Figure 15:
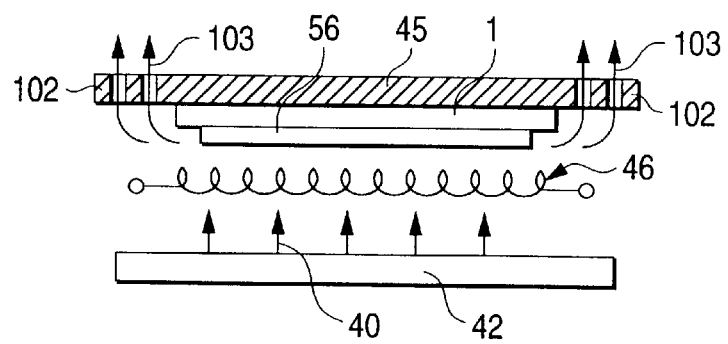
FIG. 15 is a schematic perspective view of a main part of a catalytic etching apparatus according to the fourth embodiment of the invention.

The fourth embodiment of the invention is described by referring to FIG. 15.

In this embodiment, when the catalytic etching apparatus of the first embodiment is operated under normal pressure, air holes 102 are formed in, for example, a susceptor 45, and exhaust gases 103 are led upward from the surrounding area of the substrate 1 and flow to an exhaust port (not shown). This is for preventing the contact between the gas stream and the film on the substrate 1.

Accordingly, even when the operation is conducted under normal pressure, the film on the substrate 1 or the substrate is not stained. Further, because of the normal pressure-type, the construction of the apparatus is simple, and the throughput is also improved.

Fifth Embodiment

The fifth embodiment of the invention is described by referring to FIGS. 16 to 19.

Figure 16:
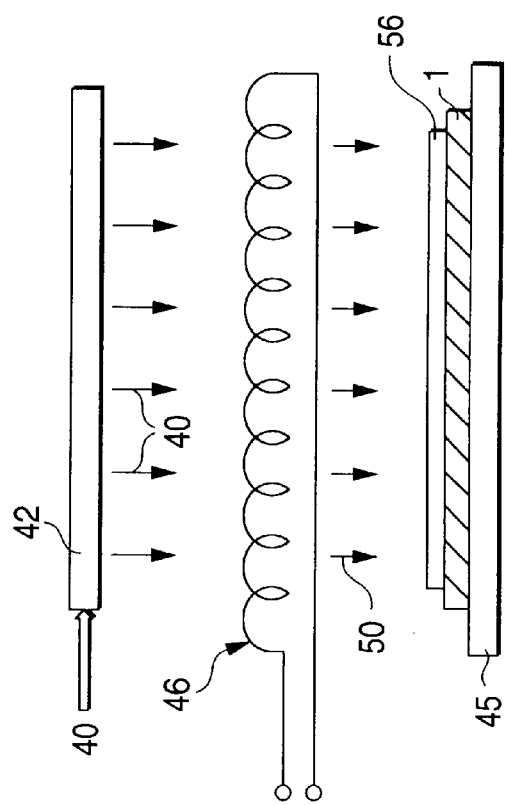
FIG. 16 is a schematic sectional view of a main part of a catalytic etching apparatus according to the fifth embodiment of the invention.

In the foregoing embodiments, the substrate 1 is located above the shower head 42. In this embodiment, as shown in FIG. 16, the substrate 1 is located below the shower head 42. In this respect alone, this embodiment is different from the foregoing embodiments, and the other construction and the operation method are the same., Accordingly, the same functional effects as in the first embodiment can be basically provided.

Figure 17:
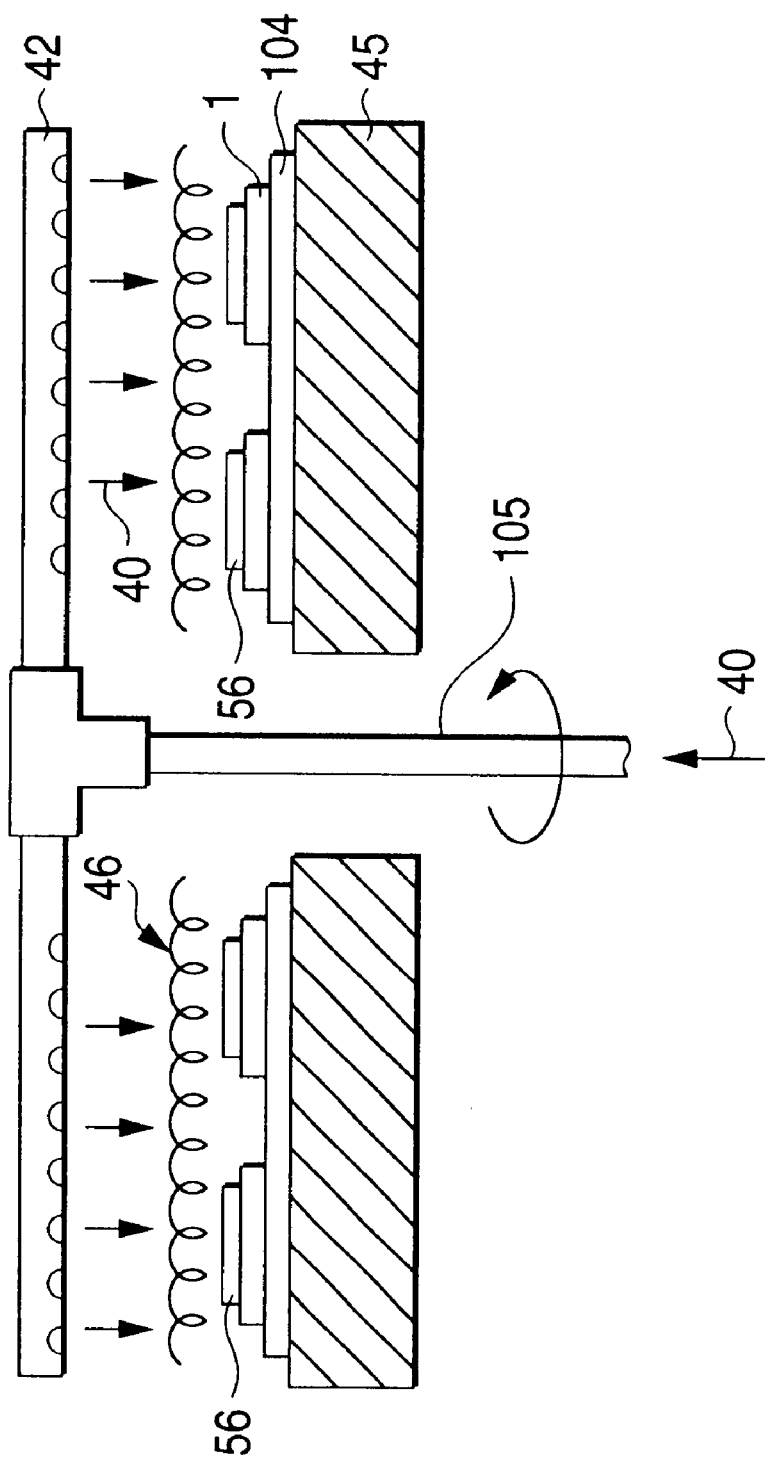
FIG. 17 is a schematic sectional view of another catalytic etching apparatus according to the same.

As a specific construction example, the normal pressure type is mentioned. First, as shown in FIG. 17, plural substrates 1 are mounted on a susceptor 45 fitted with a rotary heater through a rotary base 104. A reaction gas 40 is fed from a rotary shower head 42 having a conduit/rotary shaft 105 to a center hole of the susceptor to lead reaction seeds by a catalyst 46 to the substrates 1 and etch the films thereon. An exhaust gas is led downward from the surrounding portion of the susceptor 45.

In this example, since the reaction seeds are led to the plural substrates 1 for etching while rotating the plural substrates 1 and the shower head 42, the productivity is good, and the gas distribution is uniform, improving the uniformity of the etching.

Figure 18:
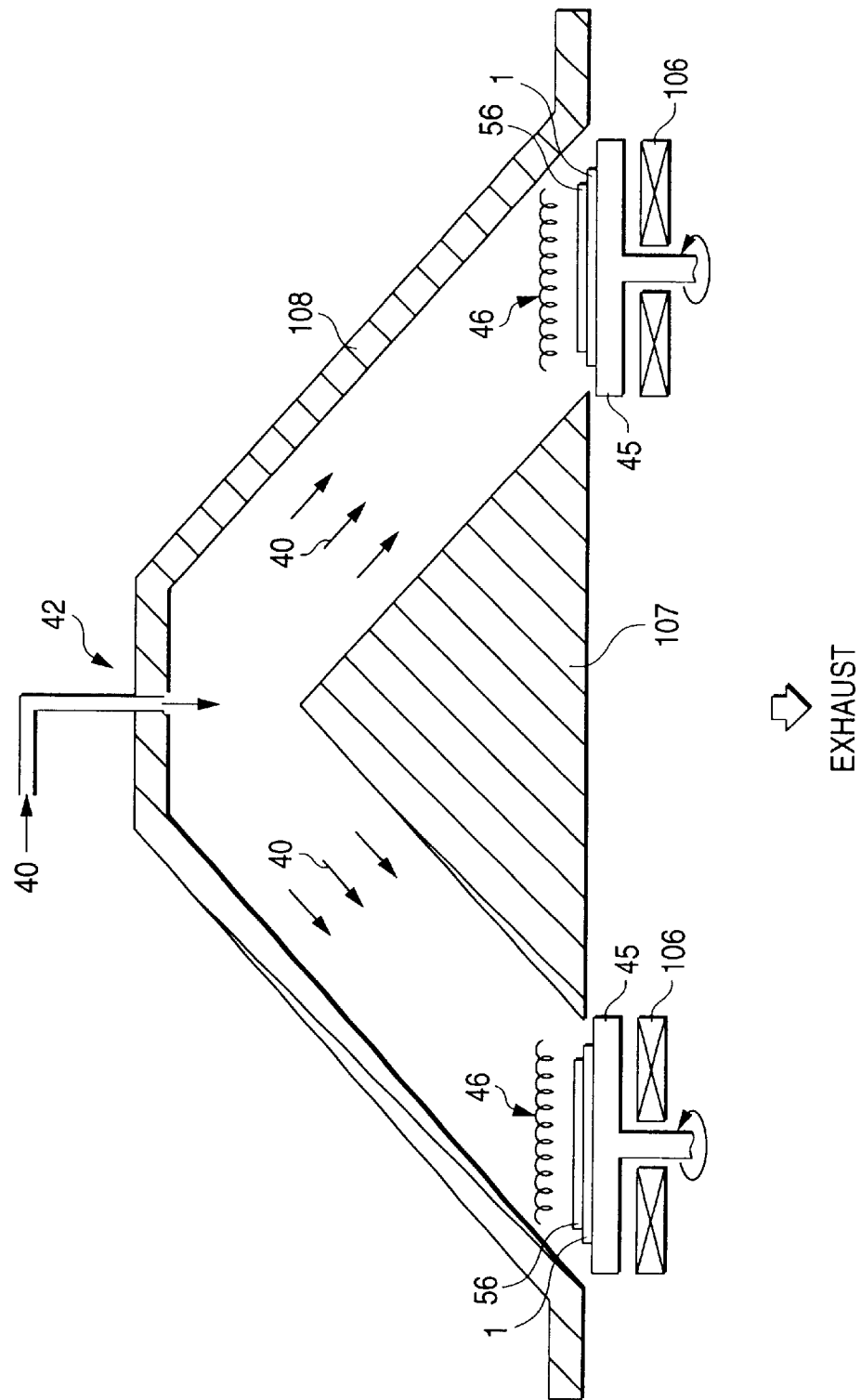
FIG. 18 is a schematic sectional view of the other catalytic etching apparatus according to the same.

Further, in an example shown in FIG. 18, there is a rotating type in which susceptors 45 fitted with rotary heaters 106 are rotated around a conical buffer 107. A substrate 1 is fixed on each of the susceptors 45, a reaction gas 40 is fed from a shower head 42 on a conical bell jar 108, and the film on the substrate 1 is etched with reaction seeds by a catalyst 46.

In this example, while the plural substrates 1 are rotated in the conical bell jar, the reaction seeds are accelerated toward the substrate 1 to form the film. Accordingly, the productivity is good, and the gas distribution is uniform, more improving the uniformity of the etching.

Figure 19:
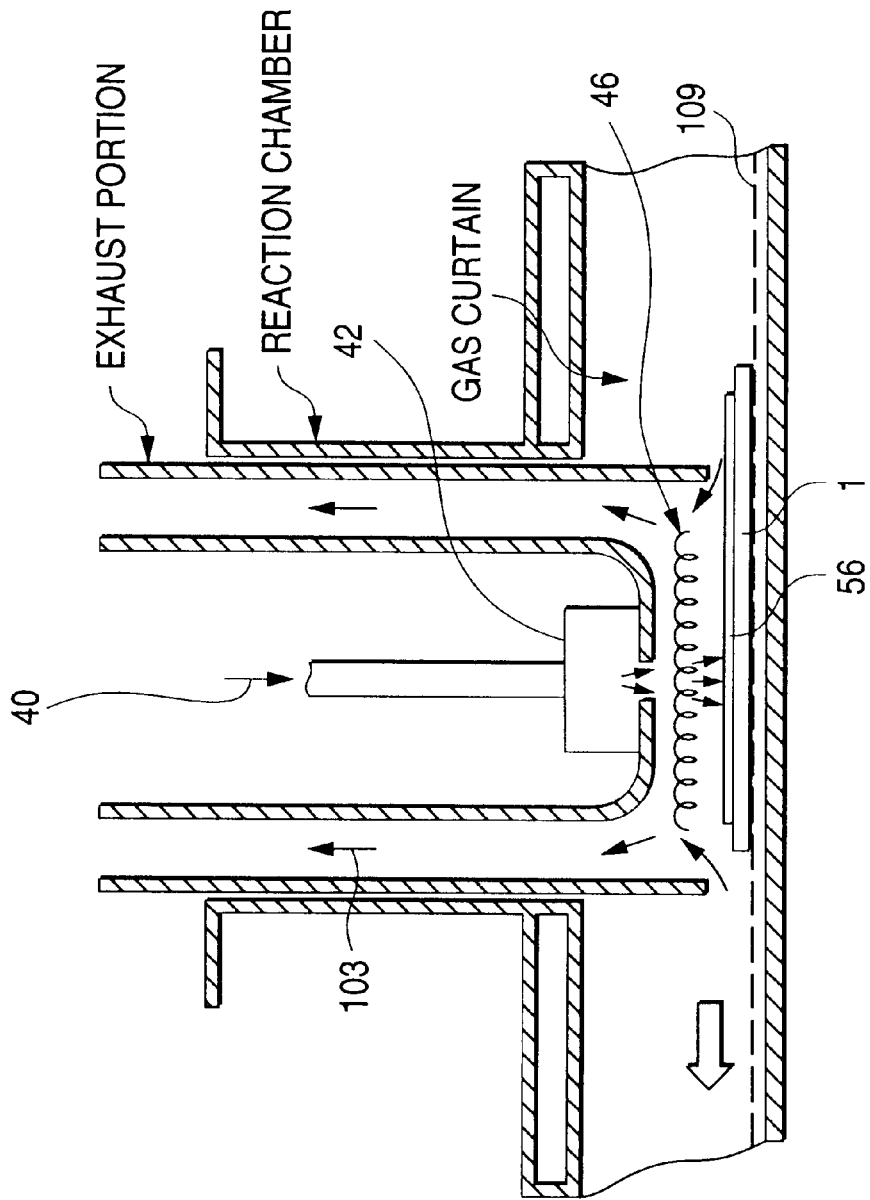
FIG. 19 is a schematic sectional view of the other catalytic etching apparatus according to the same.

FIG. 19 shows an example of another continuous normal pressure etching apparatus. A substrate 1 is mounted on a conveyor belt 109. A reaction gas 40 is fed from a shower head 42, and a film on a substrate 1 is etched with reaction seeds by a catalyst 46. Since an exhaust gas 103 is led above the substrate 1, a problem on the contamination of the film does not occur.

In this example, while the substrate 1 is moved in one direction, the reaction seeds are led to the substrate, and the exhaust gas is discharged upward. Thus, the productivity of the etching is good, and the etching is conducted easily even in the normal pressure type.

Sixth Embodiment

Figure 20:
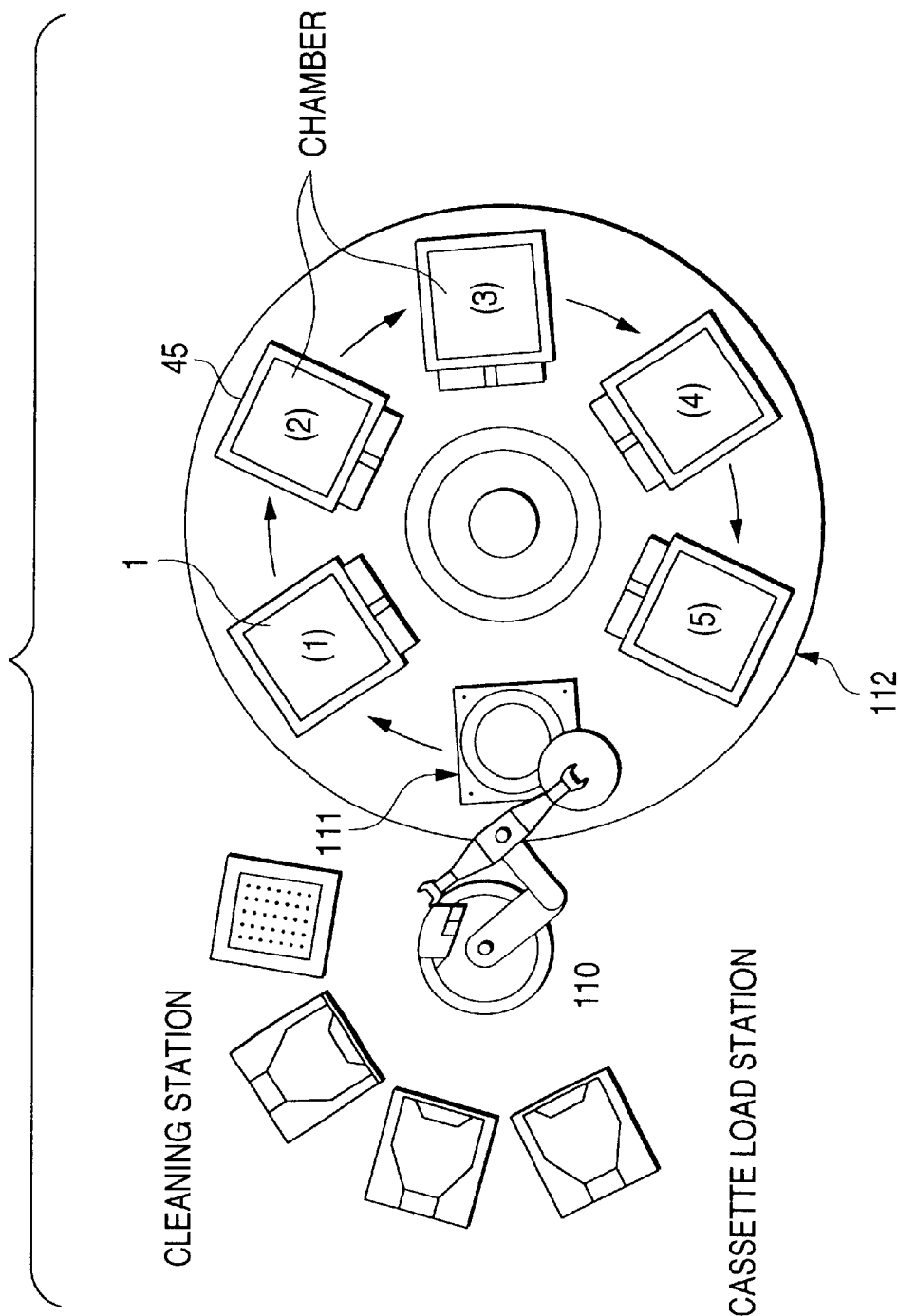
FIG. 20 is a schematic sectional view of a main part of a catalytic etching apparatus according to the sixth embodiment of the invention.

The sixth embodiment of the invention is described by referring to FIG. 20.

In a film-forming apparatus according to this embodiment, the film can be etched in sequence selectively using, for example, five chambers. A substrate 1 is vacuum-adsorbed on a susceptor 45, mounted on a load portion 111 with a robot 110 of a load station where the substrate is sent to chambers in order by a dispersion head 112. During this time, the etching is conducted such that the substrate is facedown as shown in FIG. 1. The catalyst 46 is not shown in the drawing.

This example is advantageous for etching of, a laminated film. Further, since a heat source of the substrate 1 is disposed in an upper portion, a convection effect is reduced.

Still further, since the substrate 1 is facedown, adhesion of particles can be controlled.

Seventh Embodiment

The seventh embodiment of the invention is described by referring to FIG. 21.

In this embodiment, upon varying the reaction gas used, the corresponding thin films are etched or ashed in the foregoing embodiments. At this time, an inert gas such as He, Ne, Ar, $N_2$, or a combination thereof is used as a diluent gas or a carrier gas of the reaction gas.

FIG. 22 shows types of starting gases used in the film formation by the CVD method and the corresponding thin films.

The embodiments of the invention stated above can be modified on the basis of the technical concept of the invention.

For example, the etching, or ashing conditions, the construction of the apparatus, and types of the reaction gas to be used and the material to be processed may be varied.

Further, instead of the electron shower for preventing the increase in the charge, other negatively charged particles can be applied. Or positively charged particles such as protons may be applied depending on the polarity of the increased charge.

The etching or the ashing of the invention may be applied to a substrate itself, such as a glass or a semiconductor, other than a film on a substrate.

An example in which an electric field of less than a glow discharge starting voltage acts on reaction seeds or precursors thereof generated by contacting a reaction gas with a catalyst heated to give kinetic energy is described below.

In the method and the apparatus of the invention, it is advisable that a DC voltage of less than a glow discharge starting voltage (namely, less than a plasma generation voltage determined by the Paschen's law, for example, less than 1 kV, more than tens of volts) is applied as the electric field whereby the reaction seeds or the precursors thereof are directed to the substrate.

When a voltage of less than the glow discharge starting voltage, which is obtained by superposing an AC voltage on a DC voltage or an AC voltage (namely, less than a plasma generation voltage determined by the Paschen's law (by the absolute value in case of an AC voltage), for example, less than 1 kV, more than tens of volts) is applied as the electric field, kinetic energy with subtle change in the electric field can be given to the reaction seeds (ions or radicals) by the AC voltage superposed on the DC voltage or the AC voltage. Consequently, in addition to the foregoing functional effects, the film formed on the substrate surface having a complicated form (raisings and depressions) can finely be processed with an optional selection ratio and an optional angle of inclination.

In this case, the AC voltage may be a radiofrequency voltage and/or a low-frequency voltage. Further, for example, a voltage of less than the glow discharge starting voltage, which is obtained by superposing a radiofrequency voltage and a low-frequency voltage on a DC voltage, or a voltage of less than the glow discharge starting voltage, obtained by superposing a radiofrequency voltage on a low-frequency voltage may be applied. In this instance, it is advisable that the frequency of the radiofrequency voltage is between 1 MHz and 10 GHz, and the frequency of the low-frequency voltage is less than 1 MHz.

In the method and the apparatus therefor of the invention, the catalyst can be mounted between the substrate or the suscepter and the electrode for applying the electric field. In this case, it is advisable to form a gas feeding port for leading out the reaction gas in the electrode.

The catalyst and the electrode for applying the electric field may be mounted between the substrate or the suscepter and the reaction gas feeding unit.

The catalyst or the electrode for applying the electric field may take the form of a coil, a mesh, a wire or a porous plate. Further, plural such catalysts may be mounted along the gas stream. Consequently, while the gas stream is formed effectively, it is possible to increase a contact area between the catalyst and the gas, expedite the catalytic reaction, increase the use efficiency of the reaction gas, enhance the etching rate, improve the productivity and reduce costs.

Ions are generated in the reaction gas due to the catalytic activity of the catalyst either in or during the processing by etching or ashing, with the result that the charge of the substrate is sometimes increased to cause non-uniform processing by etching or ashing. In order to prevent the same, it is preferred to neutralize ions by applying charged particles (electron beams or protons, especially electron beams) to the reaction seeds or the precursors thereof. That is, it is preferred to mount a charged particle application unit in the vicinity of the susceptor.

After the vapor-phase processing by etching, the substrate is withdrawn outside a processing chamber, a voltage is applied between predetermined electrodes (for example, between the susceptor and a counter electrode) to allow plasma discharge, whereby the inside of the processing chamber is cleaned (reaction gas is $CF_4$, $H_2$, $NF_3$ or $C_2F_6$), whereby foreign matters adhered to an inner wall surface or constituting members of a chamber in the vapor-phase processing can be removed by etching. Accordingly, it is possible to decrease dust and reduce costs by improving yields and qualities. This can be realized upon using an apparatus for vapor-phase processing as such. Thus, there is no need to withdraw constituting members outside the chamber and clean the same. Accordingly, the workability is improved, and costs can be reduced by increasing the productivity. The catalyst can also be cleaned at the same time. However, it may be withdrawn outside the chamber and cleaned separately.

In the vapor-phase processing according to the invention, specifically, a substrate held at a temperature of −100° C. to 500° C. or a film on the substrate is etched or ashed in vapor phase using the reaction seeds or the precursors (radicals) thereof generated by heating the catalyst at a temperature of less than its melting point in the range of 800 to 2,000° C. (for example, passing electricity through the catalyst and heating the same by its own resistance heating) and catalytically reacting or thermally decomposing at least a part of the reaction gas with the catalyst heated.

In this instance, when the heating temperature of the catalyst is less than 800° C., the catalytic reaction or the thermal decomposition of the reaction gas is not conducted satisfactorily, and the processing rate of etching tends to decrease. When it exceeds 2,000° C., the constituting material of the catalyst is incorporated to impair electrical properties of the film and decrease the qualities of the film. Moreover, since the heating over the melting point of the catalyst loses the form stability, it is advisable to avoid the same. The heating temperature of the catalyst is less than the melting point of the constituting material, and it is preferably between 1,100 and 1,800° C.

Moreover, the substrate temperature is preferably between −100° C. and 500° C., more preferably between room temperature and 200° C. Consequently, high-quality processing can be conducted efficiently. When the substrate temperature exceeds 500° C., for example, a doping concentration distribution of impurities of an active region in an integrated circuit device tends to be changed by influence of heat.

In the vapor-phase processing method according to the invention, the heat treatment can be conducted at the low temperature without the need of plasma or light excitation. Thus, a glass having a low distortion point of 470 to 670° C. can be used as a substrate, for example, a glass substrate. This is less costly, easily formed into a thin plate, and increased in size (more than 1 m$^2$). Further, a long rolled glass plate can be produced. For example, a long rolled glass plate can be treated continuously or discontinuously by the foregoing method.

The reaction gas used in the vapor-phase processing of the invention may be a halogen gas or its compound gas such as flon or chlorine or an oxidative gas such as oxygen based on an inert diluent gas (carrier gas) such as Ne, Ar or He (for example, $CF_4$+He-diluted $O_2$).

The use of this reaction gas enables etching of semiconductor films such as polycrystalline silicon, monocrystalline silicon, amorphous silicon, microcrystalline silicon, silicon-germanium, silicon carbide, compound semiconductor (gallium-nitride, gallium-arsenic and gallium-phosphorus as examples of elements of Groups III to V and ZnSe, ZnS and CdTe as examples of elements of Groups II to VI), diamond and diamond-like-carbon, etching of conductive oxide films of silicon oxide, impurity-containing silicon oxides such as PSG (phosphorus silicate glass), BSG (borosilicate glass) and BPSG (boro-phosph-silicate glass), indium oxide, palladium oxide, indium tin oxide (ITO) and ruthenium oxide, etching of insulation films of silicon nitride, silicon acid nitride and chromium oxide, etching of metallic films of high-melting metals or conductive metal nitrides such as tungsten, tungsten nitride, titanium, titanium nitride, molybdenum, molybdenum nitride, tantalum and tantalum nitride, aluminum, aluminum alloy (containing 1% Si or 1 to 2% of Cu), silicide, platinum, palladium, ruthenium, indium and copper, etching of high dielectric films of BST and ferroelectric films of PZT, PZLT, SBT and BIT, etching of a carbonanotube, or etching or ashing of an organic film of a photoresist.

The catalyst can be formed with at least one material selected from the group consisting of tungsten, thoria-containing tungsten, molybdenum, platinum, palladium, vanadium, silicon, alumina, metal-coated ceramics, silicon carbide, silicon, silicon nitride, silicon oxide and conductive metal nitrides (tungsten nitride, titanium nitride, molybdenum nitride and tantalum nitride) or at least one material selected from the group consisting of silicon carbide, ceramic and conductive nitride film-coated high-melting metals (tungsten, tantalum, thoria-containing tungsten, molybdenum and titanium). It is preferred that this catalyst is not etched with the reaction gas. In order to prevent degradation of the catalyst with the etching gas and the reactive gas in the catalytic reaction or the thermal decomposition, the catalyst may be formed of an anti-corrosive material such as vanadium, vanadium-coated ceramics, platinum, platinum-coated ceramics, palladium or palladium-coated ceramics.

Preferably, the vapor-phase processing method and the apparatus therefor according to the invention are constructed such that the reaction gas is replaced with a film-forming starting gas and a predetermined film is formed on the substrate by feeding this starting gas (namely a film is formed in vapor phase by the catalytic CVD method). For example, it is possible that the film is selectively removed by bias catalytic etching with the reaction gas using a mask, a photoresist film as the mask is then removed by bias catalytic ashing with an oxidative gas, and a predetermined film is thereafter formed on the substrate by the bias catalytic CVD method upon replacing the gas with the film-forming starting gas (that is, an electric field of less than the glow discharge starting voltage is applied to reaction seeds or precursors thereof generated by contacting the starting gas with the catalyst heated to give kinetic energy, whereby a predetermined film is formed on the substrate). At this time, any of DC, AC/DC, RF/DC and RF/AC/DC may be employed as a bias.

As a result, the film can be formed by CVD upon using the apparatus for conducting the vapor-phase processing and only changing the gas. This leads to the improvement in the workability and the reduction of costs with the improvement in the productivity. That is, since the thin film etching, the photoresist ashing and further the CVD film-forming can continuously be conducted, making it possible to increase qualities of the film owing to less contamination with impurities and to reduce costs owing to the improvement in the productivity with the improvement in the workability.

With respect to the growth of the vapor phase by the catalytic CVD method, specifically, a thin film is deposited by the thermal CVD method on a substrate heated at room temperature to 550° C. under reduced pressure or under normal pressure using, as starting seeds, the deposition seeds or the precursors thereof generated by heating the catalyst at a temperature of less than its melting point in the range of 800 to 2,000° C. (for example, passing electricity through the catalyst and heating the same by its own resistance heating) and catalytically reacting or thermally decomposing at least a part of the starting gas with the catalyst heated.

In this case, since the catalytic activity of the catalyst, its heat energy and further the voltage (especially the DC voltage or the voltage which is obtained by superposing the AC voltage on the DC voltage and which is less than the glow discharge starting voltage, namely, less the plasma generation voltage according to the Paschen's law, for example, less than 1 kV, more than tens of volts) are applied to the deposition seeds or the precursors thereof, kinetic energy is increased to lead them to the substrate at good efficiency and satisfactorily conduct the migration on the substrate and the diffusion in the film being formed. Accordingly, since the kinetic energy of the deposition seeds (reaction seeds such as ions or radicals) generated with the catalyst can independently be controlled in the electric field, it enables, in comparison with the ordinary catalytic CVD method, improvement in adhesion between the film formed and the substrate, improvement in density of the film formed, improvement in uniformity or smoothness of the film formed, improvement in embedding property into via holes and step coverage, further decrease in the substrate temperature and-stress control of the film formed. Thus, a high-quality film (for example, a silicon film or a metallic film having properties close to bulk properties) can be realized. Besides, since generation of plasma does not occur, a film formed with low stress is obtained without damage by plasma.

In this case, when the heating temperature of the catalyst is less than 800° C., the catalytic reaction or the thermal decomposition of the starting gas is insufficient, and the deposition rate tends to decrease. When it exceeds 2,000° C., the constituting material of the catalyst is incorporated into the deposition film to impair the electrical properties of the film and decrease the qualities of the film. Further, since the heating above the melting point of the catalyst loses the form stability, it is advisable to avoid the same. The heating temperature of the catalyst is less than the melting point of the constituting material, and preferably between 1,100 and 1,800° C.

The substrate temperature is preferably between room temperature and 550° C., more preferably between 150 and 400° C. In this temperature range, a high-quality film can be formed efficiently. When the substrate temperature exceeds 550° C., an inexpensive glass cannot be used, and the material of the substrate is restricted, a productivity is poor (throughput is decreased), and the uniformity of the film thickness and the film qualities tends to decrease. When a passivation film for integrated circuit is formed, a doping concentration distribution of impurities tends to change by the influence of heat.

When a polycrystalline silicon film is formed by the ordinary thermal CVD method, the substrate temperature has to be between approximately 600 and 900° C. Meanwhile, in the film formation by this catalytic CVD method, the thermal CVD at low temperatures can be conducted without the need of plasma or light excitation, which is quite advantageous. Since the substrate temperature in the catalytic CVD is low as noted above, a glass having a low distortion point of 470 to 670° C. can be used as a substrate, for example, a glass substrate. This glass is less costly, easily formed into a thin plate, and increased in size (more than 1 $m^2$). Further, a long rolled glass plate can be produced. For example, a thin film can be formed on the long rolled glass plate continuously or discontinuously by the foregoing method.

The starting gas used in this vapor-phase growth may be any of the following gases (a) to (p) based on a hydrogen carrier gas ($R_2$, $H_2$+Ar, $H_2$+Ne or $H_2$+He).

(a) silicon hydride or its derivatives (b) a mixture of silicon hydride or its derivatives and a gas containing hydrogen, oxygen, nitrogen, germanium, carbon, tin or lead (c) a mixture of silicon hydride or its derivatives and a gas containing impurities made of elements of Group III or V in the periodic table (d) a mixture of silicon hydride or its derivatives, a gas containing hydrogen, oxygen, nitrogen, germanium, carbon, tin or lead and a gas containing impurities made of elements of Group III or V in the periodic table (e) an aluminum compound gas (f) a mixture of an aluminum compound gas and a gas containing hydrogen or oxygen (g) an indium compound gas (h) a mixture of an indium compound gas and an oxygen-containing gas (i) a high-melting metal fluoride gas, chloride gas or organic compound gas (j) a mixture of a high-melting metal fluoride gas, chloride gas or organic compound gas and silicon hydride or its derivatives (k) a mixture of titanium chloride and a gas containing nitrogen and/or oxygen (l) a copper compound gas (m) a mixture of an aluminum compound gas, a hydrogen or hydrogen compound gas, silicon hydride or its derivatives and/or a copper compound gas (n) hydrocarbons or their derivatives (o) a mixture of hydrocarbons or their derivatives and a hydrogen gas (p) an organic metal complex, alkoxide The use of these starting gases allows the vapor-phase growth of semiconductor thin films of polycrystalline silicon, monocrystalline silicon, amorphous silicon, microcrystalline silicon, silicon-germanium, silicon carbide (Sic) and compound semiconductors (GaAs, GaP and GaN as examples of Groups III to V, and ZnSe, ZnS and ZnTe as examples of Groups II to VI), insulation thin films of silicon oxide, impurity-containing silicon oxides such as PSG (phosphorus silicate glass), BSG (borosilicate glass) and BPSG (boro-phosph-silicate glass), silicon nitride, silicon acid nitride, molybdenum oxide, titanium oxide, tantalum oxide, aluminum oxide and indium oxide, and metallic thin films of high-melting metals such as tungsten, titanium, tantalum, molybdenum, tungsten nitride, titanium nitride, tantalum nitride and molybdenum nitride, silicide, copper, aluminum, aluminum-silicon and aluminum-silicon-copper.

It is advisable to heat-treat the catalyst in a hydrogen gas atmosphere before feeding the starting gas. When the catalyst is heated before feeding the starting gas, the constituting material of the oxidized catalyst is released, and incorporated into the film formed. This incorporation can be eliminated by heating the catalyst in the hydrogen gas atmosphere. It is thus advisable that while the predetermined hydrogen carrier gas is fed to the film-forming chamber, the catalyst is heated and the starting gas is then fed.

The invention is appropriate for producing a silicon semiconductor device, a silicon semiconductor integrated circuit device, a silicon-germanium semiconductor device, a silicon-germanium semiconductor integrated circuit device, a compound semiconductor device, a compound semiconductor integrated circuit device, a diamond semiconductor device, silicon carbide semiconductor device, a silicon carbide semiconductor integrated circuit device, a liquid crystal display device, an electro luminescence display device, a plasma display panel (PDP) device, a light-emitting polymer display device, a light-emitting diode display device, a CCD area/linear sensor device, a MOS sensor device, a high dielectric semiconductor device, a ferroelectric semiconductor device or a solar cell device.

The preferred embodiments of the invention are described in more detail below.

Eighth Embodiment

The eighth embodiment of the invention is described by referring to FIGS. 101 to 114.

<DC Bias Catalytic Etching Method and its Apparatus>

In this embodiment, an electric field of less than a glow discharge starting voltage acts on reaction seeds or precursors thereof generated by contacting a reaction gas such as a $CF_4$ gas with a catalyst heated to give kinetic energy, thereby etching a predetermined film of polycrystalline silicon on a substrate in vapor phase. At this time, a DC voltage (DC voltage of less than 1 kV determined according to the Paschen's law) is applied between the substrate and a counter electrode to direct the reaction seeds or the precursors thereof to the substrate. The etching method according to this embodiment is hereinafter called a DC bias catalytic etching method.

Figure 101:
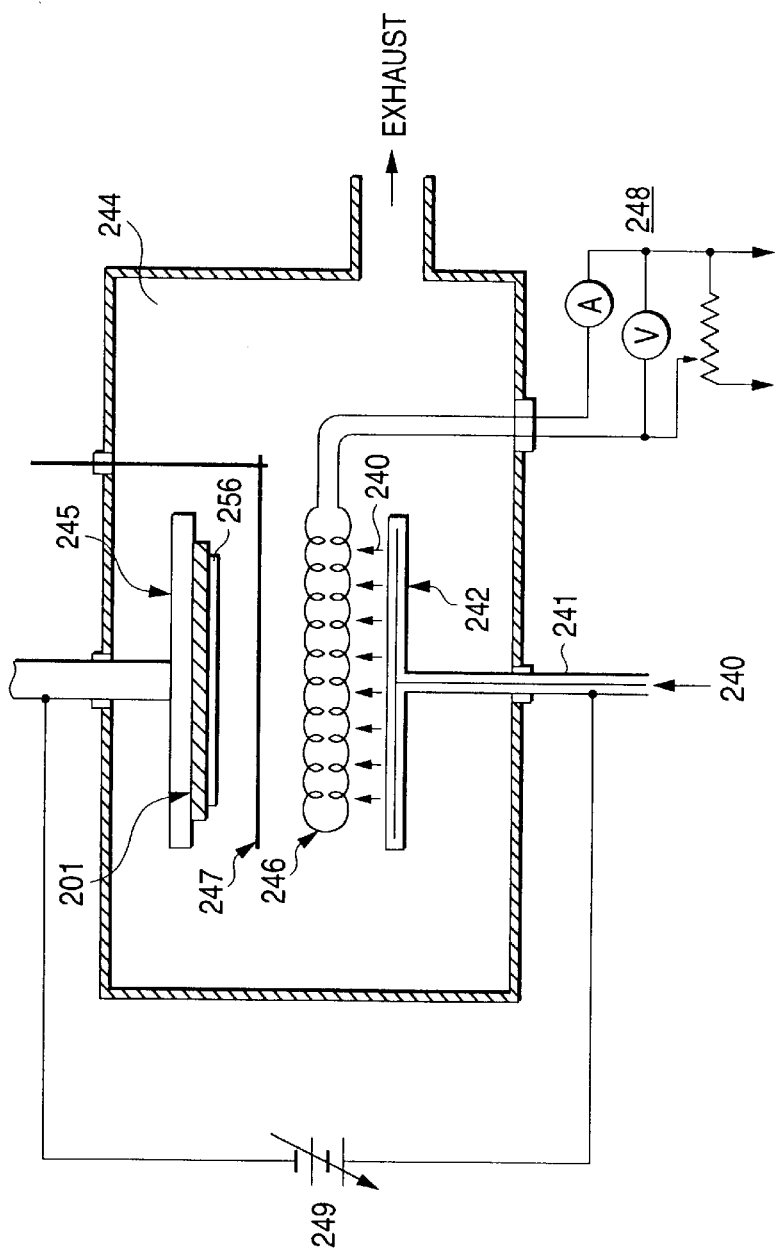
FIG. 101 is a schematic sectional view of a DC bias catalytic etching apparatus according to the first embodiment of the invention.
Figure 103:
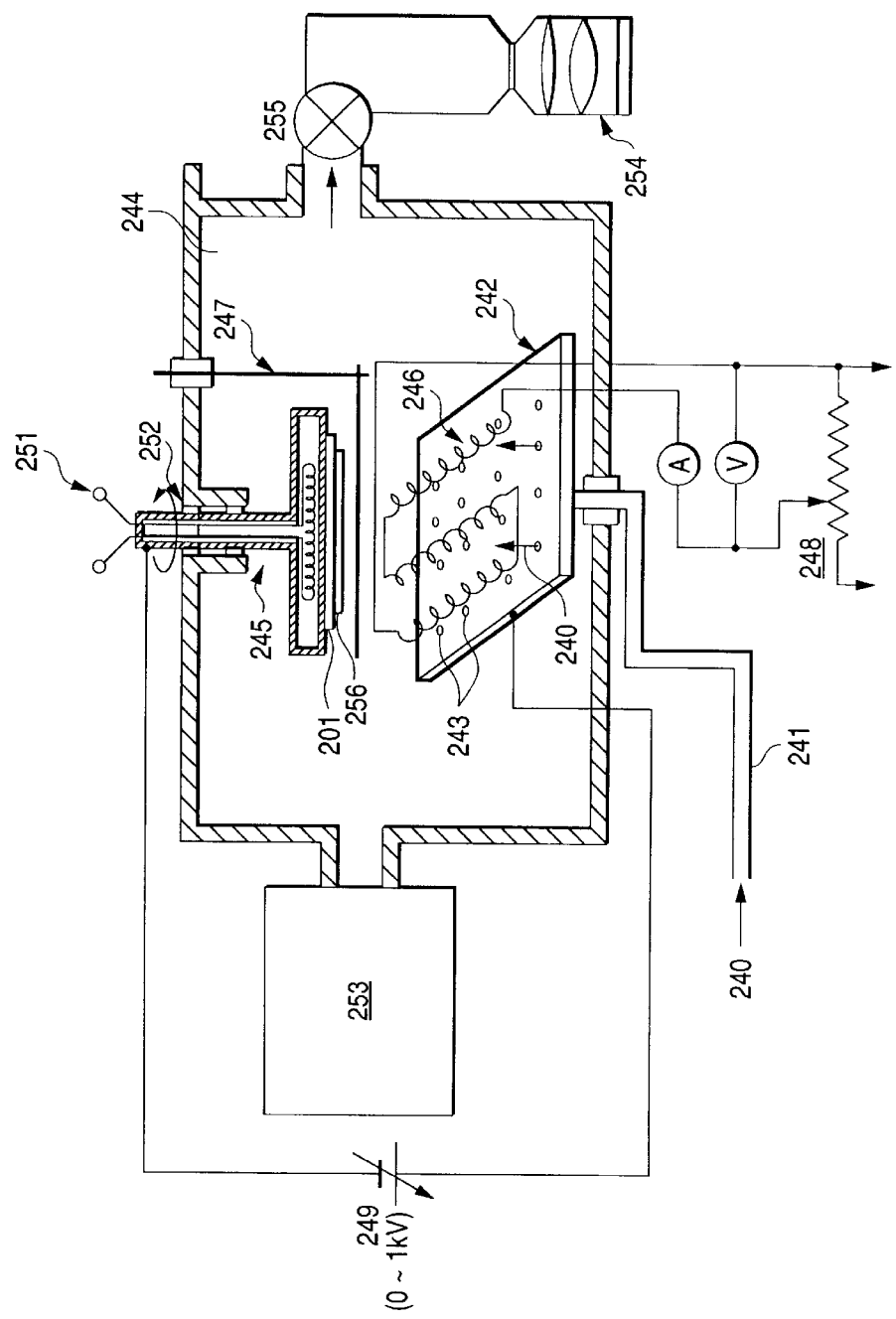
FIG. 103 is a detailed sectional view in etching with a catalytic etching apparatus according to the same.

The DC bias catalytic etching method is carried out using an apparatus shown in FIGS. 101 to 103.

In this apparatus (DC bias catalytic etching apparatus), a reaction gas 240 such as carbon fluoride (for example, $CF_4$) is led to a vapor-phase etching chamber 244 from a feeding conduit 241 through a feeding port 243 of a shower head 242 along with a diluent or carrier gas such as Ar, He, Ne or $N_2$. A susceptor 245 for supporting a substrate 201 of a glass having a thin film 256 of a polycrystalline silicon layer to be etched, the shower head 242 of a good heat resistance (preferably made of a material having a melting point which is the same as, or higher than, that of a catalyst 246), the coiled catalyst 246 of platinum-coated ceramics or tungsten and further a switchable shutter 247 are mounted in the chamber 244. A magnetic seal 252 is applied between the susceptor 245 and the etching chamber 244. A front chamber 253 for conducting pretreatment is disposed after the etching chamber 244, and the etching chamber is evacuated with a molecular turbo-pump 254 via a valve 255.

The substrate 201 is heated, as required, with a heating unit such as a heater wire 251 in the susceptor 245. The catalyst 246 is activated by being heated to less than the melting point (especially 800 to 2,000° C.; approximately 1,200° C. in case of platinum-coated ceramics and approximately 1,600 to 1,700° C. in case of ceramics-coated tungsten) as a resistance wire. Both terminals of the catalyst 246 are connected with a DC or AC catalyst power source 248, and the catalyst is heated to a predetermined temperature by passing electricity from this power source. Further, the shower head 242 is connected as an acceleration electrode with a positive pole side of a variable DC power source (less than 1 kV, for example, 500 V) 249 through the conduit 241 to apply a DC bias voltage of less than 1 kV between the shower head and the susceptor 245 (thus, the substrate 201).

In conducting this DC bias catalytic etching method, the inside of the vapor-phase etching chamber 244 is first evacuated to between $10^{-6}$ and $10^{-6}$ torr, and the substrate is then heated to between approximately 100 and 200° C. In the state shown in FIG. 101, the reaction gas 240 such as $CF_4$ is introduced from the feeding port of the shower head 242 to make the gas pressure $10^{-1}$ to $10^{-1}$ torr as shown in FIG. 102, and it is contacted with the catalyst 246 of platinum-coated ceramics heated to between 800 and 2,000° C. (for example, approximately 1,200° C.). Subsequently, the shutter 247 is opened.

At least a part of the reaction gas 240 is contacted with the catalyst 246 to be catalytically decomposed. The catalytic decomposition or the thermal decomposition allows formation of reaction seeds or radicals (namely, reaction seeds or precursors thereof) of fluorine to which high energy has been imparted. The DC electric field by the DC power source 249 of less than the glow discharge starting voltage (approximately 1 kV), for example, 500 V acts on the resulting reaction seeds 250 (or precursors thereof) to give kinetic energy, and these are directed to the substrate 201 to exhibit the etching selectivity. Thus, a predetermined film 256 of polycrystalline silicon on the substrate 201 held at between −100° C. and 500° C. (for example, between room temperature and 100° C.) is etched in vapor phase.

Thus, the directional kinetic energy obtained by adding the acceleration energy by the DC electric field to the catalytic activity of the catalyst 246 and its heat energy is thus imparted to the reaction seeds (ions or radicals) without generating plasma, with the result that the reaction gas is converted into the reaction seeds at good efficiency, the reaction seeds are led to the substrate at good efficiency and the etching proceeds through the chemical reaction and the collision against the substrate. Consequently, since the highly anisotropic etching like the reactive ion etching is conducted, the high-precision fine pattern etching (or ashing) can be conducted with low damage without ultraviolet damage.

Accordingly, the anisotropic etching can be conducted by the impact of ions vertically entered upon covering the defects of the ordinary reactive etching. Therefore, it is possible to conduct, for example, selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose.

An etching selection ratio can freely be determined depending on the acceleration voltage 249 to be applied, the heating temperature and the type of the catalyst 246, and the type and the conditions of the reaction gas 240. Various fine processings such as isotropic etching, controlling of an angle of inclination on an edge and surface flattening by setting a selection ratio at 1 are enabled.

Moreover, since the reaction seeds (ions or radicals) generated with the catalyst 246 are independently controlled in the DC electric field and led to the substrate at good efficiency, the reaction gas is used at high efficiency, and the treatment rate is increased, thereby improving a productivity and reducing costs by reduction of the reaction gas.

Although the substrate temperature is decreased, the kinetic energy of reaction seeds is so great as to enable treatment in a large area. The decrease in the substrate temperature can reduce costs by improvement in the productivity with the improvement in the throughput and improve the uniformity of the thickness and the qualities of the film due to the decrease in the non-uniformity of the substrate temperature. Thus, a large-sized, inexpensive insulation substrate (glass substrate or heat-resistant resin substrate) is also available, and costs can also be reduced in this respect. Besides, since the shower head 242 for feeding the reaction gas can also be used as an electrode for accelerating the reaction seeds, the structure is simplified. As the shower head 242 can blow a gas uniformly too, non-uniform etching or ashing less occurs.

Naturally, since plasma is not generated in the etching, damage or short-circuiting, ultraviolet damage and cross contamination of metals by plasma do not occur, and a far simple, inexpensive apparatus is realized in comparison with a plasma etching method (reactive etching method).

In this case, operation is conducted under reduced pressure (for example, $10^{-3}$ to $10^{-1}$ torr) or under normal pressure. In the normal pressure type, a simpler, less costly apparatus can be realized than in the reduced pressure type. Even in the normal pressure type, the electric field is applied. Thus, the highly selective etching is carried out. In this instance, the throughput is greater in the normal pressure type than in the reduced pressure type, and the productivity is high, so that costs can be reduced.

In the reduced pressure type, the DC voltage is influenced by the gas pressure (flow rate of the reaction gas) and the type of the reaction gas. Anyway, it has to be adjusted to an optional voltage of less than the glow discharge starting voltage. In the normal pressure type, it is advisable to adjust exhaustion lest the flows of the reaction gas and the reaction seeds have an adverse effect on the film of the substrate and the exhaust gas stream be contacted with the substrate.

In this etching, the substrate temperature is increased owing to the radiation heat of the catalyst 246. As stated above, a temperature controller, for example, a heater 251 for heating a substrate (or a refrigerant supply unit for cooling a substrate) may be provided as required. The catalyst 246 is coiled (it may take the form of a mesh, a wire or a porous plate).

It is advisable that a catalyst has plural stages (for example, 2 to 3 stages) in the gas flow direction to increase the contact area with the gas in view of the improvement in the use efficiency of the reaction gas by the acceleration of the catalytic reaction and the improvement in the treatment rate. In this etching, the substrate 201 is put on the lower surface of the suscepter 245 above the shower head 242. Accordingly, it does not occur that particles generated in the chamber 244 drop down and adhere to the substrate 201 or the film thereon. Thus, yields and qualities can be improved owing to the reduction of dust. Of course, the substrate 201 may be put on the upper surface of the suscepter 245 below the shower head 242 (at this time, the productivity can be improved).

Figure 104:
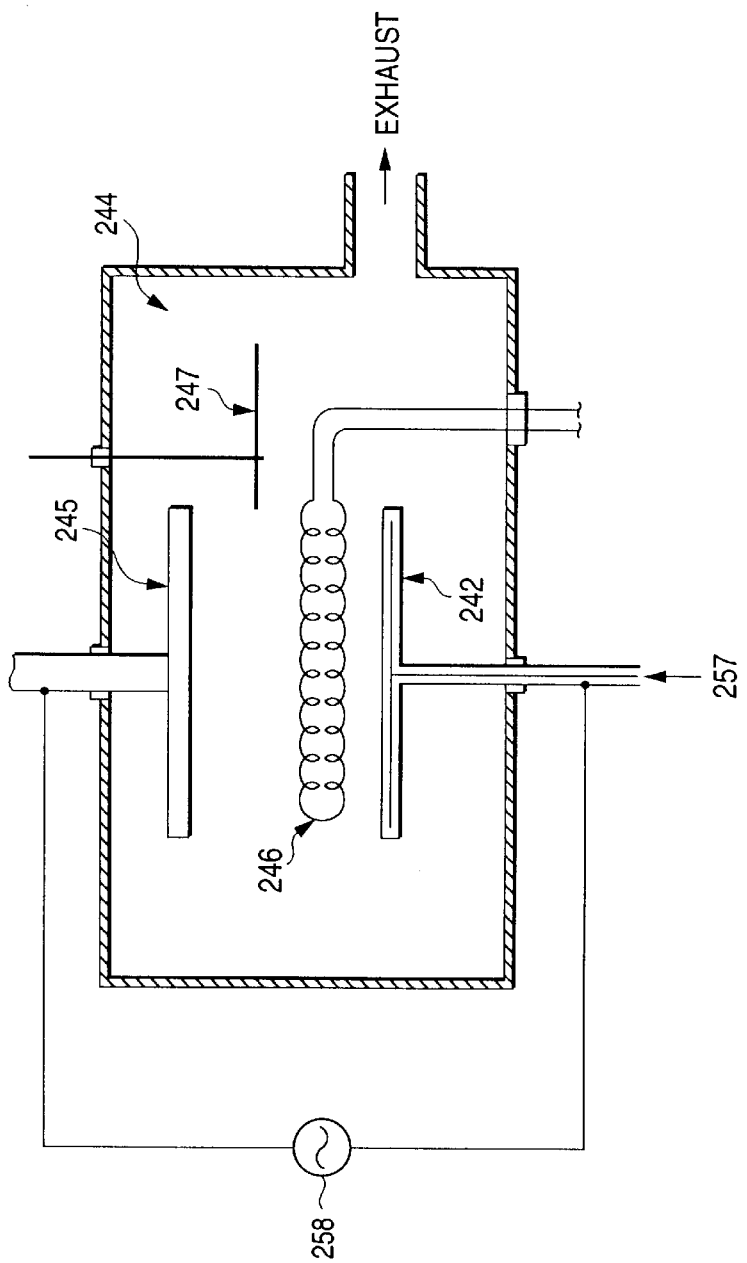
FIG. 104 is a schematic sectional view in cleaning with a catalytic etching apparatus according to the same.

In this embodiment, after the completion of the DC bias catalytic etching, as shown in FIG. 104, the substrate 201 is withdrawn outside the etching chamber 244, and a reaction gas 257 such as $NF_3$, $CF_4$ or $C_2F_6$ is introduced (degree of vacuum $10^{-1}$ to several torr). A radiofrequency voltage 258 (or DC voltage) is applied between the suscepter 245 of the substrate 201 and the shower head 242, a counter electrode to generate plasma discharge, whereby the inside of the chamber 244 can be cleaned. In this case, a plasma generation voltage is 1 kV or more, for example, between 1.5 and 2.0 kV with 2 to 3 kW.

That is, in the vapor-phase etching, foreign matters adhered to the inner wall surface in the chamber 244 and the constituting members such as the suscepter 245, the shower head 242, the shutter 247 and the catalyst 246 can be removed by etching to reduce dust. Thus, costs can be reduced by improving yields and qualities. Since this can be realized using the vapor-phase processing apparatus as such, there is no need to withdraw the constituting members outside the chamber 244 and clean the same. Consequently, the workability can be improved, and costs can be reduced by the improvement in the productivity. The catalyst 246 can be cleaned at the same time (provided the catalyst power source 248 is switched off). However, it may be withdrawn outside the chamber 244 and separately cleaned.

Figure 105:
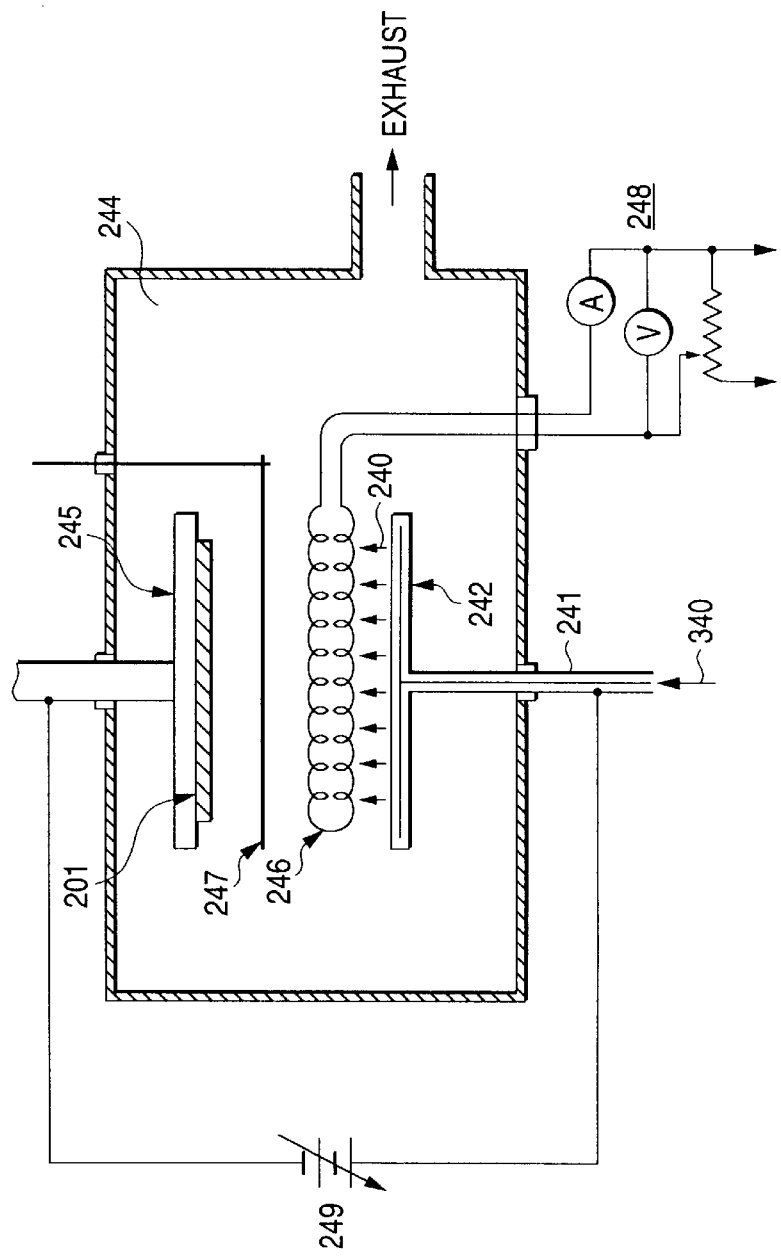
FIG. 105 is a schematic sectional view of a DC bias catalytic CVD apparatus according to the same.

With respect to the thin film 256 to be etched, a predetermined thin film 256 can be formed in vapor phase by the catalytic CVD method upon feeding the film-forming starting gas instead of the reaction gas 240 in the apparatus shown in FIGS. 101 to 103. That is, as shown in FIG. 105, a starting gas 340 such as a silane gas is introduced from the feeding port of the shower head 242, and contacted with the catalyst 246 such as tungsten which is heated at 800 to 2,000° C. (for example, approximately 1,650° C. as shown in FIG. 106). Then, the shutter 247 is opened.

At least a part of the starting gas 340 is contacted with the catalyst 246 to be catalytically decomposed. A group of ions or radicals (namely, deposition seeds or precursors thereof) of silicon having high energy is formed by the catalytic decomposition or the thermal decomposition. The DC electric field by the DC power source 249 of less than the glow discharge starting voltage (approximately 1 kV), for example, 500 V acts on the resulting deposition seeds 350 (or precursors thereof) such as ions or radicals to give kinetic energy and direct the same to the substrate 201, whereby a predetermined film 256 of polycrystalline silicon is grown on the substrate 201 held at room temperature to 550° C. (for example, 200° C.) in vapor phase.

Thus, the directional kinetic energy obtained by adding the acceleration energy by the DC electric field to the catalytic activity of the catalyst 246 and its heat energy is imparted to the reaction seeds (ions or radicals) without generating plasma even in the film formation, making it possible to convert the starting gas to the reaction seeds at good efficiency and uniformly deposit the same on the substrate 201 by thermal CVD by the DC electric field. The deposition seeds 256 migrate on the substrate 201, and are diffused in the thin film. Thus, a dense, flat and uniform thin film 256 with good step coverage can be formed.

Accordingly, such DC bias catalytic CVD features that control of the thin film formation with any independent DC electric field is added to a substrate temperature, a catalyst temperature, a gas pressure (flow rate of a starting gas) and a type of a starting gas which are control factors of the ordinary catalytic CVD. Consequently, the adhesion of the film formed to the substrate, the density of the film formed, the uniformity or the smoothness of the film formed, the embedding property in via holes and the step coverage are improved, the substrate temperature is more decreased, and the stress control of the film formed is enabled to obtain a high-quality film (for example, a silicon film or a metallic film having properties close to bulk properties). Besides, since the reaction seeds (ions or radicals) generated with the catalyst 246 can be deposited on the substrate at good efficiency by being controlled independently in the DC electric field, the use efficiency of the starting gas is high, and the formation rate is increased, so that costs are reduced by the improvement in the productivity and the reduction of the starting gas.

Even when the substrate temperature is decreased, the kinetic energy of the deposition seeds is great as in the DC bias catalytic etching. Thus, the desired high-quality film is obtained, the substrate temperature can be decreased, and plasma is not generated. Accordingly, a high-quality film good in density, uniformity and adhesion is obtained with low stress without damage by plasma.

Figure 107:
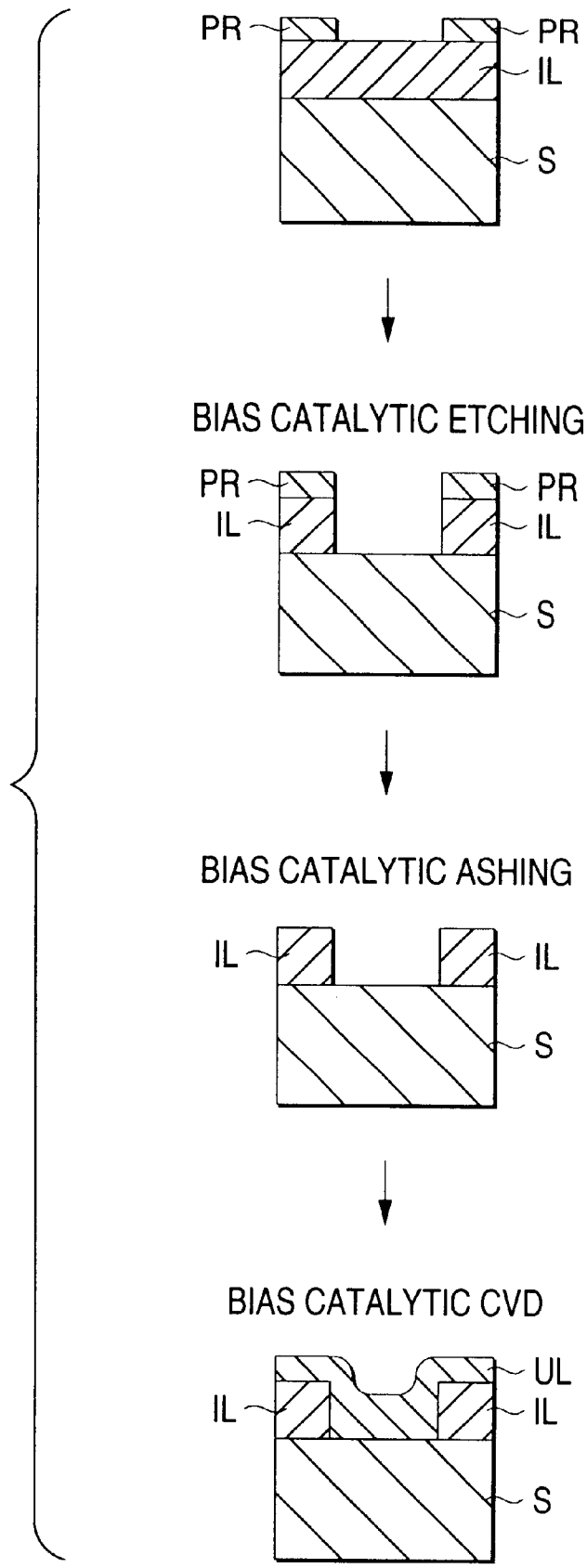
FIG. 107 is a schematic sectional view in a flow chart of conducting bias catalytic etching, bias catalytic ashing and bias catalytic CVD in this order.

To sum up, in this processing, as schematically shown in FIG. 107, a photoresist PR is formed on a film IL such as an insulation film of a substrate S in a predetermined pattern. Then, a part of the film IL is removed by the bias catalytic etching with the reaction gas, and a photoresist film PR is then removed by the bias catalytic ashing with the reaction gas. Further, the gas is replaced with a starting gas for film formation, and a predetermined film UL can be formed on the substrate S by the bias catalytic CVD. In this manner, etching of a thin film, ashing of a photoresist and formation of a CVD film can continuously be conducted with an apparatus having basically the same construction. Thus, it is possible to improve qualities of the film by the decrease in the contamination with impurities and to reduce costs due to the improvement in the productivity with the improvement in the workability.

In this case, in the bias catalytic etching, a gas obtained by adding a reaction gas to an inert gas such as He, Ne, Ar, $N_2$, Kr, Xe, Rn or a mixture thereof may be used as a diluent gas or a carrier gas. In the bias catalytic ashing, a gas obtained by adding an oxidative gas to an inert gas such as He, Ne, Ar, $N_2$, Kr, Xe, Rn or a mixture thereof may be used as a diluent gas or a carrier gas. The photoresist film has to be completely removed. Further, in the bias catalytic CVD, a gas obtained by adding each starting gas to an $H_2$ gas-based hydrogen carrier gas such as $H_2$, $H_2$+Ar, $H_2$+Ne, $H_2$+He or $H_2$+Ar+Ne+He may be used.

Figure 108:
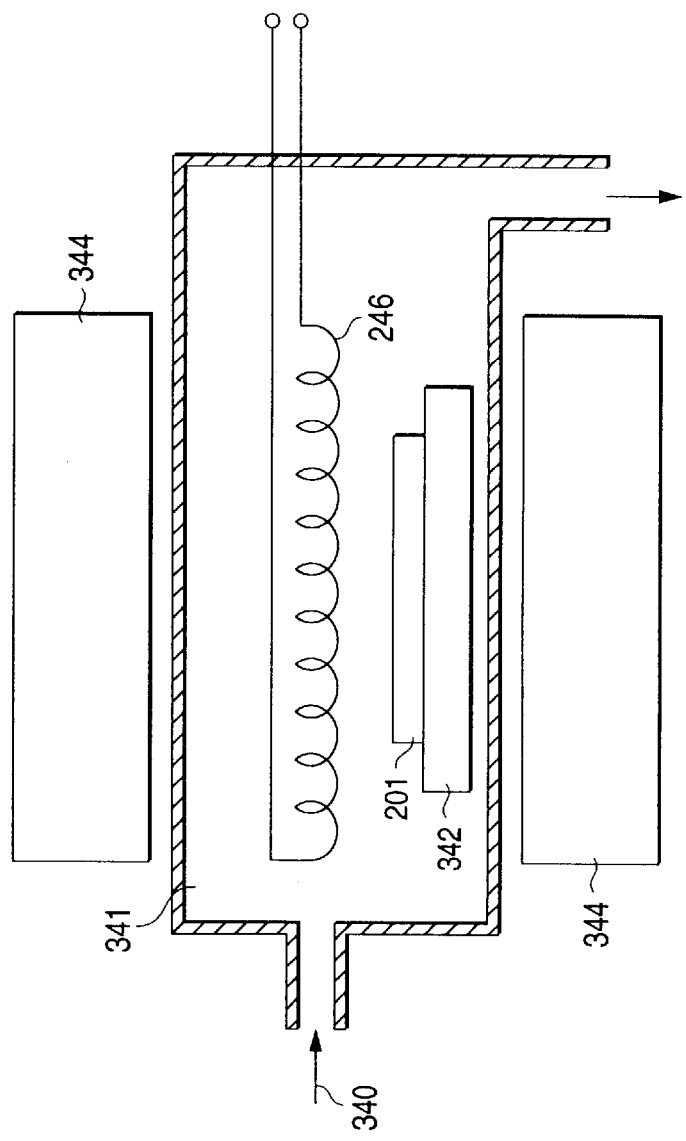
FIG. 108 is a schematic sectional view of a catalytic CVD apparatus according to the same.

The thin film 256 can be formed with an ordinary catalytic CVD apparatus described in Japanese Patent Laid-Open No. 40314/1988. According to this catalytic CVD apparatus, as shown in FIG. 108, for example, a silicon hydride (for example, monosilane) gas 340 (and a doping gas such as $B_2H_6$ or $PH_3$ as required) is introduced from a feeding conduit to a chamber 341. A susceptor 342 for supporting a substrate 201 and a coiled catalyst 246 disposed opposite the susceptor are mounted in the deposition chamber 341. The substrate 201 is heated with an external heating unit 344 (for example, an electric heating unit). Further, the catalyst 246 is activated by being heated below a melting point (especially 800 to 2,000° C.; approximately 1,700° C. in case of tungsten) as a resistance wire, for example.

In the deposition chamber 341, the atmosphere is changed from nitrogen to a hydrogen gas (approximately 15 to 20 minutes), and the chamber is then heated at approximately 200 to, 800° C. The silane gas is contacted with the catalyst 246 to be catalytically decomposed, and deposited on the substrate 201 held at a low temperature (for example, 300° C.). The deposition time is found from a thickness of a polycrystalline silicon layer grown. After the completion of the growth, the temperature is decreased, the hydrogen gas is replaced with nitrogen, and the substrate 201 is then withdrawn. In this manner, the silicon atom or the group of atoms having high energy is formed by the catalytic reaction with the catalyst 246 and the thermal decomposition, and deposited on the insulation substrate 201. Consequently, the polycrystalline silicon layer can be deposited in a far lower temperature region than a temperature capable of deposition in the usual thermal CVD method.

<Production of MOSTFT>

An example of producing MOSTFT using the DC bias catalytic etching method according to this embodiment is described below.

Figure 109A:
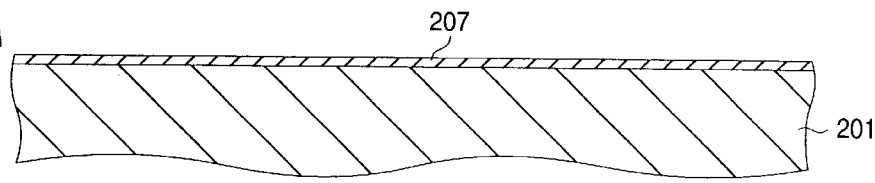
FIG. 109, consisting of FIGS. 109A through 109D, is a sectional view in MOSTFT production process flow using a catalytic etching apparatus according to the same.

Using a film-forming apparatus shown in FIG. 108 or FIGS. 105 and 106, a polycrystalline silicon film 207 is first grown to a thickness of several $\mu$m to 0.005 $\mu$m (for example, 0.1 $\mu$m) on a main surface of an insulation substrate 201 (distortion point 800 to 1,400° C., thickness 0.1 mm to several mm) of a quarts glass or a crystallized glass by the catalytic CVD method (substrate temperature 200 to 800° C.) described in Japanese Patent Laid-Open No. 40314/1989 or the above-described DC bias catalytic CVD method (substrate temperature room temperature to 550° C., for example, 200 to 300° C.; gas pressure $10^{-1}$ to $10^{-3}$ torr, for example, $10^{-2}$ torr; and bias voltage less than 1 kV, for example, 500 V), as shown in FIG. 109A.

In this instance, the atmosphere in the film-forming chamber is changed from nitrogen to a hydrogen gas (approximately 15 to 20 minutes), the substrate 201 is then heated at approximately 200 to 300° C., and the degree of vacuum in the film-forming chamber is set at $10^{-6}$ to $10^{-8}$ torr. For example, 100 to 200 sccm (standard cc per minute: hereinafter similarly) of a hydrogen carrier gas and 1 to 20 sccm of monosilane (and a doping gas such as $B_2H_6$ or $PH_3$ as required) are introduced, and the gas pressure is set at $10^{-3}$ to $10^{-1}$ torr (for example, $10^{-2}$ torr).

The substrate 201 is heated at room temperature to 550° C. (for example, 200 to 300° C.), and the catalyst 246 is activated by being heated at a temperature below a melting point (especially 800 to 2,000° C., for example, approximately 1,650° C. in case of a tungsten wire) as a resistance wire. The hydrogen carrier gas and the starting gas are contacted with the catalyst 246 of tungsten heated.

At least a part of the hydrogen carrier gas and the starting gas is contacted with the catalyst 246 to be catalytically decomposed, and a group of silicon ions, radicals or hydrogen ions (namely, deposition seeds or precursors thereof) having high energy are generated by the catalytic decomposition or thermal decomposition. Thereafter, the shutter 247 is opened, and the resulting deposition seeds 350 (or precursors thereof) of ions or radicals are deposited on the substrate 201. Alternatively, the DC electric field by the DC power source 249 of less than the glow discharge starting voltage (approximately 1 kV), for example, 500 V acts to give kinetic energy, whereby the deposition seeds are directed to the substrate 201, and the polycrystalline silicon film 207 is grown on the substrate 201 held at room temperature to 550° C. (for example, 200 to 300° C.) in vapor phase.

Thus, the polycrystalline silicon film 207 having a thickness of, for example, approximately 0.1 µm is deposited. The deposition time is found from the thickness of the layer grown. After the completion of the growth, the temperatures of the catalyst and the substrate are decreased, the hydrogen gas is replaced with nitrogen, the pressure is set at atmospheric pressure, and the substrate 201 is withdrawn.

Subsequently, a MOS transistor (TFT) using the polycrystalline silicon layer 207 as a channel region is produced.

Figure 109B:
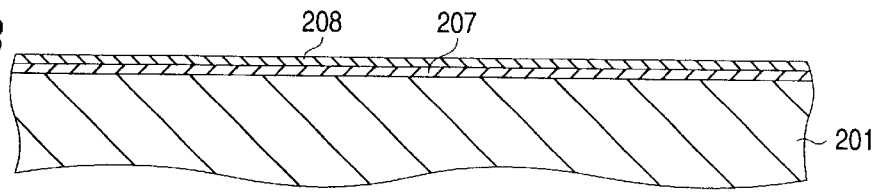

That is, as shown in FIG. 109B, agate oxide film 208 having a thickness of, for example, 350 Å is formed on the surface of the polycrystalline silicon layer 207 by, for example, thermal oxidation treatment (950° C.), or the same DC bias catalytic CVD method while feeding a helium (He)-diluted oxygen gas and a monosilane gas. In the formation of the gate oxide film 208 by the DC bias catalytic CVD method, the substrate temperature and the catalyst temperature are the same as mentioned above. It is also possible that the hydrogen carrier gas is 150 sccm, the monosilane gas is 15 to 20 sccm and the He-diluted $O_2$ gas is 1 to 2 sccm.

Figure 109C:
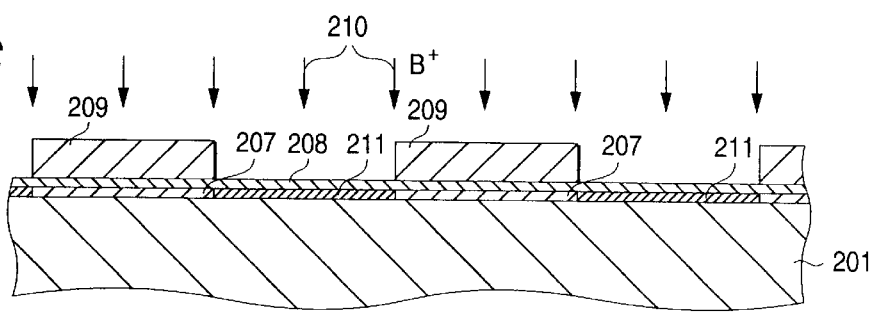

Then, as shown in FIG. 109C, in order to control the concentrations of impurities of a channel region for an N-channel MOS transistor, a P-channel MOS transistor portion is masked with a photoresist 209, and P-type impurity ions (for example, $B^+$) 210 are implanted at, for example, 30 keV and a dose of $2.7\times10^{13}$ atoms/cm$^2$ to form a polycrystalline silicon layer 211 in which the conductive type of the polycrystalline silicon film 207 is P-type.

Figure 109D:
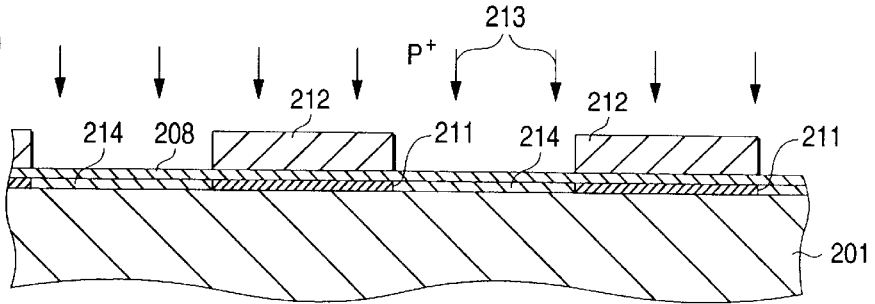

Then, as shown in FIG. 109D, in order to control the concentrations of impurities of a channel region for a P-channel MOS transistor, an N-channel MOS transistor portion is masked with a photoresist 212, and N-type impurity ions (for example $P^+$) 213 are implanted at, for example, 50 keV and a dose of $1\times10^{13}$ atoms/cm$^2$ to form a polycrystalline silicon layer 214 in which the P-type of the polycrystalline silicon film 207 is compensated.

Figure 110A:
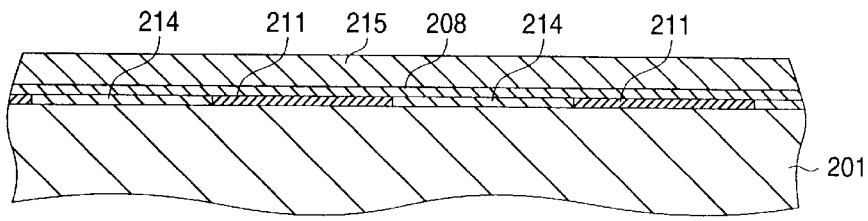
FIG. 110, consisting of FIGS. 110A through 110D, is a sectional view in MOSTFT production process flow using a catalytic etching apparatus according to the same.

Then, as shown in FIG. 110A, a phosphorus-doped polycrystalline silicon film 215 as a gate electrode material is deposited to a thickness of, for example, 4,000 Å by, for example, the same DC bias catalytic CVD method (substrate temperature 200 to 300° C.) while feeding 150 sccm of the hydrogen carrier gas, 5 to 10 sccm of $PH_4$ and 15 sccm of the monosilane gas or by the usual vacuum CVD method (substrate temperature 620° C.)

Figure 110B:
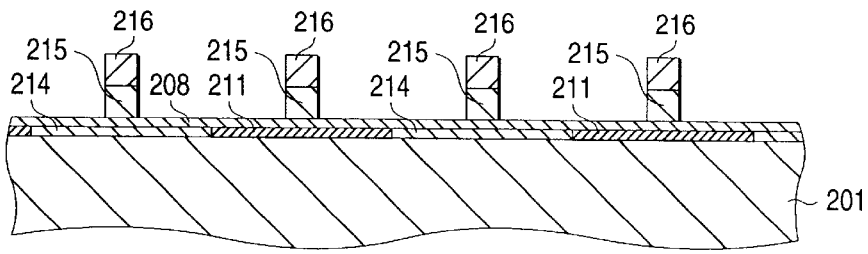

Then, as shown in FIG. 110B, a photoresist 216 is formed in a predetermined pattern. Using this as a mask, the polycrystalline silicon film 215 is patterned into a gate electrode form by the DC bias catalytic etching method (a diluent gas or a carrier gas 150 sccm, $CF_4$+He-diluted $O_2$ 5 to 10 sccm, the catalyst temperature 1,200° C. in case of platinum-coated ceramics, substrate temperature room temperature to 100° C.) shown in FIGS. 101 to 103.

Figure 110C:
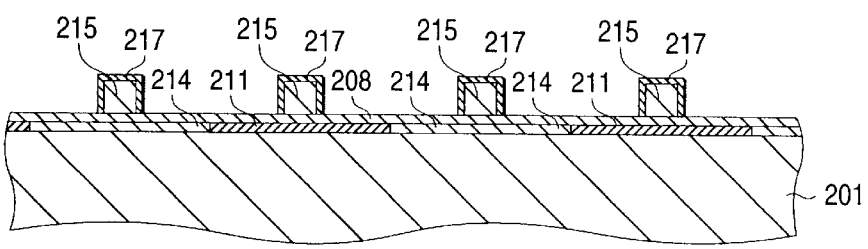
Figure 110D:
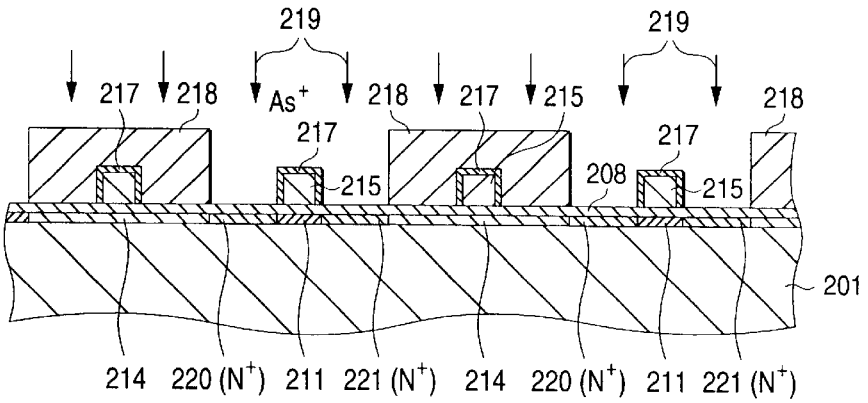

Further, the photoresist 216 is removed by the DC bias catalytic ashing using 150 sccm of a diluent gas or a carrier gas and 5 to 10 sccm of an oxidative gas (for example, He-diluted $O_2$). Then, as shown in FIG. 110C, an oxide film 217 is formed on the surface of the gate polycrystalline silicon film 215 by oxidation treatment in $O_2$ at, for example, 900° C. for 60 minutes.

Then, as shown in FIG. 111D, a P-channel MOS transistor portion is masked with a photoresist 218, and $As^+$ ions 219, N-type impurities, are implanted at, for example, 70 keV and a dose of $5\times10^{15}$ atoms/cm$^2$, and annealed in N$_2$ at 950° C. for 40 minutes to form $N^+$-type source region 220 and drain region 221 of an N-channel MOS transistor.

Then, as shown in FIG. 111A, an N-channel MOS transistor portion is masked with a photoresist 222, and $B^+$ ions 223, P-type impurities, are implanted at, for example, 30 keV and a dose of $5\times10^{15}$ atoms/cm$^2$, and annealed in N$_2$ at 900° C. for 5 minutes to form $P^+$-type source region 224 and drain region 225 of a P-channel MOS transistor.

Then, as shown in FIG. 111B, by the usual CVD method or the same catalytic CVD method, an $SiO_2$ film 226 is laminated, on the whole surface, to a thickness of 500 Å at, for example, 200 to 300° C. while feeding 150 sccm of a hydrogen carrier gas, 1 to 2 sccm of He-diluted 0 and 15 to 20 sccm of $SiO_2$, and an SiN film 227 to a thickness of 2,000 Å at, for example, 200 to 300° C. while feeding 150 sccm of a hydrogen carrier gas, 50 to 60 sccm of $NH_3$ and 15 to 20 sccm of $SiH_4$. Further, a boron- and phosphorus-doped silicate glass (BPSG) film 228 is formed as a reflow film to a thickness of 6,000 Å at, for example, 200 to 300° C. while feeding 150 sccm of a hydrogen carrier gas, 10 to 20 sccm of He-diluted $B_2H_6$, 10 to 20 sccm of He-diluted $PH_3$, 10 to 20 sccm of He-diluted 0 and 15 to 20 sccm of $SiH_4$. This BPSG film 228 reflows in N$_2$ at, for example, 900° C.

Then, as shown in FIG. 111C, contact holes are formed in a predetermined position of the insulation film by the DC bias catalytic etching method under the same conditions (provided the reaction gas based on the diluent gas or the carrier gas is $CF_4$+He-diluted $O_2$), and a photoresist film is likewise removed by the DC bias catalytic ashing method. Subsequently, an electrode material such as aluminum is deposited on the whole surface including the contact holes to a thickness of 1 µm at 150° C. by sputtering. This is patterned by the DC bias catalytic etching method under the same conditions (provided the reaction gas based on the diluent gas or the carrier gas is $CCl_4$+He-diluted $O_2$), and the photoresist film is likewise removed by the DC bias catalytic ashing method. Subsequently, a source or drain electrode 229 (S or D) of each of a P-channel MOSTFT and an N-channel MOSTFT and a gate withdrawal electrode or wire 230 (G) are formed to provide each MOS transistor of top gate type.

When aluminum is formed by the DC bias catalytic CVD, continuous procedures of DC bias catalytic etching, DC bias catalytic ashing and DC bias catalytic CVD in this order can be conducted using the same apparatus.

<Production of LCD>

An example of producing a liquid crystal driving substrate (hereinafter referred to as a TFT substrate) of a liquid crystal display device (LCD) using the DC bias catalytic etching method according to this embodiment is described below.

Figure 112A:
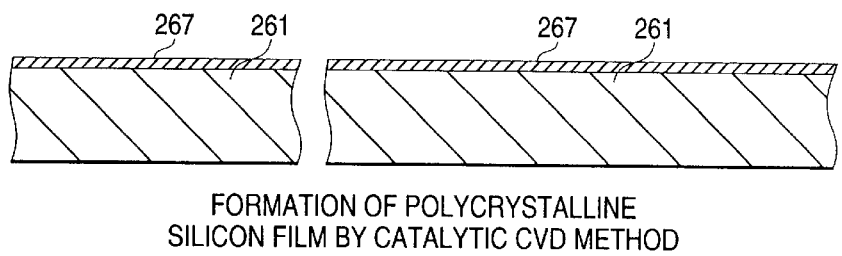
FIG. 112, consisting of FIGS. 112A through 112D, is a sectional view in LCD production process flow using a catalytic etching apparatus according to the same.

Using a film-forming apparatus shown in FIG. 108 or FIGS. 105 and 106, a polycrystalline silicon film 267 is first grown to a thickness of several µm to 0.005 µm (for example 0.1 µm) on a main surface of an insulation substrate 201 of a quartz glass or a crystallized glass (distortion point approximately 800 to 1,400° C., thickness 0.1 mm to several mm) in an image area or a peripheral circuit portion by the DC bias catalytic CVD method (substrate temperature room temperature to 550° C., for example, 200 to 300° C., gas pressure $10^{-1}$ to $10^{-3}$ torr, for example, $10^{-2}$ torr, and less than 1 kV, for example, 500 V in applying the bias voltage), as shown in FIG. 112A.

In this case, the atmosphere in the film-forming chamber is changed from nitrogen to a hydrogen gas (approximately 15 to 20 minutes), and then the degree of vacuum in the film-forming chamber is set at $10^{-6}$ to $10^{-8}$ torr. For example, 100 to 200 sccm of a hydrogen carrier gas and 1 to 20 sccm of monosilane gas (and a doping gas such as $B_2H_6$ or $PH_3$ as required) are introduced as described above, and the gas pressure here is $10^{-3}$ to $10^{-1}$ torr (for example $10^{-2}$ torr).

The substrate 201 is heated at room temperature to 550° C. (for example 200 to 300° C.) as described above, and the catalyst 246 is activated by being heated below a melting point (especially 800 to 2,000° C.; 1,700 to 1,800° C. in case of a tungsten wire) as a resistance wire. The starting gas is then contacted with the catalyst 246 such as tungsten heated.

At least a part of the starting gas is contacted with the catalyst 246 to be catalytically decomposed. A group of silicon ions, radicals or hydrogen ions having high energy (namely, deposition seeds or precursors thereof) are formed by the catalytic decomposition or the thermal decomposition, and deposited on the substrate 201. Alternatively, the DC electric field by the DC power source 249 of less than the glow discharge starting voltage (approximately 1 kV), for example, 500 V acts on the resulting deposition seeds 350 (or precursors thereof) such as ions or radicals to give kinetic energy, and these are directed to the substrate 201, whereby a polycrystalline silicon film 267 is grown on the substrate 201 held at room temperature to 550° C. (for example, 400° C.) in vapor phase.

Thus, the polycrystalline silicon film 267 having a thickness of, for example, 0.1 μm is deposited. This deposition time is found from a thickness of a layer grown. Further, after the completion of the growth, the temperatures of the catalyst and the substrate are decreased, hydrogen is replaced with nitrogen, the pressure is set at atmospheric pressure, and the substrate 201 is withdrawn.

Figure 112B:
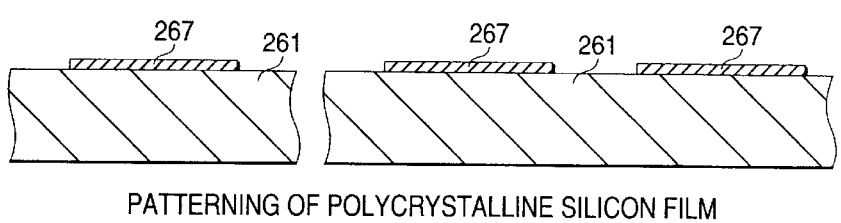

Then, as shown in FIG. 112B, the polycrystalline silicon film 267 is patterned using a photoresist mask to form each transistor active layer.

Figure 112C:
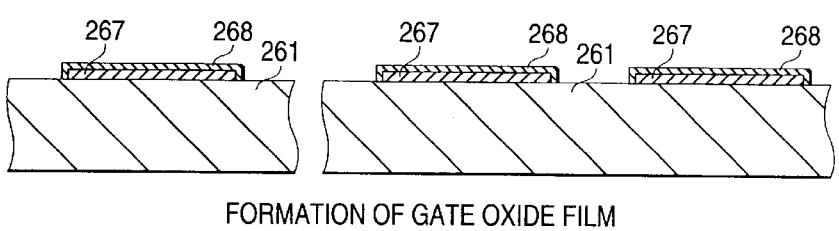

Then, as shown in FIG. 112C, a gate oxide film 268 having a thickness of, for example, 350 Å is formed on the surface of the polycrystalline silicon film 267 by thermal oxidation treatment (950° C.) or the same DC bias catalytic CVD method while feeding an He-diluted oxygen gas and a monosilane gas. When the gate oxide film 268 is formed by the DC bias catalytic CVD method, the substrate temperature and the catalyst temperature are the same as mentioned above, but 150 sccm of a hydrogen carrier gas, 15 to 20 sccm of a monosilane gas and 1 to 2 sccm of an He-diluted $O_2$ gas may be used.

Figure 112D:
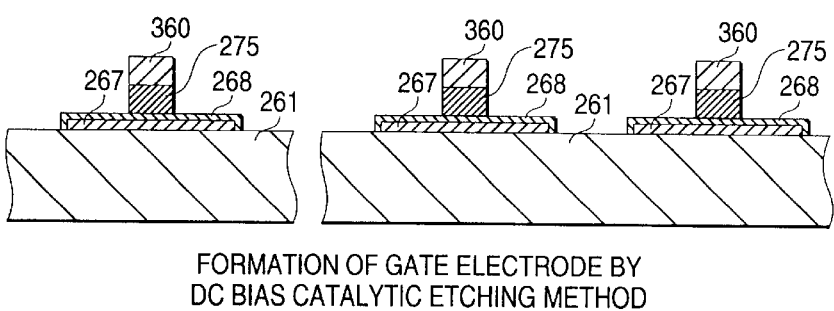

Then, in order to control concentrations of impurities in the channel region of the transistor active layer 267, predetermined impurity ions such as $B^+$ or $P^+$ are implanted. Thereafter, as shown in FIG. 112D, for example, aluminum is deposited to a thickness of, for example, 4,000 Å as a gate electrode material by sputtering. Or the polycrystalline silicon film is deposited to a thickness of, for example, 4,000 Å by the same DC bias catalytic CVD method (substrate temperature 200 to 300° C.) while feeding 15 to 20 sccm of a monosilane gas based on a hydrogen carrier gas. Subsequently, a high-density, low-resistance polycrystalline silicon film is formed by phosphorus diffusion. Using a photoresist mask 360, a gate electrode material layer is patterned in the form of a gate electrode 275 by the DC bias catalytic etching method under the same conditions. After the removal of the photoresist mask by the DC bias catalytic etching method, an oxide film may be formed on the surface of the gate polycrystalline silicon film 275 by oxidation treatment in $O_2$ at, for example, 900° C. for 60 minutes.

Figure 113A:
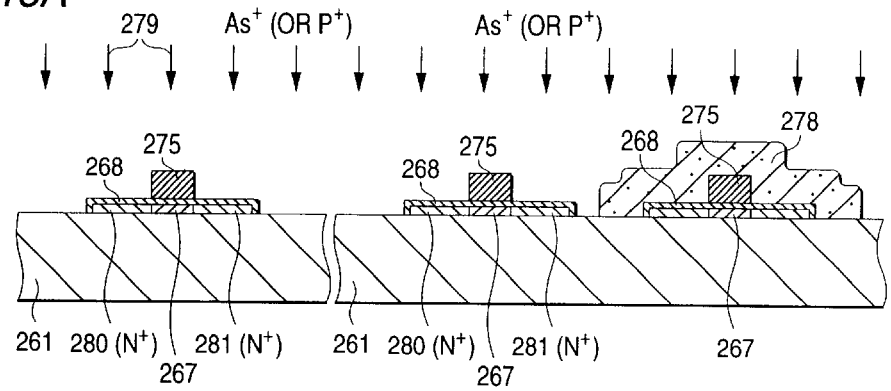
FIG. 113, consisting of FIGS. 113A through 113C, is a sectional view in LCD production process flow using a catalytic etching apparatus according to the same.

Then, as shown in FIG. 113A, a P-channel MOS transistor portion is masked with a photoresist 278. For example, $As^+$ (or $P^+$) ions, N-type impurities 279, are implanted at, for example, 70 keV and a dose of $1 \times 10^{15}$ atoms/cm$^2$, and the photoresist film is removed by the DC bias catalytic ashing method. N-type source region 280 and drain region 281 of an N-channel MOS transistor are formed by annealing in $N_2$ at 950° C. for 40 minutes.

Figure 113B:
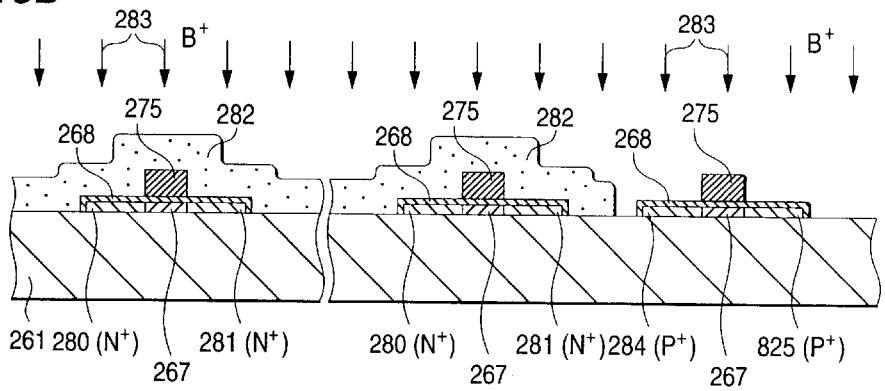

Then, as shown in FIG. 113B, an N-channel MOS transistor portion is masked with a photoresist 282. For example, $B^+$ (or $P^+$) ions 283, P-type impurities, are implanted at, for example, 30 keV and a dose of $1 \times 10^{15}$ atoms/cm$^2$, and the photoresist film is removed by the DC bias catalytic ashing method. $P^+$-type source region 284 and drain region 285 of a P-channel MOS transistor are formed by annealing in $N_2$ at 900° C. for 5 minutes.

The photoresists 278, 282 shown in FIGS. 113A and 113B are removed by being dissolved. For conducting this removal satisfactorily, a reaction gas for ashing (for example, $O_2$, $CF_4$ or $C_2F_4$) is fed to the DC bias catalytic etching apparatus, the substrate temperature is approximately 200° C., the catalyst temperature is approximately 1,700° C., and a DC bias electric field of less than 1 kV (for example, 500 V) is applied. As a result, insoluble matters on the photoresist surface are removed by the ashing with the resulting reaction seeds such as radicals. Thereafter, the photoresist is treated with a solvent to completely dissolve and remove the same. Such ashing may be likewise conducted in the production of MOSTFT shown in FIGS. 109 to 111. In some type of the reaction gas, some DC bias conditions and the state of the photoresist, the photoresist can completely be removed by the ashing removal only. Thus, the subsequent solvent treatment is unnecessary.

Figure 113C:
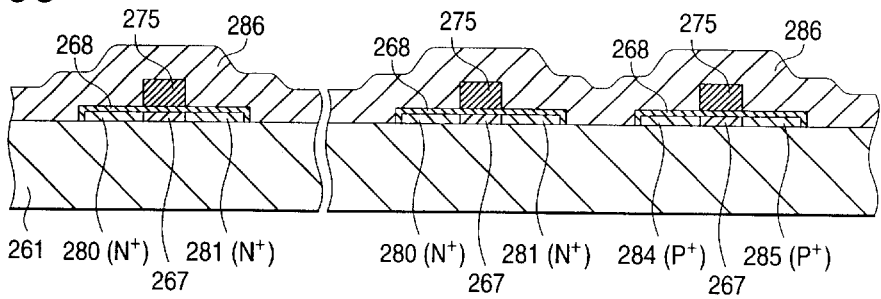

Then, as shown in FIG. 113C, by the same DC bias catalytic CVD method, an $SiO_2$ film 226 is laminated, on the whole surface, to a thickness of 500 Å at, for example, 200 to 300° C. while feeding 150 sccm of a hydrogen carrier gas, 1 to 2 sccm of He-diluted $O_2$ and 15 to 20 sccm of $SiH_4$, and an SiN film to a thickness of 2,000 Å at, for example, 200 to 300° C. while feeding 150 sccm of a hydrogen carrier gas, 50 to 60 sccm of $NH_3$ and 15 to 20 sccm of $SiH_4$. Further, a boron- and phosphorus-doped silicate glass (BPSG) film is formed as a reflow film to a thickness of 6,000 Å at, for example, 200 to 300° C. while feeding 150 sccm of a hydrogen carrier gas, 10 to 20 sccm of He-diluted $B_2H_4$, 10 to 20 sccm of He-diluted $PH_3$, 10 to 20 sccm of He-diluted $O_2$ and 15 to 20 sccm of $SiH_4$. This BPSG film reflows in $N_2$ at, for example, 900° C. An interlayer insulation film 286 is formed by the lamination of these insulation films. Such interlayer insulation film may be formed by the usual method different from this method.

Figure 114A:
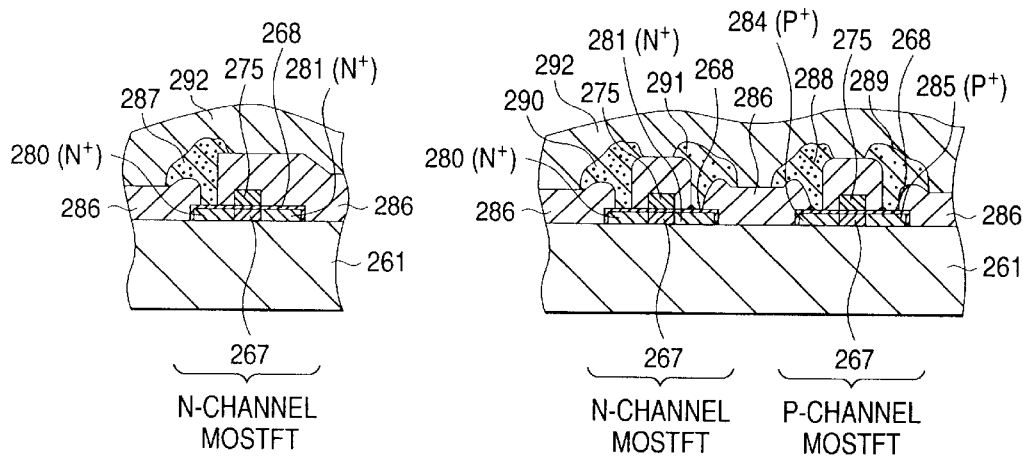
FIG. 114 is a sectional view in LCD production process flow using a catalytic etching apparatus according to the same.

Then, as shown in FIG. 114A, contact holes are formed in a predetermined position of the insulation film 286 by the DC bias catalytic etching method under the same conditions, and the photoresist film is likewise removed by the DC bias catalytic ashing method. An electrode material such as aluminum is deposited on the whole surface including the contact holes to a thickness of 1 μm at 150° C. by sputtering. This is patterned by the same DC bias catalytic etching method, and the photoresist film is likewise removed by the DC bias catalytic ashing method. A source electrode 287 of N-channel MOSTFT is formed on an image area, and source electrodes 288, 290 and drain electrodes 289, 291 of P-channel MOSTFT and N-channel MOSTFT on the peripheral circuit portion.

When aluminum is formed by the DC bias catalytic CVD, continuous procedures of DC bias catalytic etching, DC bias catalytic ashing and DC bias catalytic CVD in this order can be conducted using the same apparatus.

Figure 114B:
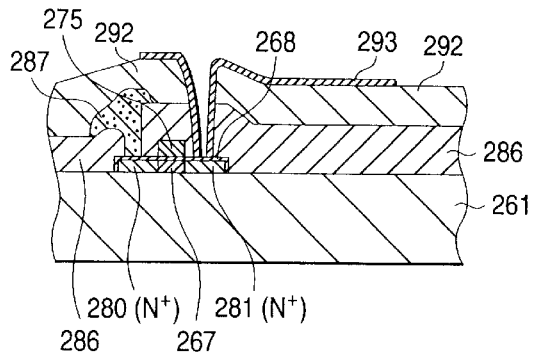

Then, after an interlayer insulation layer 292 of $SiO_2$ is formed on the surface by the bias catalytic CVD method or the catalytic CVD method, contact holes are formed in the interlayer insulation films 292,286 in the image area as shown in FIG. 114B. For example, ITO (indium tin oxide: transparent electrode material obtained by doping indium oxide with tin) is deposited on the whole surface by a vacuum deposition method, and patterned to form a transparent image electrode 293 connected with a drain region 281 (in this case, the formation of contact holes and the removal of the photoresist film may be conducted by the catalytic etching and ashing). In this manner, a TFT substrate of transmission-type LCD can be produced This process can also be applied to the production of a TFT substrate of reflection-type LCD.

Ninth Embodiment

Figure 115:
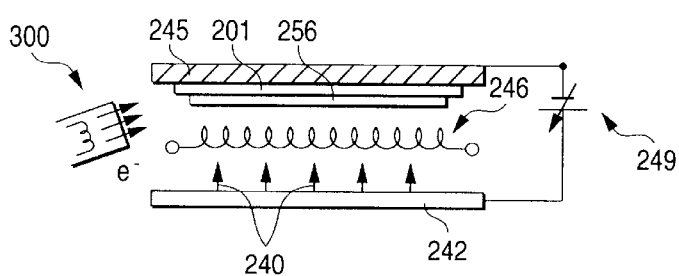
FIG. 115 is a schematic sectional view of a main part of a DC bias catalytic etching apparatus according to the second embodiment of the invention.

The ninth embodiment of the invention is described by referring to FIG. 115.

This embodiment features that in the DC bias catalytic etching method and its apparatus in the first embodiment, as shown in FIG. 115, a charged particle or ion (for example, electron) shower 300 is mounted in the vicinity of a substrate 201 or a suscepter 245. Accordingly, the following excellent functional effects are obtained in addition to the functional effects given by the first embodiment.

That is, reaction seeds such as ions or precursors thereof are generated in the reaction gas by the catalytic activity of the catalyst 246 in or during the etching of the polycrystalline silicon film, whereby the charge of the substrate 201 is increased and non-uniform etching sometimes occurs. For example, electrons are applied to the ions from the electron shower 300 to neutralize the charge of the substrate 201, so that the increase in the charge can be prevented sufficiently. Especially, when the substrate 201 is formed of an insulation material, charges tend to be accumulated. Thus, the use of the electron shower 300 is effective.

Tenth Embodiment

Figure 116:
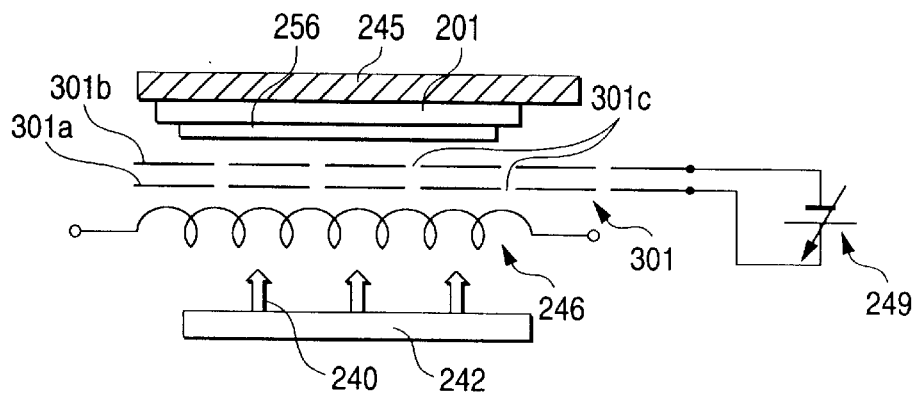
FIG. 116 is a schematic sectional view of a main part of a DC bias catalytic etching apparatus according to the third embodiment of the invention.

The tenth embodiment of the invention is described by referring to FIG. 116.

This embodiment features that in the DC bias catalytic etching method and its apparatus in the first embodiment, an electrode for accelerating reaction seeds is, as shown in FIG. 116, a mesh electrode 301 mounted between a substrate 201 and a catalyst 246.

That is, plural mesh electrodes 301a, 301b having gas passage holes 301c are mounted between the substrate 201 and the catalyst 246. A DC voltage 249 of less than 1 kV is applied therebetween to impart kinetic energy toward the substrate 201 to the reaction seeds generated by the decomposition of the reaction gas by the catalyst 246. Accordingly, in addition to the same functional effects as in the first embodiment, the acceleration electrodes previously designed and processed can easily be inserted between the substrate 201 and the catalyst 246 as mesh electrodes 301, and further the acceleration electrodes can be mounted after previously processed in the form of increasing the acceleration efficiency. It is advisable that the mesh electrodes 301 and a shower head 242 are made of a highly heat-resistant material (preferably a material having a melting point which is the same as, or higher than, the melting point of the catalyst 246).

Eleventh Embodiment

Figure 117:
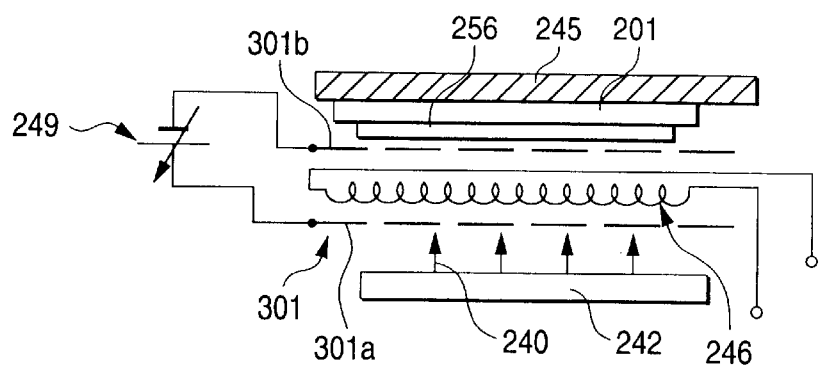
FIG. 117 is a schematic sectional view of a main part of a DC bias catalytic etching apparatus according to the fourth embodiment of the invention.

The eleventh embodiment of the invention is described by referring to FIG. 117.

This embodiment is different from the third embodiment in that one mesh electrode 301a for acceleration is mounted between a catalyst 246 and a shower head 242 and another mesh electrode 301b for acceleration between a substrate 201 and the catalyst 246.

Thus, in this embodiment, the mesh electrodes 301a, 301b are provided on both sides of the catalyst 246, whereby the resulting reaction seeds are easily directed to the substrate 201. It is advisable that the mesh electrodes 301a, 301b and the shower head 242 are made of a highly heat-resistant material having a melting point which is the same as, or higher than, the melting point of the catalyst 246.

Twelfth Embodiment

The twelfth embodiment of the invention is described by referring to FIG. 118.

Figure 118A:
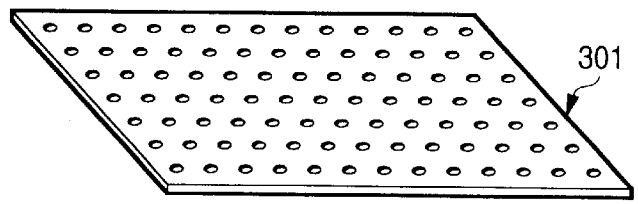
FIG. 118, consisting of FIGS. 118A through 118B, is a schematic perspective view of an acceleration electrode used in a DC bias catalytic etching apparatus according to the fifth embodiment of the invention.
Figure 118B:
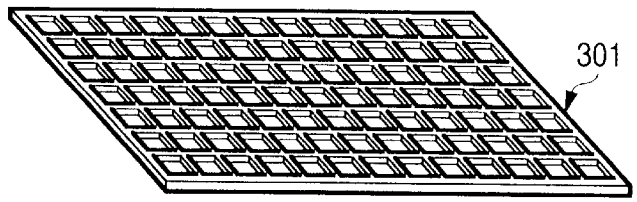

In this embodiment, the acceleration electrode 301 takes the form of a porous plate shown in FIG. 118A or of a mesh shown in FIG. 118B exhibiting the catalytic activity at good efficiency without disturbing the gas stream. Such form can also be applied to a catalyst 246.

Thirteenth Embodiment

Figure 119:
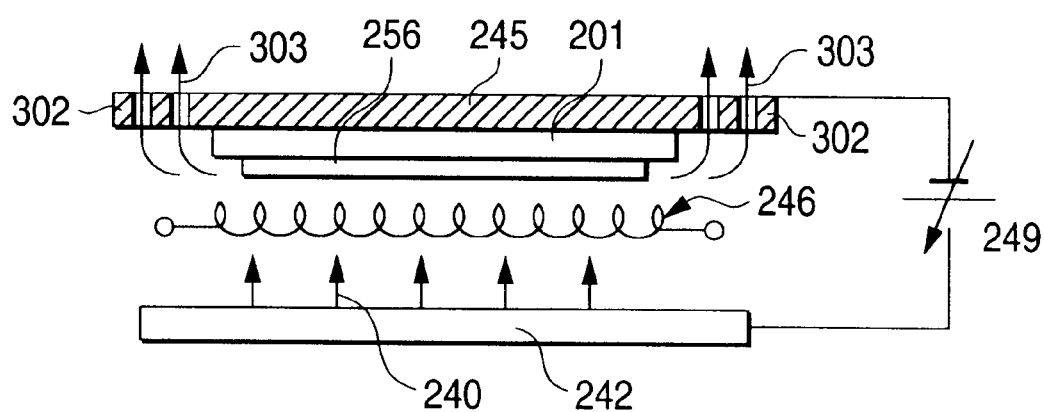
FIG. 119 is a schematic sectional view of a main part of a DC bias catalytic etching apparatus according to the sixth embodiment of the invention.

The thirteenth embodiment of the invention is described by referring to FIG. 119.

In this embodiment, when the DC bias catalytic etching apparatus of the first embodiment is operated under normal pressure, air holes 102 are formed in, for example, the suscepter 245, and exhaust gases 303 are led upward from the surrounding area of the substrate 201 and flow to an exhaust port (not shown). This is for preventing the contact between the gas stream and the film on the substrate 201.

Accordingly, even when the operation is conducted under normal pressure, the film on the substrate 201 or the substrate is not stained. Further, because of the normal pressure type, the construction of the apparatus is simple, and the throughput is also improved.

Fourteenth Embodiment

The fourteenth embodiment of the invention is described by referring to FIGS. 120 to 123.

Figure 120:
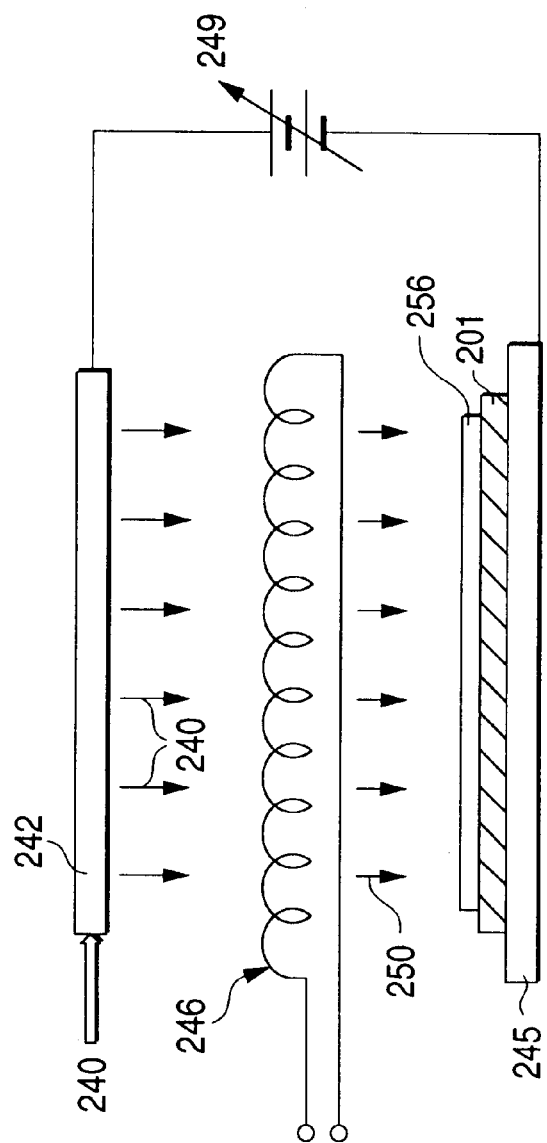
FIG. 120 is a schematic sectional view of a main part of a DC bias catalytic etching apparatus according to the seventh embodiment of the invention.

In the foregoing embodiments, the substrate 201 is located above the shower head 242. In this embodiment, as shown in FIG. 120, a substrate 201 is located below a shower head 242. In this respect alone, this embodiment is different from the foregoing embodiments, and the other construction and the operation method are the same. Accordingly, the same functional effects as in the first embodiment can basically be provided.

Figure 121:
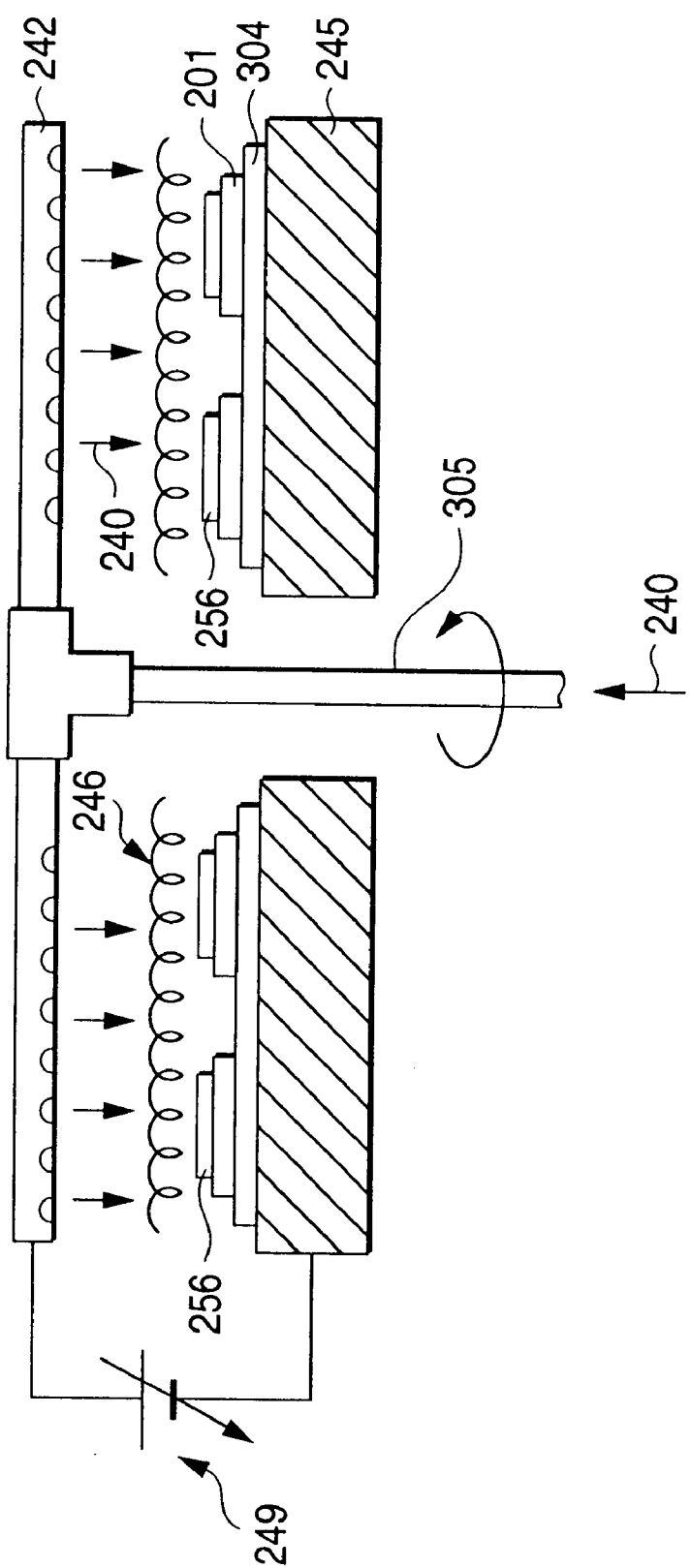
FIG. 121 is a schematic sectional view of a main part of another DC bias catalytic etching apparatus according to the same.

As a specific construction example, the normal pressure type is mentioned. First, as shown in FIG. 121, plural substrates 1 are mounted on a susceptor 245 fitted with a rotary heater through a rotary base. A reaction gas 240 is fed from a rotary shower head 242 having a conduit/rotary shaft 305 to a center hole of the suscepter to lead reaction seeds by a catalyst 246 (a power source is not shown) to the substrates 1 in a DC electric field by a DC power source 249 and etch the films thereon. An exhaust gas is led downward from the surrounding portion of the suscepter 245.

In this example, since the reaction seeds are led to the plural substrates for etching while rotating the substrates 1 and the shower head 242, the productivity is good, and the gas distribution is uniform, improving the uniformity of the etching.

Figure 122:
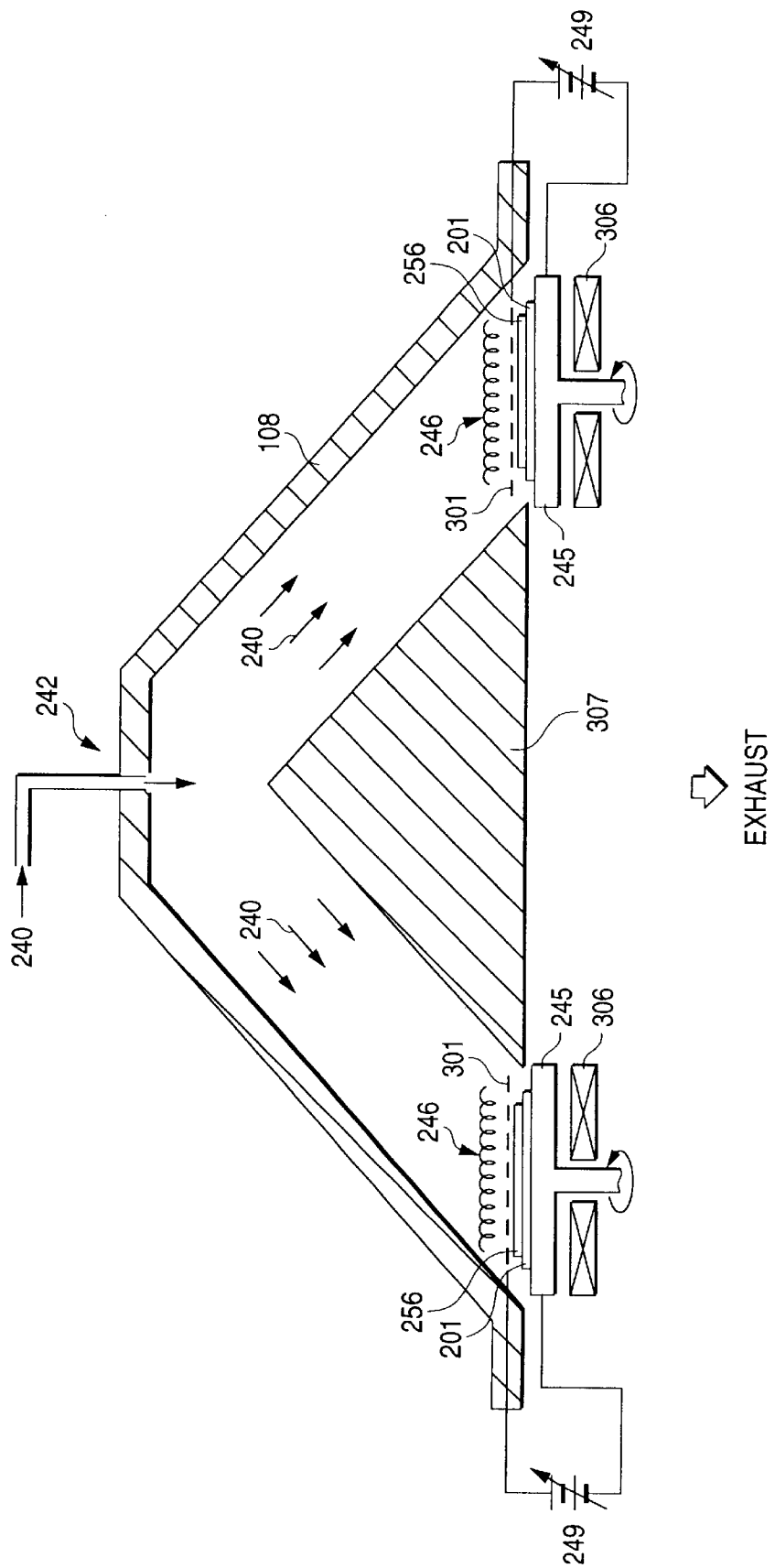
FIG. 122 is a schematic sectional view of the other DC bias catalytic etching apparatus according to the same.

FIG. 122 shows an example of a rotating type in which suscepters 245 fitted with rotary heaters 306 are rotated around a conical buffer 307. A substrate 201 is fixed on each of the suscepters 245, and a reaction gas 240 is fed from the shower head 242 on a conical bell jar 308. Reaction seeds by a catalyst 246 are accelerated with a DC voltage 249 applied between the suscepter 245 (substrate 201) and a mesh electrode 210, and the film on the substrate 201 is etched with reaction seeds by a catalyst 246.

In this example, while the plural substrates 1 are rotated in the conical bell jar, the reaction seeds are accelerated toward the substrate 201. Accordingly, the productivity is good, and the gas distribution is uniform, more improving the uniformity of the etching.

Figure 123:
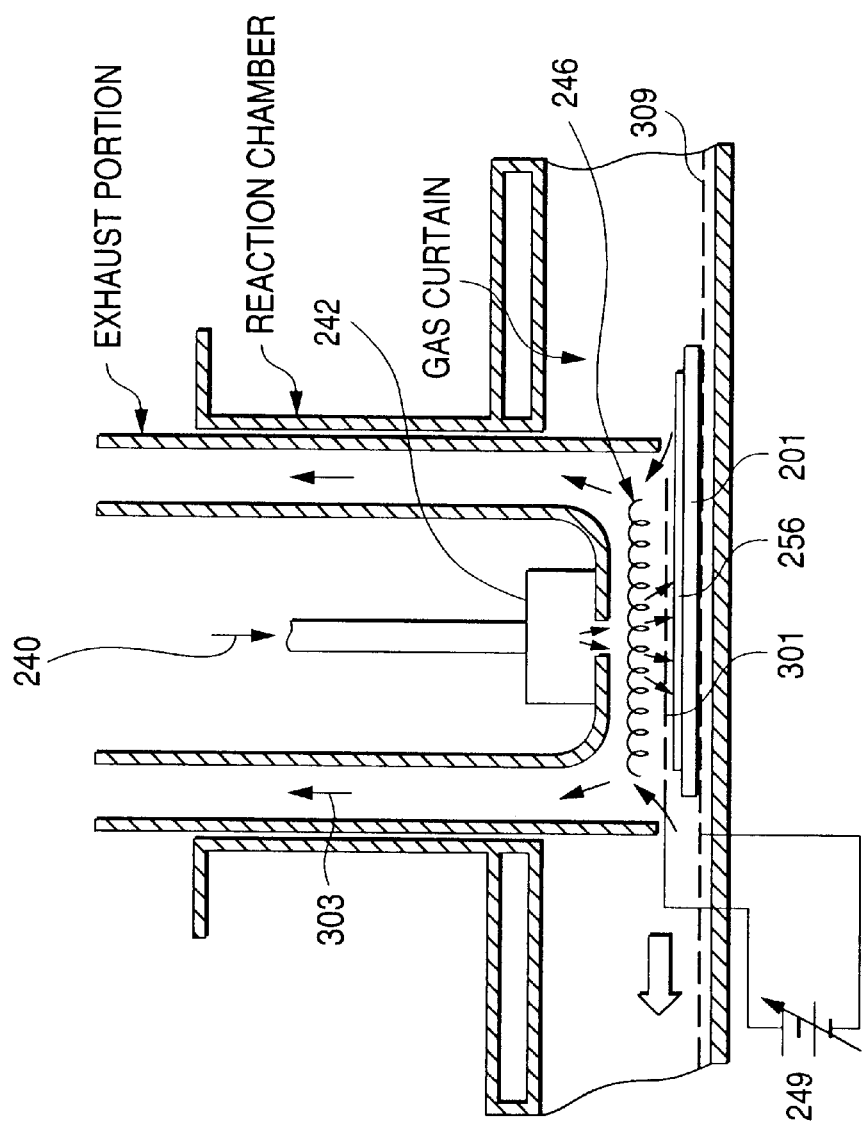
FIG. 123 is a schematic sectional view of the other DC Bias catalytic etching according to the same.

FIG. 123 shows another example of a continuous normal pressure etching apparatus. A substrate 201 is mounted on a conveyor belt 309. A reaction gas 240 is fed from a shower head 242, and reaction seeds by a catalyst 246 are accelerated with a DC voltage 249 applied between the conveyor belt 309 (substrate 201) and a mesh electrode 301 to etch the film on the substrate 201. Since an exhaust gas 303 is led above the substrate 201, a problem on the contamination of the film does not occur.

In this example, while the substrate 201 is moved in one direction, the reaction seeds are accelerated toward the substrate, and the exhaust gas is discharged upward. Thus, the productivity of the etching is good, and the etching is conducted easily even in the normal pressure type.

Fifteenth Embodiment

Figure 124:
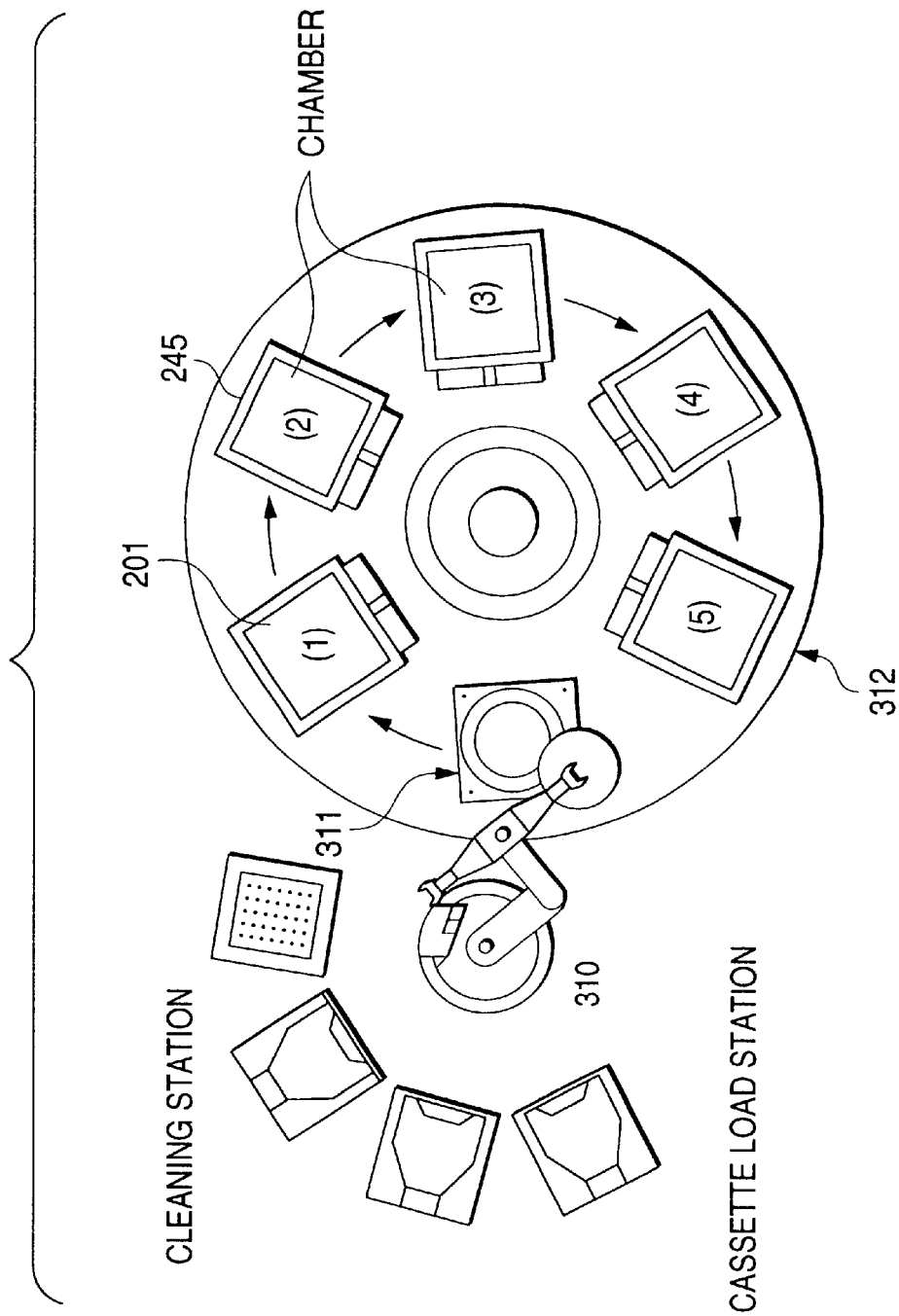
FIG. 124 is a schematic plan view of a DC bias catalytic etching apparatus according to the eighth embodiment of the invention.

The fifteenth embodiment of the invention is described by referring to FIG. 124.

In a film-forming apparatus according to this embodiment, a film can be etched in sequence selectively using, for example, five chambers. A substrate 201 is vacuum-adsorbed on a susceptor 245, mounted on a load portion 311 with a robot 310 of a load station where the substrate is sent to chambers in order by a dispersion head 312. During this time, the etching is conducted such that the substrate is facedown as shown in FIG. 101. The catalyst 246 and an acceleration electrode are not shown in the drawing.

This example is advantageous for etching of a laminated film. Further, since a heat source of the substrate 201 is disposed in an upper portion, a convection effect is reduced. Still further, since the substrate 201 is facedown, adhesion of particles can be controlled.

Sixteenth Embodiment

Figure 125:
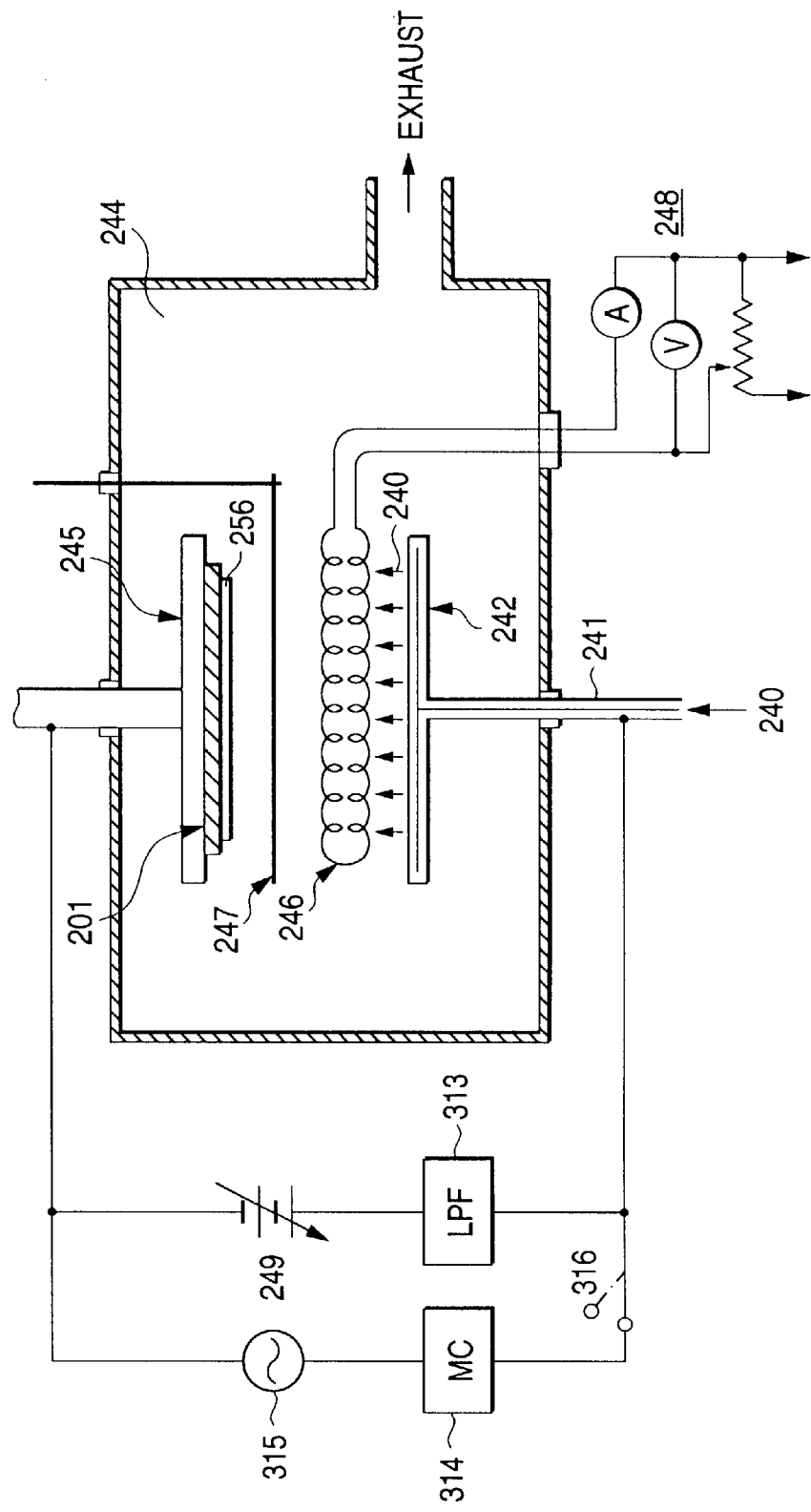
FIG. 125 is a schematic sectional view of an RF/DC bias catalytic etching apparatus according to the ninth embodiment of the invention.
Figure 126:
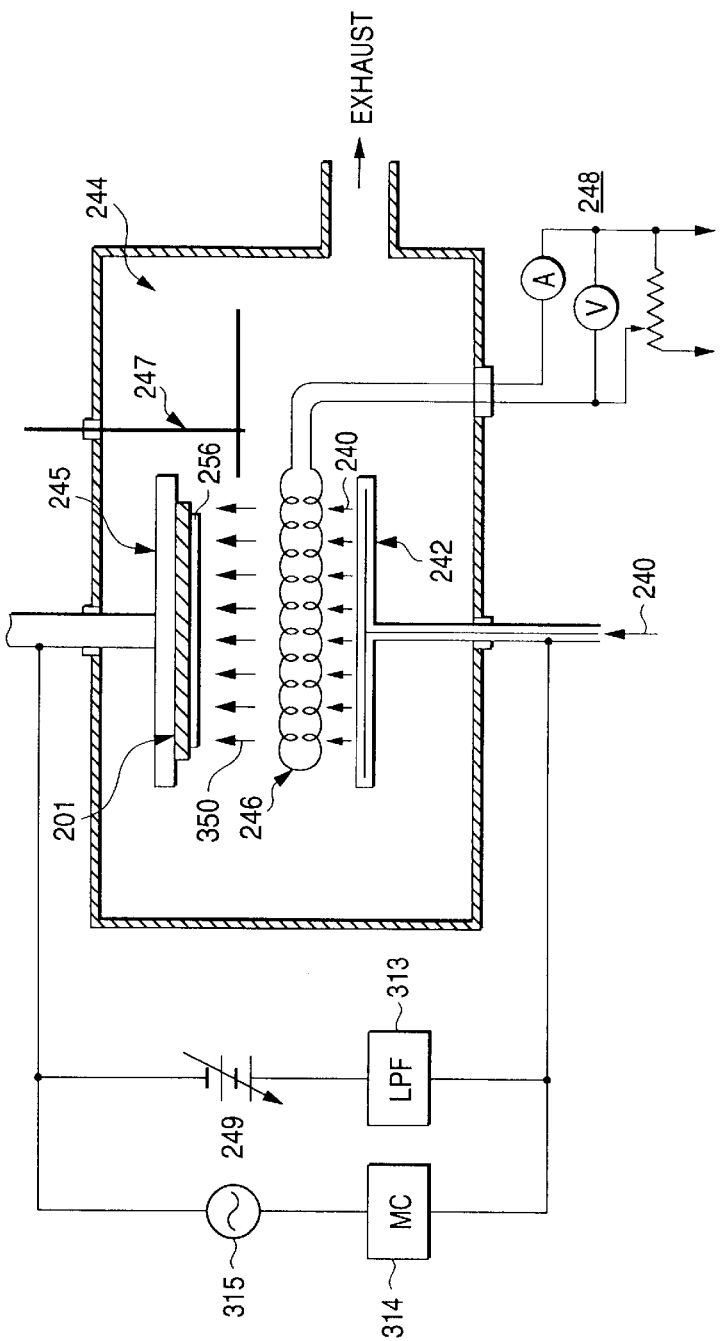
FIG. 126 is a schematic sectional view in etching with a catalytic etching apparatus according to the same.

The sixteenth embodiment of the invention is described by referring to FIGS. 125 and 126.

<RF/DC Bias Catalytic Etching Method and its Apparatus>

In this embodiment, an electric field of less than a glow discharge starting voltage acts on reaction seeds or precursors thereof generated by contacting a reaction gas such as a $CF_4$ gas with a catalyst heated to give kinetic energy, thereby etching a predetermined film of polycrystalline silicon on an insulation substrate in vapor phase. At this time, a voltage of less than the glow discharge starting voltage, which is obtained by superposing a radiofrequency voltage on a DC voltage (voltage of less than 1 kV determined according to the Paschen s law) is applied between the substrate and a counter electrode to direct the reaction seeds or the precursors thereof to the substrate and to give kinetic energy with subtle change in electric field. The etching method according to this embodiment is called a RF/DC bias catalytic etching method.

The RF/DC bias catalytic etching method is carried out using an apparatus shown in FIGS. 125 and 126.

In this apparatus (RF/DC bias catalytic etching apparatus), as described in FIGS. 101 to 103, a reaction gas 240 such as carbon fluoride (for example, $CF_4$) is led to a vapor-phase etching chamber 244 from a feeding conduit 241 through a feeding port 243 of a shower head 242 along with a diluent or carrier gas such as Ar. A suscepter 245 for supporting a substrate 201 of a glass having a thin film 256 of polycrystalline silicon to be etched, the shower head 242 of a good heat resistance (preferably made of a material having a melting point which is the same as, or higher than, that of a catalyst 246), the coiled catalyst 246 of platinum-coated ceramics or tungsten and further a switchable shutter 247 are mounted in the chamber 244. A magnetic seal is applied between the suscepter 245 and the etching chamber 244. A front chamber 255 for conducting pretreatment is disposed behind the chamber 244, and the etching chamber is evacuated with a molecular turbo-pump via a valve.

The substrate 201 is heated, as required, with a heating unit such as a heater wire 251 in the suscepter 245. The catalyst 246 is activated by being heated to less than the melting point (especially 800 to 2,000° C.; approximately 1,200 in case of platinum-coated ceramics, and approximately 1,600 to 1,700° C. in case of ceramics-coated tungsten) as a resistance wire. Both terminals of the catalyst 246 are connected with a DC or AC catalyst power source 248, and the catalyst is heated to a predetermined temperature by passing electricity from the power source. Further, the shower head 242 is connected as an acceleration electrode with a positive pole side of a variable DC power source (less than 1 kV, for example, 500 V) 249 from the conduit 241 through a low-pass (radiofrequency) filter 313 and further with a radiofrequency power source 315 (100 to 200 and 1 to 100 MHz, for example, 150 V and 13.56 MHz) through a matching circuit 314 to apply a DC bias voltage of less than 1 kV superposed on a radiofrequency voltage between the shower head and the suscepter 245 (thus, the substrate 201).

In conducting this RF/DC bias etching method, the inside of the vapor-phase etching chamber 244 is first evacuated to between $10^{-6}$ and $10^{-8}$ torr, and the substrate is then heated to between approximately 100 and 200° C. In the state shown in FIG. 125, the reaction gas 240 such as $CF_4$ is introduced from the feeding port of the shower head 242 to make the gas pressure $10^{-3}$ to $10^{-1}$ torr (for example, $10^{-2}$ torr), and it is contacted with the catalyst 246 of platinum-coated ceramics heated to between 800 and 2,000° C. (for example, approximately 1,200° C.), as shown in FIG. 126. Subsequently, the shutter 247 is opened.

At least a part of the reaction gas 240 is contacted with the catalyst 246 to be catalytically decomposed. The catalytic decomposition or the thermal decomposition allows formation of reaction seeds or radicals (namely, reaction seeds or precursors thereof) of fluorine to which high energy has been imparted. The RF/DC bias electric field obtained by superposing a radiofrequency voltage of a radiofrequency power source 315 of 100 to 200 $V_{p-p}$ and 13.56 MHz on a DC voltage of a DC power source 249 of less than the glow discharge starting voltage (approximately 1 kV), for example, 500 V acts on the resulting reaction seeds 250 (or precursors thereof). Consequently, kinetic energy with subtle change in electric field is imparted to the seeds to direct the same to the substrate 201 and exhibit the etching selectivity satisfactorily. Thus, a predetermined film 256 of polycrystalline silicon on the substrate 201 held at between −100° C. and 500° C. is etched in vapor phase.

Thus, the directional kinetic energy obtained by adding the acceleration energy accompanied by change in electric field through (DC+radiofrequency) electric field to the catalytic activity of the catalyst 246 and its heat energy is thus imparted to the reaction seeds (ions or radicals) without generating plasma, with the result that the reaction gas is converted into the reaction seeds at good efficiency, the reaction seeds are led to the substrate at good efficiency and the etching proceeds through the chemical reaction and the collision against the substrate by the (DC+radiofrequency) electric field. Consequently, since the highly anisotropic etching like the reactive ion etching is conducted, the pattern etching or ashing can be conducted with low damage without ultraviolet damage. Further, the kinetic energy accompanied by subtle change in electric field through the radiofrequency voltage superposed on the DC voltage can be applied to the reaction seeds (ions or radicals). Consequently, in addition to the functional effects described in the first embodiment, a film formed on a substrate surface (raisings and depressions) having a complicated form can finely be processed with an optional selection ratio and an optional angle of inclination.

Accordingly, it is possible to conduct, upon covering the defects of the ordinary reactive etching, the highly anisotropic etching due to the impact of ions vertically entered under the (DC+radiofrequency) electric field. Therefore, it is possible to conduct high-precision fine processings such as selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose.

An etching selection ratio can freely be determined depending on the acceleration voltage 249 to be applied, the heating temperature and the type of the catalyst 246, and the type and the conditions of the reaction gas 240. Various fine processings such as isotropic etching, controlling of an angle of inclination on an edge and surface flattening by setting a selection ratio at 1 are enabled.

Moreover, since the reaction seeds (ions or radicals) generated with the catalyst 246 are independently controlled in the (DC+radiofrequency) electric field and led to the substrate at good efficiency, the reaction gas is used at high efficiency, and the treatment rate is increased, thereby improving a productivity and reducing costs by reduction of the reaction gas.

Although the substrate temperature is decreased, the kinetic energy of reaction seeds is so great as to enable treatment in a large area. The decrease in the substrate temperature can reduce costs by improvement in the productivity with the improvement in the throughput and improve the uniformity of the thickness and the qualities of the film due to the decrease in the non-uniformity of the substrate temperature. Thus, a large-sized, inexpensive insulation substrate (glass substrate or heat-resistant resin substrate) is also available, and costs can also be reduced in this respect. Besides, since the shower head 242 for feeding the reaction gas can also be used as an electrode for accelerating the reaction seeds, the structure is simplified. As the shower head 242 can blow a gas uniformly too, non-uniform etching or ashing less occurs.

Naturally, since plasma is not generated, damage or short-circuiting, ultraviolet damage and cross contamination of metals by plasma do not occur, and a far simple, inexpensive apparatus is realized in comparison with a plasma etching method (reactive etching method).

In this case, operation is conducted under reduced pressure (for example $10^{-3}$ to $10^{-1}$ torr) or under normal pressure. In the reduced pressure type, a simpler, less costly apparatus can be realized than in the normal pressure type. Even in the normal pressure type, the electric field is applied. Thus, the highly selective etching is carried out. In this instance, the throughput is greater in the reduced pressure type than in the normal pressure type, and the productivity is high, so that costs can be reduced.

In the reduced pressure type, the (DC+radiofrequency) voltage is influenced by the gas pressure (flow rate of the reaction gas) and the type of the reaction gas. Anyway, it has to be adjusted to an optional voltage of less than the glow discharge starting voltage. In the normal pressure type, it is advisable to adjust exhaustion lest the flows of the reaction gas and the reaction seeds have an adverse effect on the film of the substrate and the exhaust gas stream be contacted with the substrate.

In this etching, the substrate temperature is increased owing to the radiation heat of the catalyst 246. As stated above, a temperature controller, for example, a heater 251 for heating a substrate (or a refrigerant supply unit for cooling a substrate) may be provided as required. The catalyst 246 is coiled (it may take the form of a mesh, a wire or a porous plate). It is advisable that a catalyst has plural stages (for example, 2 to 3 stages) in the gas flow direction to increase the contact area with the gas. In this etching, the substrate 201 is put on the lower surface of the susceptor 245 above the shower head. Accordingly, it does not occur that particles generated in the chamber 244 drop down and adhere to the film thereon. Of course, the substrate 201 may be put on the upper surface of the susceptor 245 below the shower head 242 (at this time, the productivity can be improved).

Further, in this embodiment, after the completion of the RF/DC bias catalytic etching, as shown in FIG. 104, the substrate 201 is withdrawn outside the etching chamber 244, and a reaction gas 257 such as $CF_4$ or $C_2F_6$ is introduced (degree of vacuum $10^{-1}$ to several torr). A radiofrequency voltage 258 (or a DC voltage) is applied between the susceptor 245 of the substrate 201 and the shower head 242, a counter electrode to generate plasma discharge, whereby the inside of the chamber 244 can be cleaned. In this case, a plasma generation voltage is 1 kV or more, for example, between 1.5 and 2.0 kV with 2 to 3 kW.

In this embodiment, as stated in the eighth embodiment, the RF/DC bias catalytic etching, instead of the DC bias catalytic etching, can be applied to the production of MOSTFT or the production of a TFT substrate of a liquid crystal display device (LCD).

In FIG. 124, a switch 316 is provided, as shown by a dot chain, before a matching circuit 314. When it is switched on, the RF/DC bias catalytic etching can be conducted. Further, when it is switched off, the DC bias catalytic etching method of the eighth embodiment that actuates the DC power source 249 alone can be conducted.

Seventeenth Embodiment

Figure 127:
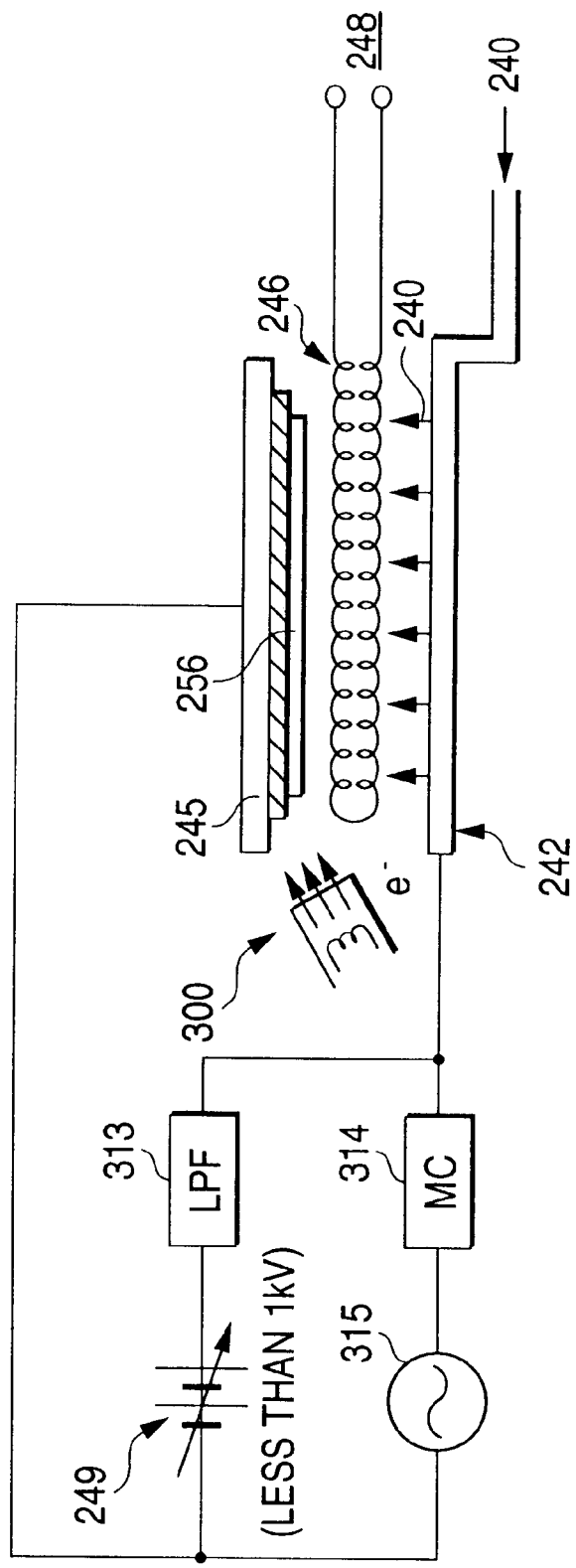
FIG. 127 is a schematic sectional view of a main part of an RF/DC bias catalytic etching apparatus according to the tenth embodiment of the invention.

The seventeenth embodiment of the invention is described by referring to FIG. 127.

This embodiment features that in the RF/DC bias catalytic etching method and the apparatus therefor in the sixteenth embodiment, as shown in FIG. 127, a charged particle or ion (for example, electron) shower 300 is mounted in the vicinity of a substrate 201 or a suscepter 245. Accordingly, the following excellent functional effects are obtained in addition to the functional effects given by the ninth embodiment.

That is, ions are generated in the reaction gas by the catalytic activity of the catalyst 246 in or during the etching of the polycrystalline silicon film, whereby the charge of the substrate 201 is increased and non-uniform etching sometimes occurs. For example, the charge of the substrate 201 is neutralized with electrons applied from the electron shower 300, so that the increase in the charge can be prevented sufficiently. Especially, when the substrate 201 is formed of an insulation material, charges tend to be accumulated. Thus, the use of the electron shower 300 is effective.

In the sixteenth embodiment, as stated in the tenth to thirteenth embodiments, when a mesh electrode 301 for acceleration and a suscepter 245 with an air hole 302 are provided, the same functional effects are obtained.

Eighteenth Embodiment

Figure 128:
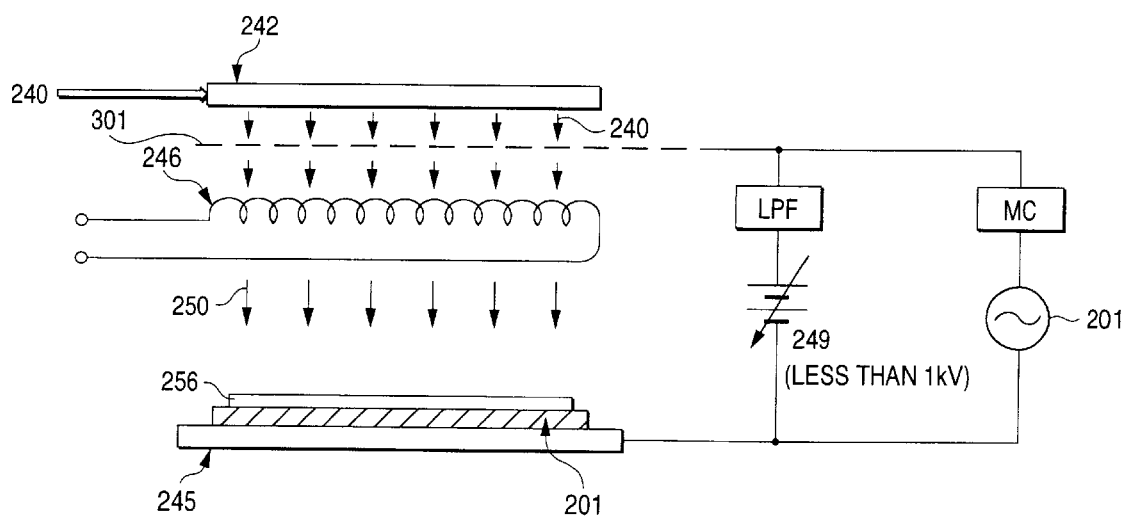
FIG. 128 is a schematic sectional view of a main part of an RF/DC bias catalytic etching apparatus according to the eleventh embodiment of the invention.

The eighteenth embodiment of the invention is described by referring to FIG. 128.

In the foregoing embodiments, the substrate 201 is located above the shower head 242. In this embodiment, a substrate 201 is located below a shower head 242. In this respect alone, this embodiment is different from the foregoing embodiments, and the other construction and the operation method are the same. Accordingly, the same functional effects as in the sixteenth embodiment can be provided.

As a specific construction example, a normal pressure type is mentioned, and it may be applied to etching apparatus having constructions shown in FIGS. 121 to 124.

Nineteenth Embodiment

The nineteenth embodiment of the invention is described by referring to FIG. 129.
<AC/DC Bias Catalytic Etching Method and its Apparatus>

In this embodiment, an electric field of less than a glow discharge starting voltage acts on reaction seeds or precursors thereof generated by contacting a reaction gas such as a $CF_4$ gas with a catalyst heated to give kinetic energy, thereby etching a predetermined film of polycrystalline silicon on an insulation substrate in vapor phase. At this time, a voltage of less than the glow discharge starting voltage, which is obtained by superposing a low-frequency voltage on a DC voltage (voltage of less than 1 kV determined according to the Paschen's law) is applied between the substrate and a counter electrode to direct the reaction seeds or the precursors thereof to the substrate and to give kinetic energy with change in electric field. The etching method according to this embodiment is hereinafter called an AC/DC bias catalytic etching method.

This AC/DC bias catalytic etching method is conducted as in the 16th embodiment using the etching apparatus of the same construction except that a low-frequency power source 125 is used instead of the radiofrequency power source 315 as shown in FIG. 129.

That is, a shower head 242 is connected as an acceleration electrode with a positive pole side of a variable DC power source (less than 1 kV, for example, 500 V) through a conduit 241 (the low-pass-filter 313 may be omitted in some frequency), and further with a low-frequency power source 125 (100 to 200 $V_{p-p}$ and 1 to 100 MHz, for example, 150 $V_{p-p}$ and 26 MHz) through a matching circuit 314 to apply a DC bias voltage of less than 1 kV superposed on a low-frequency voltage between the shower head and the suscepter 245 (thus, the substrate 201).

Thus, the directional kinetic energy obtained by adding the acceleration energy accompanied by change in electric field through the (DC+low-frequency) electric field to the catalytic activity of the catalyst 246 and its heat energy is thus imparted to the reaction seeds (ions or radicals) without generating plasma, with the result that the reaction gas can be converted into the reaction seeds at good efficiency to uniformly etch the film on the substrate 201 through the (DC+low-frequency) electric field. Moreover, the same functional effects as in the sixteenth embodiment are provided.

In this embodiment, after the completion of the AC/DC bias catalytic etching, as shown in FIG. 104, the substrate 201 is withdrawn outside the etching chamber 244, and a reaction gas 257 such as $CF_4$ or $C_2F_6$ is introduced (degree of vacuum $10^{-2}$ to several torr). A radiofrequency voltage 258 (or a DC voltage) is applied between the suscepter 245 of the substrate 201 and the shower head 242, a counter electrode to generate plasma discharge, whereby the inside of the chamber 244 can be cleaned. In this case, a plasma generation voltage is 1 kV or more, for example, between 1.5 and 2.0 kV with 2 to 3 kW.

In this embodiment, as stated in the eighth embodiment, the AC/DC bias catalytic etching method, instead of the DC bias catalytic etching method, can be applied to the production of MOSTFT or the production of a liquid crystal display device (LCD).

Twentieth Embodiment

The twentieth embodiment of the invention is described by referring to FIG. 130.

In this embodiment, upon varying the reaction gas used, the corresponding thin films are etched or ashed in the foregoing embodiments. Here, the catalytic etching or ashing method with any of DC bias, RF/DC bias, AC/DC bias and RF/AC/DC bias is available. At this time, an inert gas such as He, Ne, Ar, $N_2$Xe, Kr, Rn or a combination thereof is used as a diluent gas or a carrier gas of the reaction gas.

FIG. 131 shows starting gas seeds used in the film formation by the CVD method and the corresponding thin films.

The embodiments of the invention stated above can be modified on the basis of the technical concept of the invention.

For example, the etching or ashing conditions, the construction of the apparatus, and types of the reaction gas and the material to be processed may be varied.

Further, instead of the electron shower for preventing the increase in the charge, other negatively charged particles can be applied. Or positively charged particles such as protons may be applied depending on the polarity of the increased charge.

In the sixteenth and nineteenth embodiments as well, the electric field applying units described in the tenth to fifteenth embodiments can be employed. The electric field applying units may be ones for forming only a radiofrequency or low-frequency AC electric field (provided, an absolute value of a radiofrequency or low-frequency AC voltage is less than the glow discharge starting voltage). When the absolute value is less than the glow discharge starting voltage, a voltage obtained by superposing a radiofrequency voltage and a low-frequency voltage on a DC voltage or a voltage obtained by superposing a low-frequency voltage on a radiofrequency voltage may be applied. The etching or the ashing of the invention may be applied to a substrate itself of a glass or a semiconductor, other than a film on a substrate.

This electric field applying unit may be changed during the etching. In this case, a DC voltage, AC/DC, RF/DC, RF/AC/DC, AC and RF are all less than the glow discharge starting voltage. A curve tracer that indicates current-voltage characteristics by measuring an electric current passing between an electrode and a suscepter upon applying a voltage such as a DC voltage may be mounted between the electrode and the suscepter to know an etching rate during the etching. Further, a value of an electric current in a specific value during application of an electric field may be fed back to a power source for applying an electric field, a power source for a heating catalyst or a gas feeding-type mass flow controller to obtain a fixed etching rate. In the application of the electric field, either a method in which a positive polarity of a power source is applied to an acceleration electrode and a negative polarity (or an earth potential) to a suscepter as shown in FIG. 132A or a method in which an earth potential is applied to an acceleration electrode and a negative polarity to a suscepter as shown in FIG. 132B may be employed.

According to the method and the apparatus therefor in the invention, the substrate or the predetermined film on the substrate is etched or ashed in vapor phase by the reaction seeds or the precursors thereof generated by contacting the reaction gas with the catalyst heated. Thus, the following marked functional effects can be obtained.

(1) Since the catalytic activity of the catalyst and its heat energy are imparted to the reaction seeds or the precursors thereof, kinetic energy is increased to lead the same to the substrate at good efficiency, and the etching or the ashing proceeds by the chemical reaction and the collision against the substrate. Therefore, the pattern etching or ashing can be conducted with low damage without ultraviolet damage. Consequently, upon covering the defects of the ordinary reactive etching, for example, selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose can easily be conducted satisfactorily.

(2) Since the acceleration voltage by the foregoing voltage is imparted to the reaction seeds or the precursors thereof in addition to the catalytic activity of the catalyst and its heat energy, kinetic energy is increased to lead the same to the substrate at good efficiency, and the etching or the ashing proceeds by the chemical reaction and the collision against the substrate. Accordingly, since the etching is the anisotropic etching like the reactive ion etching, the pattern etching or ashing can be conducted with low damage without ultraviolet damage. As a result, the highly anisotropic etching is enabled through impact of ions entered vertically upon covering the defects of the ordinary reactive etching. Consequently, high-precision processings such as selective etching of polycrystalline Si, selective etching of $SiO_2$ on Si, etching of an Al alloy by a sputtering effect, removal of $Al_2O_3$ on Al, etching of copper or high-melting metals and removal of a resist degenerated layer after implantation of ions at high dose can easily be conducted satisfactorily.

(3) An etching selection ratio can freely be determined depending on a type and a value of an acceleration voltage (DC, AC/DC or RF/DC) to be applied, a heating temperature of a catalyst, a type of a catalyst, and a type and conditions of a reaction gas. Thus, various fine processings such as etching at a high selection ratio or isotropic etching, controlling of an angle of inclination on an edge and surface flattening by setting a selection ratio at 1 are enabled.

(4) An etching selection ratio can freely be determined depending on a heating temperature of a catalyst, a type of a catalyst and a type and conditions of a reaction gas. Thus, etching at a high selection ratio or isotropic etching, controlling of an angle of inclination on an edge and surface flattening by setting a selection ratio at 1 are enabled.

(5) Since plasma is not generated, damage or short circuiting, ultraviolet damage and cross contamination of metals by plasma do not occur.

(6) Since reaction seeds (ions or radicals) generated with a catalyst are led to a substrate at good efficiency, a reaction gas is used at high efficiency, and a treatment rate is increased, thereby improving a productivity and reducing costs by reduction of the reaction gas.

(7) In comparison with reactive etching with plasma, quite a simple, inexpensive apparatus is realized. In this case, operation is conducted under reduced pressure or under normal pressure. In the reduced pressure operation, a simpler, less costly apparatus can be realized than in the normal pressure operation.

(8) Since kinetic energy of reaction seeds is great, treatment in a large area is enabled. Even when a substrate temperature is decreased, the treatment can be conducted, and a large-sized, less costly insulation substrate (glass substrate or heat-resistant resin substrate) is also available. In this respect, costs can also be reduced. The further decrease in the substrate temperature can reduce costs by the improvement in the productivity with the improvement in the throughput and improve the uniformity of the thickness and the qualities of the film by the decrease in the non-uniformity of the substrate temperature.

What is claimed is:

1. A vapor-phase processing method, which comprises:
    etching or ashing a substrate or a film on the substrate with reaction seeds or precursors thereof generated by contacting a reaction gas with a heated catalyst,
    wherein antistatic charged particles are applied to the reaction seeds or the precursors thereof.

2. The vapor-phase processing method as claimed in claim 1, wherein the catalyst is mounted between the substrate and a reaction gas feeding unit.

3. The vapor-phase processing method as claimed in claim 2, wherein a gas feeding port for leading out the reaction gas in shower state is formed in the reaction gas feeding unit.

4. The vapor-phase processing method as claimed in claim 1, wherein the catalyst takes the form of a coil, a mesh, a wire or a porous plate.

5. The vapor-phase processing method as claimed in claim 1, wherein electron beams or protons are used as the charged particles.

6. The vapor-phase processing method as claimed in claim 1, wherein after the vapor-phase processing, the substrate is withdrawn outside a vapor-phase processing chamber, and a voltage is applied between a susceptor of the substrate and the reaction gas feeding unit to generate plasma discharge, whereby the inside of the vapor-phase processing chamber is cleaned.

7. The vapor-phase processing method as claimed in claim 1, wherein the vapor-phase processing is conducted under reduced pressure or under normal pressure.

8. The vapor-phase processing method as claimed in claim 1, wherein the substrate or the film on the substrate is held at a temperature of −100° C. to 500° C. or is etched or ashed in vapor phase with the reaction seeds or the radicals thereof generated by heating the catalyst to a temperature of less than the melting point thereof in the range of 800 to 2,0000° C. and catalytically reacting or thermally decomposing at least a part of the reaction gas with this catalyst heated.

9. The vapor-phase processing method as claimed in claim 8, wherein the catalyst is heated by its own resistance heating.

10. The vapor-phase processing method as claimed in claim 1, wherein a halogen gas or its compound gas, or an oxidative gas is used as the reaction gas.

11. The vapor-phase processing method as claimed in claim 10, wherein a semiconductor film, an insulation film, a high-melting metal, a conductive metal nitride or a metallic film is etched, and an organic film of a photoresist are etched or ashed.

12. The vapor-phase processing method as claimed in claim 11, wherein a compound semiconductor is made any of gallium-arsenic, gallium-nitride or gallium-phosphorus.

13. The vapor-phase processing method as claimed in claim 11, wherein the insulation film is made any of silicon oxide, impurity-containing silicon oxide, silicon nitride, silicon acid nitride or chromium oxide.

14. The vapor-phase processing method as claimed in claim 11, wherein the high-melting metal is any of tungsten, titanium, molybdenum or tantalum, and the conductive metal nitride is tungsten nitride, titanium nitride, molybdenum nitride or tantalum nitride.

15. The vapor-phase processing method as claimed in claim 11, wherein the metallic film is made any of aluminum, an aluminum alloy (containing 1% of Si or 1 to 2% of Cu) or silicide.

16. The vapor-phase processing method as claimed in claim 11, wherein the semiconductor film is made any of polycrystalline silicon, monocrystalline silicon, amorphous silicon, silicon-germanium, silicon carbide, a compound semiconductor, diamond or diamond-like carbon (DLC).

17. The vapor-phase processing method as claimed in claim 1, wherein the catalyst is formed of at least one material selected from the group consisting of tungsten, thoria-containing tungsten, molybdenum, platinum, palladium, vanadium, silicon, alumina, metal-coated ceramics and silicon carbide.

18. The vapor-phase processing method as claimed in claim 1, wherein the catalyst is made any of silicon carbide, a ceramics or conductive nitride film-coated high-melting metal, silicon nitride, silicon oxide or a conductive metal nitride.

19. The vapor-phase processing method as claimed in claim 1, wherein the reaction gas is replaced with a film-forming starting gas, and a predetermined film is formed on the substrate by feeding this starting gas.

20. The vapor-phase processing method as claimed in claim 19, wherein after the predetermined film is selectively removed by the etching with use of a mask, the mask is removed by the ashing, further the reaction gas is replaced with the film-forming starting gas which is contacted with the catalyst heated, and kinetic energy is imparted to the resulting reaction seeds or the precursors thereof to form the predetermined film on the substrate.

21. The vapor-phase processing method as claimed in claim 19, wherein the film is formed under reduced pressure or under normal pressure.

22. The vapor-phase processing method as claimed in claim 19, wherein a thin film is deposited on the substrate heated at a temperature of room temperature to 550° C. with deposition seeds or precursors thereof, as starting seeds, which are generated by heating the catalyst to a temperature of less than the melting point thereof in the range of 800 to 2,000° C. and catalytically reacting or thermally decomposing at least a part of the starting gas with the heated catalyst.

23. The vapor-phase processing method as claimed in claim 19, wherein before feeding the starting gas, the catalyst is heat-treated in a hydrogen gas atmosphere.

24. A vapor-phase processing method, which comprises:
    etching or ashing a substrate or a film on the substrate with reaction seeds or precursors thereof generated by contacting a reaction gas with a heated catalyst
    causing an electric field of less than a glow discharge starting voltage to act on said reaction seeds or said precursors thereof generated by contacting said reaction gas with said heated catalyst to give kinetic energy.

25. The vapor-phase processing method an claimed in claim 24, wherein a DC voltage of less than the glow discharge starting voltage is applied to direct the reaction seeds or the precursors thereof to the substrate.

26. The vapor-phase processing method as claimed in claim 24, wherein a voltage of less than the glow discharge starting voltage, which is obtained by superposing an AC voltage on a DC voltage or an AC voltage of which the absolute value is less than the glow discharge starting voltage is applied.

27. The vapor-phase processing method as claimed in claim 26, wherein the AC voltage is a radiofrequency voltage and/or a low-frequency voltage.

28. The vapor-phase processing method an claimed in claim 24, wherein a voltage of less than the glow discharge starting voltage, which is obtained by superposing a radiofrequency voltage and a low-frequency voltage on a DC voltage is applied.

29. The vapor-phase processing method as claimed in claim 24, wherein a voltage of less than the glow discharge starting voltage, which is obtained by superposing a radiofrequency voltage on a low-frequency voltage in applied.

30. The vapor-phase processing method as claimed in claim 27, wherein the frequency of the radiofrequency voltage is between 1 MHz and 10 GHz, and the frequency of the low-frequency voltage is less than 1 MHz.

31. The vapor-phase processing method as claimed in claim 24, wherein the catalyst is mounted between the substrate and the electrode for applying the electric field.

32. The vapor-phase processing method as claimed in claim 31, wherein a gas feeding port for leading out the reaction gas is formed in the electrode.

33. The vapor-phase processing method as claimed in claim 24, wherein the catalyst and the electrode for applying the electric field are mounted between the substrate and the reaction gas feeding unit.

34. The vapor-phase processing method as claimed in claim 24, wherein the catalyst or the electrode for applying the electric field taken the form of a coil, a mash, a wire or a porous plate.

35. The vapor-phase processing method as claimed in claim 24, wherein antistatic charged particles are applied to the reaction seeds or the precursors thereof.

36. The vapor-phase processing method as claimed in claim 33, wherein electron beams or protons are used as the charged particles.

37. The vapor-phase processing method as claimed in claim 24, wherein after the vapor-phase processing, the substrate is withdrawn outside a vapor-phase processing chamber, and a voltage is applied to between predetermined electrodes to generate plasma discharge, whereby the inside of the vapor-phase processing chamber is cleaned.

38. The vapor-phase processing method as claimed in claim 24, wherein the vapor-phase processing is conducted under reduced pressure or under normal pressure.

39. The vapor-phase processing method an claimed in claim 24, wherein the substrate or the film on the substrate held at a temperature of −100° C. to 500° C. is etched or ashed in vapor phase with the reaction seeds or the radicals thereof generated by heating the catalyst to a temperature of less than the melting point thereof in the range of 800 to 2,000° C. and catalytically reacting or thermally decomposing at least a part of the reaction gas with this heated catalyst.

40. The vapor-phase processing method as claimed in claim 39, wherein the catalyst is heated by its own resistance heating.

41. The vapor-phase processing method as claimed in claim 29, herein a halogen gas or its compound gas, or an oxidative, gas is used an the reaction gas.

42. The vapor-phase processing method as claimed in claim 41, wherein a semiconductor thin film of polycrystalline silicon, monocrystalline silicon, amorphous silicon, microcrystalline silicon, silicon-germanium, silicon carbide, a compound semiconductor, diamond or diamond-like carbon (DLC), an insulation thin film, a high-melting metal thin film, a conductive metal nitride thin film or a metallic thin film are grown in vapor phase.

43. The vapor-phase processing method as claimed in claim 24, wherein the catalyst is formed of at least one material selected from the group consisting of tungsten, thoria-containing tungsten, molybdenum, platinum, palladium, vanadium, silicon, alumina, metal-coated ceramics and silicon carbide.

44. The vapor-phase processing method as claimed in claim 24, wherein the catalyst is made any of silicon carbide, a ceramics or conductive nitride film-coated high-melting metal, silicon nitride, silicon oxide or a conductive metal nitride.

45. The vapor-phase processing method as claimed in claim 24, wherein the reaction gas is replaced with a film-forming starting gas, and a predetermined film is formed on the substrate by feeding this starting gas.

46. The vapor-phase processing method as claimed in claim 45, wherein after the predetermined film is selectively removed by the etching with use of a mask, the mask in removed by the ashing, further the reaction gas is replaced with the film-forming starting gas which is contacted with the heated catalyst, an electric field of less than the glow discharge starting voltage acts on the resulting reaction seeds or the precursors thereof to give kinetic energy, and the predetermined film is formed on the substrate.

47. The vapor-phase processing method as claimed in claim 45, wherein the film is formed under reduced pressure or under normal pressure.

48. The vapor-phase processing method as claimed in claim 45, wherein a thin film is deposited on the substrate heated at a temperature of room temperature to 550° C. with deposition seeds or precursors thereof, as starting seeds, which are generated by heating the catalyst to a temperature of less than the melting point thereof in the range of 800 to 2,000° C. and catalytically reacting or thermally decomposing at least a part of the starting gas with this heated catalyst.

49. The vapor-phase processing method as claimed in claim 45, wherein before feeding the starting gas, the catalyst is heat-treated in a hydrogen gas atmosphere.

50. The vapor-phase processing method as claimed in claim 24, wherein an etching grade is monitored in the etching.

* * * * *